(12) United States Patent
Richardson et al.

(10) Patent No.: US 10,153,113 B2
(45) Date of Patent: Dec. 11, 2018

(54) SYSTEMS AND METHODS FOR OCCUPANCY PREDICTION

(71) Applicant: Deako, Inc., Mountlake Terrace, WA (US)

(72) Inventors: Derek Richardson, Mountlake Terrace, WA (US); Patrick Prendergast, Mountlake Terrace, WA (US); Cole Wilson, Mountlake Terrace, WA (US); Erik Anderson, Mountlake Terrace, WA (US); Dana Olson, Mountlake Terrace, WA (US)

(73) Assignee: Deako, Inc., Mountlake Terrace, WA (US)

( * ) Notice: Subject to any disclaimer, the term of this patent is extended or adjusted under 35 U.S.C. 154(b) by 0 days.

(21) Appl. No.: 15/253,815

(22) Filed: Aug. 31, 2016

(65) Prior Publication Data

US 2017/0117108 A1 Apr. 27, 2017

Related U.S. Application Data

(63) Continuation-in-part of application No. 15/145,624, filed on May 3, 2016, and a continuation-in-part of application No. 15/074,915, filed on Mar. 18, 2016.

(Continued)

(51) Int. Cl.
*G06F 19/00* (2018.01)
*H01H 47/00* (2006.01)
(Continued)

(52) U.S. Cl.
CPC ........... *H01H 47/002* (2013.01); *G01V 1/001* (2013.01); *G01V 8/10* (2013.01); *G06F 3/041* (2013.01);
(Continued)

(58) Field of Classification Search
CPC combination set(s) only.
See application file for complete search history.

(56) References Cited

U.S. PATENT DOCUMENTS 5,099,390 A * 3/1992 Michaud .............. H05K 5/0017
361/627
5,224,649 A 7/1993 Brown et al.
(Continued)

FOREIGN PATENT DOCUMENTS

EP 1260886 A2 11/2002

OTHER PUBLICATIONS

Kleiminger et al., Occupancy Sensing and Predication for Automated Energy Savings, 2015, Imperial College London, pp. 1-207.*
(Continued)

*Primary Examiner* — Kidest Bahta
(74) *Attorney, Agent, or Firm* — Suiter Swantz pc llo

(57) ABSTRACT

A system for occupancy prediction includes one or more occupancy sensors configured to detect a current occupancy state of one or more detection zones including at least one of occupied by one or more occupants or vacant of occupants. The system including one or more occupancy sensors configured to predict a future occupancy state of the one or more zones based on the current occupancy state and one or more historical occupancy states, wherein at least one occupancy sensor of the one or more occupancy sensor is communicatively coupled to an electrical load. The system including at least one occupancy sensor is configured to actuate the electrical load based on the predicted future occupancy state of the one or more zones.

25 Claims, 47 Drawing Sheets

Related U.S. Application Data

(60) Provisional application No. 62/212,388, filed on Aug. 31, 2015.

(51) Int. Cl.

| | |
|---|---|
| *G01V 8/10* | (2006.01) |
| *G01V 1/00* | (2006.01) |
| *G06F 3/041* | (2006.01) |
| *H01R 13/447* | (2006.01) |
| *H05B 37/02* | (2006.01) |
| *H05K 5/00* | (2006.01) |
| *H05K 5/02* | (2006.01) |
| *H05K 5/03* | (2006.01) |
| *H02G 3/08* | (2006.01) |
| *H01R 12/72* | (2011.01) |
| *H01R 13/24* | (2006.01) |
| *H01R 13/627* | (2006.01) |
| *H01R 24/62* | (2011.01) |
| *H01R 107/00* | (2006.01) |
| *H02G 3/12* | (2006.01) |
| *H02G 3/16* | (2006.01) |

(52) U.S. Cl.
CPC ....... *H01R 13/447* (2013.01); *H05B 37/0272* (2013.01); *H05K 5/0004* (2013.01); *H05K 5/0017* (2013.01); *H05K 5/0221* (2013.01); *H05K 5/0256* (2013.01); *H05K 5/03* (2013.01); *H01R 12/724* (2013.01); *H01R 13/2407* (2013.01); *H01R 13/6275* (2013.01); *H01R 24/62* (2013.01); *H01R 2107/00* (2013.01); *H02G 3/081* (2013.01); *H02G 3/12* (2013.01); *H02G 3/16* (2013.01)

(56) References Cited

U.S. PATENT DOCUMENTS

| | | | |
|---|---|---|---|
| 6,909,921 B1* | 6/2005 | Bilger | G05B 15/02 700/14 |
| 2006/0065510 A1 | 3/2006 | Kiki et al. | |
| 2006/0066151 A1 | 3/2006 | Hatemata | |
| 2009/0138353 A1 | 5/2009 | Mendelson | |
| 2010/0025483 A1* | 2/2010 | Hoeynck | F24F 11/001 236/1 C |
| 2010/0097225 A1 | 4/2010 | Petricoin, Jr. | |
| 2010/0289643 A1* | 11/2010 | Trundle | F24F 11/0086 340/545.1 |
| 2012/0066168 A1* | 3/2012 | Fadell | G05B 15/02 706/52 |
| 2012/0211275 A1* | 8/2012 | Ameloot | H02G 3/12 174/520 |
| 2013/0099009 A1 | 4/2013 | Filson et al. | |
| 2013/0297555 A1* | 11/2013 | Fadell | G05B 15/02 706/52 |
| 2016/0056629 A1* | 2/2016 | Baker | G05B 15/02 700/276 |

OTHER PUBLICATIONS

PCT Search Report for PCT/US2016/049797 dated Nov. 17, 2016, 9 pages.

* cited by examiner

Touch User Interface Interaction Table

| First Input | Display Mode | Next Input | Display Indication |
|---|---|---|---|
| Single-Tap | Dimmer | Dim level based on finger location (top = 100%, bottom = 0%) | Dimmer bar lights up with brightness relative to the dim level |
| Double-Tap | Keypad | Scene selection | Scenes |
| Tap and Hold | Notifications | View Notifications | Status of paired devices |
| Double-Tap and Hold | Color Selection | Color Selection, location of finger sets color (see image) | R, G, B icons (e.g. shapes 904-908) |

FIG. 9H

Simplified Occupancy Sensor States

| DC # | DC11 | DC9 | DC8 | DC6 | DC5 | DC7 | Notes |
|---|---|---|---|---|---|---|---|
| Room | Entryway | LR | Kitchen | HW1 | HW1 | BR1 | Notes |
| P1 | Occupied | Vacant | Vacant | Vacant | Vacant | Vacant | Person enters house |
| P2 | Occupied | Occupied | Vacant | Occupied | Vacant | Vacant | Person walks towards Living Room |
| P3 | Vacant | Activity | Occupied | Vacant | Vacant | Vacant | Person walks towards Kitchen, through Living Room |
| P4 | Vacant | Vacant | Occupied | Vacant | Vacant | Vacant | Person drops off keys/wallet in Kitchen, walks towards Hallway 1 |
| P5 | Vacant | Vacant | Activity | Occupied | Occupied | Vacant | Person walks towards Bedroom 1 through Hallway 1 |
| P6 | Vacant | Vacant | Vacant | Vacant | Activity | Occupied | Person enters Bedroom 1, drops off bags, exits to Hallway 1 |
| P7 | Vacant | Vacant | Vacant | Occupied | Occupied | Vacant | Person walks through Hallway 1, towards Kitchen |
| P8 | Vacant | Vacant | Occupied | Vacant | Vacant | Vacant | Person grabs items from the refrigerator |
| P9 | Vacant | Vacant | Activity | Occupied | Occupied | Vacant | Person exits Kitchen, walks through Hallway 1, towards Living Room |
| P10 | Activity | Occupied | Vacant | Occupied | Vacant | Vacant | Person enters living room, walks towards Couch and turns on TV |
| P11 | Activity | Activity | Vacant | Vacant | Vacant | Vacant | Person on the Couch watching TV |

FIG. 16B

Prediction Look-Up Table

| Room | Velocity (mpm) | Direction of Motion | Total Occurrences | Occurrences | | | | Probabilities | | | |
|---|---|---|---|---|---|---|---|---|---|---|---|
| | | | | BR2 | Laundry | HW1 | Garage | BR2 | Laundry | HW1 | Garage |
| HW2 | 100 | E | 60 | 6 | 9 | 45 | 0 | 10% | 15% | 75% | 0% |
| HW2 | 100 | W | 90 | 9 | 9 | 0 | 72 | 10% | 10% | 0% | 80% |
| HW2 | 50 | E | 70 | 21 | 14 | 35 | 0 | 30% | 20% | 50% | 0% |
| HW2 | 50 | W | 60 | 18 | 30 | 0 | 12 | 30% | 50% | 0% | 20% |

FIG. 17B

| | DC2 | DC3 | DC1 | DC4 | DC6 | DC5 |
|---|---|---|---|---|---|---|
| P1 | N-FL | N-FR | Vacant | Vacant | Vacant | Vacant |
| P2 | M-FR | M-FR | Vacant | Vacant | Vacant | Vacant |
| Predicted Next State | X-FR | X-FL | Vacant | Vacant | N-FR | N-FR |

State Transitions

FIG. 17C

Updated Look-Up Table

| Room | Velocity (mpm) | Direction | Total Occurrences | Occurrences | | | | Probabilities | | | |
|---|---|---|---|---|---|---|---|---|---|---|---|
| | | | | BR2 | Laundry | HW1 | Garage | BR2 | Laundry | HW1 | Garage |
| HW2 | 100 | E | 61 | 7 | 9 | 45 | 0 | 11% | 15% | 74% | 0% |
| HW2 | 100 | W | 90 | 9 | 9 | 0 | 72 | 10% | 10% | 0% | 80% |
| HW2 | 50 | E | 70 | 21 | 14 | 35 | 0 | 30% | 20% | 50% | 0% |
| HW2 | 50 | W | 60 | 18 | 30 | 0 | 12 | 30% | 50% | 0% | 20% |

FIG. 17D

Light Response to Occupancy

| # | Time | ENTRYWAY 1614 DC11 | ENTRYWAY 1614 LUC | LIVING 1612 DC9 | LIVING 1612 LUC | KITCHEN 1610 DC8 | KITCHEN 1610 LUC | HW1 1606 DC6 | HW1 1606 LUC | HW1 1606 DC5 | HW1 1606 LUC | BR1 1608 DC7 | BR1 1608 LUC | Notes |
|---|------|------|-----|-----|-----|-----|-----|-----|-----|-----|-----|-----|-----|-------|
| P1 | 1:00 | Occupied | On | Vacant | Off | Vacant | Off | Vacant | Off | Vacant | Off | Vacant | Off | Person enters house |
| P2 | 1:00 | Occupied | On | Occupied | On | Vacant | Off | Occupied | On | Vacant | On | Vacant | Off | Person walks towards Living Room |
| P3 | 1:01 | Vacant | Start Timer | Activity | On | Occupied | On | Vacant | Start Timer | Vacant | Start Timer | Vacant | Off | Person walks towards Kitchen, through Living Room |
| P4 | 1:03 | Vacant | Timer | Vacant | Start Timer | Occupied | On | Vacant | Timer | Vacant | Timer | Vacant | Off | Person drops off keys/wallet in Kitchen, walks towards Hallway 1 |
| P5 | 1:05 | Vacant | Off | Vacant | Timer | Activity | On | Occupied | On | Occupied | On | Vacant | Off | Person walks towards Bedroom 1 through Hallway 1 |
| P6 | 1:08 | Vacant | Off | Vacant | Off | Vacant | Start Timer | Vacant | Start Timer | Activity | Start Timer | Occupied | On | Person enters Bedroom 1, drops off bags, exits to Hallway 1 |

FIG.18B-1

| # | Time | ENTRYWAY 1614 | | LIVING 1612 | | KITCHEN 1610 | | HW1 1606 | | HW1 1606 | | BR1 1608 | | NOTES |
|---|---|---|---|---|---|---|---|---|---|---|---|---|---|---|
| | | DC11 | LUC | DC9 | LUC | DC8 | LUC | DC6 | LUC | DC5 | LUC | DC7 | LUC | |
| P7 | 1:08 | Vacant | Off | Vacant | Off | Vacant | Timer | Occupied | On | Occupied | On | Vacant | Start Timer | Person walks through Hallway 1, towards Kitchen |
| P8 | 1:09 | Vacant | Off | Vacant | Off | Occupied | On | Vacant | Start Timer | Vacant | Start Timer | Vacant | Timer | Person grabs items from the refrigerator |
| P9 | 1:10 | Vacant | Off | Vacant | Off | Activity | On | Occupied | On | Occupied | On | Vacant | Timer | Person exits Kitchen, walks through Hallway 1 towards Living Room |
| P10 | 1:10 | Activity | Off | Occupied | On | Vacant | Start Timer | Occupied | On | Vacant | On | Vacant | Timer | Person enters Living Room, walks towards Couch and turns on the TV |
| P11 | 1:55 | Activity | Off | Activity | On | Vacant | Off | Vacant | Off | Vacant | Off | Vacant | Off | Person laying on the Couch watching TV, 45 minutes later |

Light Response to Occupancy with Prediction

| # | Time | Entryway 1614 AIROS | Entryway 1614 LUC | Living 1612 AIROS | Living 1612 LUC | Kitchen 1610 AIROS | Kitchen 1610 LUC | HW1 1606 AIROS | HW1 1606 LUC | HW1 1606 AIROS | HW1 1606 LUC | BR1 1608 AIROS | BR1 1608 LUC | Notes |
|---|---|---|---|---|---|---|---|---|---|---|---|---|---|---|
| 1 | 1:00 | Occupied | On | Vacant | On | Vacant | Off | Vacant | Off | Vacant | Off | Vacant | Off | Living Room light turns on when entryway AIROS detects occupancy |
| 2 | 1:00 | Occupied | On | Occupied | On | Vacant | Off | Occupied | On | Vacant | Off | Vacant | Off | |
| 3 | 1:01 | Vacant | Off | Activity | On | Occupied | On | Vacant | Off | Vacant | Off | Vacant | Off | Entryway and Hallway 1 lights turn off when person walks towards Kitchen |
| 4 | 1:03 | Vacant | Off | Vacant | Start Timer | Occupied | On | Vacant | On | Vacant | On | Vacant | Off | Entryway light stays off, Hallway 1 lights turn on when person walks in that direction |
| 5 | 1:05 | Vacant | Off | Vacant | Off | Activity | Off | Occupied | Off | Vacant | Off | Vacant | On | Bedroom 1 lights come on in response to person walking in that direction, Kitchen and Dining Room lights turned off |
| 6 | 1:08 | Vacant | Off | Vacant | Off | Vacant | Off | Vacant | Start Timer | Occupied | On | Occupied | On | |
| 7 | 1:08 | Vacant | Off | Vacant | On | Vacant | On | Occupied | On | Occupied | On | Vacant | Off | Kitchen and Living Room lights turn on in response to person walking down Hallway 1. Bedroom 1 lights off after person leaves |
| 8 | 1:09 | Vacant | Off | Vacant | Start Timer | Occupied | On | Vacant | Start Timer | Vacant | Start Timer | Vacant | Off | Living Room lights timed turn-off started |
| 9 | 1:10 | Vacant | Off | Vacant | Timer | Activity | Start Timer | Occupied | On | Occupied | On | Vacant | Off | |
| 10 | 1:10 | Activity | Off | Occupied | On | Vacant | Off | Occupied | On | Vacant | On | Vacant | Off | |
| 11 | 1:55 | Activity | Off | Activity | On | Vacant | Off | Vacant | Off | Vacant | Off | Vacant | Off | |

SYSTEMS AND METHODS FOR OCCUPANCY PREDICTION

CROSS-REFERENCE TO RELATED APPLICATION

The present application claims the benefit under 35 U.S.C. § 119(e) of U.S. Provisional Application Ser. No. 62/212,388 filed Aug. 31, 2015, entitled METHOD AND APPARATUS FOR CONTROLLING LIGHTS, which is incorporated herein by reference in the entirety.

The present application claims the benefit under 35 U.S.C. § 120 of U.S. patent application Ser. No. 15/074,915 filed Mar. 18, 2016, entitled CONFIGURABLE DEVICE CONTROL NETWORK, which is incorporated herein by reference in the entirety.

The present application claims the benefit under 35 U.S.C. § 120 of U.S. patent application Ser. No. 15/145,624 filed May 3, 2016, entitled MODULAR DEVICE CONTROL UNIT, which is incorporated herein by reference in the entirety.

The present application is related to U.S. patent application Ser. No. 15/253,811, filed on Aug. 31, 2016, which is herein incorporated by reference in its entirety.

The present application is related to U.S. patent application Ser. No. 15/253,819, filed on Aug. 31, 2016, which is herein incorporated by reference in its entirety.

The present application is related to PCT Application No. PCT/US16/49797, PCT, filed on Aug. 31, 2016, which is herein incorporated by reference in its entirety.

TECHNICAL FIELD

The present disclosure relates generally to device controllers and, more particularly, to a method and apparatus for controlling the automation of building functions.

BACKGROUND

The modification of an existing electrical wiring system in a commercial or residential building is often difficult and/or costly. An electrical wiring system in a commercial or residential building typically includes a multitude of electrical circuits in which electrical wires are routed between a mains power source and electrical junction boxes placed at fixed locations throughout the building. Based on known or anticipated needs, certain electrical junction boxes are wired to have direct access to electrical power (e.g. an electrical outlet), while other electrical junction boxes are wired such that access to electrical power is controlled by electrical switches (e.g. a light or a switched electrical outlet). The electrical wiring is typically installed during a construction phase of the building, secured to support structures according to electrical and building codes, and covered during a finishing phase. In this regard, a modification of the existing wiring system in response to changing needs is generally limited to minor alterations of electrical connections within accessible electrical junction boxes or the installation of new electrical wiring, which often requires remodeling and/or refinishing.

Further, the replacement, repair, or alteration of the functionality of existing electrical wiring devices such as electrical outlets or switches connected to a mains power source is often performed by a journeyman due to safety concerns and/or uncertainty regarding proper wiring configurations. It would therefore be advantageous to provide a safe, time effective way for consumers to replace and/or upgrade electrical outlets or switches connected to a mains power source.

Traditional stand-alone electrical switches and outlets are reliant on existing wiring for determining which lighting elements may be controlled by a given switch. Further, stand-alone electrical switches with occupancy detection are limited to actuating electrical loads using the existing wiring. It would therefore be advantageous to provide systems and methods for integrated multi-room home control.

SUMMARY

A system for occupancy prediction is disclosed, in accordance with one or more illustrative embodiments of the present disclosure. In one illustrative embodiment, the predictive control system includes one or more occupancy sensors. In another illustrative embodiment, the one or more occupancy sensors are configured to detect a current occupancy state of one or more detection zones. In another illustrative embodiment, the occupancy state including at least one of occupied by one or more occupants or vacant of occupants. In another illustrative embodiment, the one or more occupancy sensors configured to predict a future occupancy state of the one or more zones based on the current occupancy state and one or more historical occupancy states, wherein at least one occupancy sensor of the one or more occupancy sensor is communicatively coupled to an electrical load. In another illustrative embodiment, the at least one occupancy sensor is configured to actuate the electrical load based on the predicted future occupancy state of the one or more zones.

A system for occupancy prediction is disclosed, in accordance with one or more illustrative embodiments of the present disclosure. In one illustrative embodiment, the apparatus includes one or more occupancy sensors. In another illustrative embodiment, the one or more occupancy sensors are configured to detect an occupancy state of an occupant. In another embodiment, the occupancy state includes at least one of a location a direction of motion or a speed of motion of the occupant. In another configuration the one or more occupancy sensors are configured to predict a future occupancy state of the occupant based on the current occupancy state and one or more historical occupancy states. In another embodiment, at least one occupancy sensor of the one or more occupancy sensors is communicatively coupled to an electrical load. In another embodiment, the at least one occupancy sensor is configured to actuate the electrical load based on the predicted future occupancy state of the occupant.

A system for occupancy prediction is disclosed, in accordance with one or more illustrative embodiments of the present disclosure. In one illustrative embodiment, the occupancy prediction apparatus includes one or more occupancy sensors. In another illustrative embodiment, the one or more occupancy sensors detect an occupancy state of one or more zones. In another embodiment, the occupancy state includes at least one of: occupied by one or more occupants or vacant of occupants. In another illustrative embodiment, the one or more occupancy sensors comprise; a device control assembly, the device control assembly configured to be toollessly and interchangeably coupled into a cavity of a backplate configured to mount to an electrical junction box, the backplate further configured to connect to electrical wiring within the electrical junction box, the device control assembly configured to receive electrical power from the backplate. In another illustrative embodiment, the device control assembly includes a detector configured to measure one or more wavelengths of radiation indicative of the one or more occupants. In another illustrative embodiment, the apparatus includes a controller communicatively coupled to the one or more occupancy sensor. In another illustrative embodiment, the controller is configured to receive the occupancy state of the one or more zones from the one or more occupancy sensors. In another illustrative embodiment, the controller is configured to predict a future occupancy state of the one or more zones based on one or more historical occupancy states.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 9H is a table providing an exemplary illustration of different ways of accessing the different display modes via an Off mode, in accordance with one or more embodiments of the present disclosure.

FIG. 16B is a table including an exemplary description of occupancy data at positions P1-P11 illustrated in FIG. 16A, in accordance with one or more embodiments of the present disclosure.

FIG. 17B is a table including an exemplary look-up table for predicting a subsequent occupancy state based on the path 1702 and the associated velocity vector, in accordance with one or more embodiments of the present disclosure.

FIG. 17C is a table including exemplary occupancy states for position P1, P2, and the predicted next state, in accordance with one or more embodiments of the present disclosure.

FIG. 17D is a table including an updated version of FIG. 17B based on a case in which the user enters Bedroom 2 1604, in accordance with one or more embodiments of the present disclosure.

FIG. 18B-1 is a first portion of a table (continued in FIG. 18B-2) including occupancy data illustrating the behavior of luminaires under control (LUC) in select rooms of FIG. 18A according to one exemplary embodiment, in accordance with one or more embodiments of the present disclosure.

FIG. 18B-2 is a second portion of a table (continued from FIG. 18B-2) including occupancy data illustrating the behavior of luminaires under control (LUC) in select rooms of FIG. 18A according to one exemplary embodiment, in accordance with one or more embodiments of the present disclosure.

FIG. 18C is a table including occupancy data associated with a predictive lighting system incorporating predictive occupancy data, according to another exemplary embodiment, in accordance with one or more embodiments of the present disclosure.

DETAILED DESCRIPTION

Figure 1:
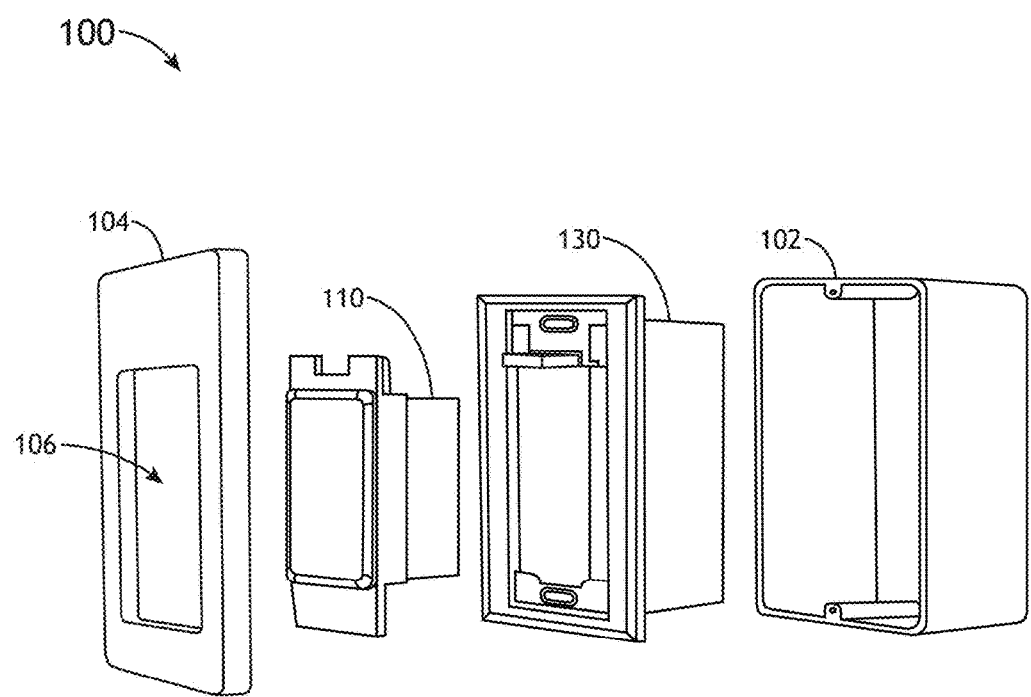
FIG. 1 is an exploded view of a modular control unit configured to mount within an electrical junction box, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Referring generally to FIGS. 1 through 22, a configurable network of device controllers to automate building functions is described, in accordance with one or more embodiments of the present disclosure. Embodiments of the present disclosure are directed to the formation of a network of device controllers that perform functions in a building. Additional embodiments of the present disclosure are directed to pairing device controllers with one or more loads in which a device controller regulates one or more paired loads. Additional embodiments are directed to device controllers in a configurable network configured to regulate any load connected to any other device controllers on the configurable network. Additional embodiments are directed to a network of backplates electrically connected to mains power to facilitate a network of modular device controllers. Additional embodiments are directed to monitoring building occupant location and determining building occupant habits. Additional embodiments of the present disclosure are directed to adjusting building functions based on predicted building occupant habits. Further embodiments of the present disclosure are directed to the automation of functions performed in a building to coincide with system settings.

It is recognized herein that an electrical wiring system of a building typically includes multiple electrical circuits to route electrical power from a power source (e.g. mains power) to multiple electrical junction boxes located throughout the building. Typically, power cables containing electrical wires are routed from a power distribution panel such as, but not limited to, an electrical fuse box, to the multiple electrical junction boxes. The electrical junction boxes may further facilitate electrical connections between the power distribution panel and one or more electrical devices or device controllers by providing an enclosure in which the electrical devices may be connected to, or otherwise terminate, the electrical wires provided by the power cable. An electrical junction box may additionally provide structural support for mounting an electrical device.

The topology of the configuration of wires between junction boxes as well as the number of wires routed between junction boxes may vary depending on the anticipated function of electrical devices to be installed within the junction boxes. Further, power cables associated with an electrical wiring system are typically routed between studs associated with walls and joists associated with ceilings of the building and are typically secured according to building and electrical codes. Accordingly, modifications of the configuration and number of wires between electrical boxes may be difficult and/or undesirable.

Embodiments of the present disclosure are directed to a configurable network of device controllers connected to the electrical wiring system and further in data communication to provide control over the regulation of electrical loads. In this regard, data communication between device controllers supplements and/or expands the capabilities of wired electrical connections associated with the electrical wiring system to provide fully customizable control over load regulation. Further embodiments of the present disclosure are directed to incorporating additional devices (e.g. shades, sensors, luminaires, electrical appliances, or the like) to the configurable network of device controllers. Additional embodiments of the present disclosure are directed to modular control units with interchangeable device control assemblies for flexible modification of the configurable network of device controllers.

Further embodiments of the present disclosure are directed to a network of device controllers having occupancy detection capabilities. In this regard, each device controller may detect occupancy in a zone surrounding the device controller and share the occupancy data to all device controllers in the network. Additional embodiments of the present disclosure are directed to device controllers having biometric recognition capabilities for occupancy detection. Additional embodiments of the present disclosure are directed to tracking and predicting occupancy patterns of one or more users. Additional embodiments are directed to an occupancy-based multi-directional communication system. In this regard, device controllers may provide audio/video intercom communication between select rooms based on occupancy. Additional embodiments of the present disclosure are directed to an occupancy-based multi-directional communication system that tracks occupants and adjusts which device controllers are associated with intercom communication based on occupancy. Additional embodiments of the present disclosure are directed to an occupancy-based security system.

FIG. 1 is an exploded view of a modular control unit 100 configured to mount within an electrical junction box 102, in accordance with one or more embodiments of the present disclosure. In some embodiments, the modular control unit 100 includes a backplate 130 configured to mount within the electrical junction box 102 and provide an electrical connection to an electrical wiring system. In some embodiments, a modular control unit 100 includes a device control assembly 110 to control one or more load devices that is configured to removably couple with the backplate 130. Further, the modular control unit 100 may include a faceplate 104 configured to cover the electrical junction box 102. In this regard, a backplate 130 may provide a standardized mounting assembly for device control assemblies 110. Further, device control assemblies 110 may be removably and/or interchangeably connected to the electrical wiring system through the backplate 130.

For the purposes of the present disclosure, a load device may include any device directly or indirectly attached to the electrical wiring system. For example, a load device may include a wired load such as, but not limited to, a luminaire, a fan, or an appliance. As an additional example, a load device may include an electrical outlet into which loads may be removably connected.

In some embodiments, a device control assembly 110 includes electrical circuitry and/or mechanical components to actuate, regulate, or otherwise control one or more load devices connected to the electrical wiring system. For example, a device control assembly 110 may include, but is not limited to, one or more input devices, one or more buttons, one or more mechanical switches, one or more electrical relays, one or more MOSFETs (metal-oxide-semiconductor field-effect transistors) or one or more TRIACs (triode for alternating current). In this regard, a device control assembly 110 may include, but is not limited to, a toggle switch, a dimmer switch, an alternating current (AC) electrical outlet, a direct current (DC) electrical outlet (e.g. a universal serial bus (USB) outlet), or a multi-function keypad. Additionally, a device control assembly 110 may include, but is not limited to, one or more display devices, one or more speakers, one or more microphones, or one or more sensors.

In some embodiments, the backplate 130 is configured to electrically connect to an electrical wiring system through the electrical junction box 102. For example, the backplate 130 may connect to a power distribution panel through an electrical wiring system terminated at the electrical junction box 102. Additionally, the backplate 130 may be configured to terminate a power cable with any number of conductors such as, but not limited to, a two-conductor power cable, a three-conductor power cable, or a four-conductor power cable. It is noted herein that the backplate 130 may be compatible with any electrical wiring system in any configuration. For example, the backplate 130 may, but is not limited to, be configured to accept a wire connected to a ground source (e.g. a "ground" wire), a wire connected to a power source (e.g. a "hot" wire), a wire connected to a neutral bar (e.g. a "neutral" wire), or one or more additional wires (e.g. one or more "traveler" wires). Further, the backplate 130 may be configured to accept any gauge of wire. In some embodiments, the backplate 130 accepts 14-gauge wire (e.g. from a 14/2 power cable or a 14/3 power cable). In some embodiments, the backplate 130 accepts 12-gauge wire (e.g. from a 12/2 power cable or a 12/3 power cable). It is recognized herein that electrical systems may include any number of switches or connections between components. As such, the description of electrical wiring systems above is presented solely for illustrative purposes and should not be interpreted as limiting.

A backplate 130 may be electrically connected to an electrical wiring system through the electrical junction box 102. In some embodiments, a backplate 130 is configured to connect to an electrical wiring system through twist-on wire connectors. For example, a backplate 130 may include one or more wires suitable for connecting to a power cable through twist-on wire connectors. In some embodiments, the backplate 130 is configured to connect to an electrical wiring system through push-in wire connectors. For example, a backplate 130 may include one or more push-in connectors to connect to conductors in a power cable such as, but not limited to, a "hot" wire, a "neutral" wire, a "ground" wire, or a "traveler" wire.

In some embodiments, a backplate 130 is configured to interchangeably couple to device control assemblies 110 without modification of the connection between the backplate 130 and the electrical wiring network. For example, a device control assembly 110 configured to operate as a toggle switch may be removed and replaced with a device control assembly 110 configured to operate as a dimmer switch without modification to the backplate 130 or the associated electrical connections to the electrical wiring network. In this regard, the modular control unit 100 may provide a semi-permanent element (e.g. a backplate 130 attached to an electrical junction box 102 via one or more screws) connected to the electrical wiring system that may further couple to interchangeable functional units (e.g. a device control assembly 110).

In some embodiments, a device control assembly 110 may be inserted into or removed from a backplate 130 while a backplate 130 is connected to live power from the electrical wiring assembly. For example, an electrical connection established between a backplate 130 and a device control assembly 110 may be configured to establish a ground connection prior to establishing a "hot" wire connection.

A backplate 130 may be configured to occupy one or more device positions within an electrical junction box 102. In some embodiments, a backplate 130 is configured to occupy one position within an electrical junction box 102. In this manner, a single backplate 130 may be mounted to a 1-gang electrical junction box 102, two backplates 130 may be mounted to a 2-gang electrical junction box 102, or the like. Further, a backplate 130 may be mounted to an electrical junction box 102 alongside one or more additional devices. For example, a backplate 130 and a typical light switch may be mounted within 2-gang electrical junction box 102. In some embodiments, a backplate 130 is configured to occupy two or more positions within an electrical junction box 102. For example, a single backplate 130 may be configured to accept two or more device control assemblies 110 such that each device control assembly 110 effectively occupies a single position within the electrical junction box 102. As an additional example, a backplate 130 occupying two or more positions within an electrical junction box 102 may accept one or more device control assemblies 110 of any size. In this regard, a single device control assembly 110 may effectively occupy any portion of an electrical junction box 102.

In some embodiments, the modular control unit 100 includes a faceplate 104 to cover a portion of the electrical junction box 102 not covered by the backplate 130 or the device control assembly 110. In some embodiments, the faceplate 104 includes one or more openings 106 to provide access to one or more elements of the device control assembly 110. For example, the faceplate 104 may include, but is not limited to, one or more openings 106 to provide access to one or more displays, one or more speakers, one or more microphones, one or more antennas, or one or more sensors associated with a device control assembly. In some embodiments, the faceplate 104 provides access to one or more elements of the device control assembly 110 while covering exposed areas of the electrical junction box 102. For example, a device control assembly 110 and/or a backplate 130 attached to an electrical junction box 102 may leave one or more areas of the electrical junction box 102 exposed. In this regard, a faceplate 104 may cover the one or more exposed areas of the electrical junction box 102.

A device control assembly 110 may couple with a backplate 130 by any method known in the art suitable for providing a data connection and/or an electrical power connection between the device control assembly 110 and the backplate 130. For example, a device control assembly 110 may connect to a backplate 130 by way of a wired connection. In this regard, each of the device control assembly 110 and the backplate 130 may include one or more components suitable for providing a wired data connection and/or a wired electrical connection such as, but not limited to, one or more wires, one or more electrical contacts, or one or more electrical connectors. By way of another example, a device control assembly 110 may connect to a backplate 130, which may include one or more components suitable for providing a wireless data connection and/or a wireless electrical connection such as, but not limited to, one or more inductive coils, one or more wireless transmitters, or one or more wireless receivers.

In some embodiments, a device control assembly 110 couples to a backplate 130 without the need for external tools (e.g. screwdrivers, pliers, or the like) to insert or remove the device control assembly 110 from the backplate 130. In this regard, the device control assembly 110 and/or the backplate 130 includes latching and/or locking mechanisms suitable for interchangeably coupling a device control assembly 110 to a backplate 130 by hand.

It is noted herein that the above description of the modular control unit 100 is provided for illustrative purposes only and should not be interpreted as limiting. For example, the modular control unit 100 may include any combination of a device control assembly 110 and a faceplate 104 or a backplate 130. In some embodiments, the modular control unit 100 includes a device control assembly 110 and a faceplate 106. For example, a device control assembly 110 may include a mounting assembly configured to mount to an electrical junction box 102 and further configured to connect to electrical wiring within the electrical junction box 102. In this regard, the device control assembly 110 is configured to connect with the electrical wiring system without a backplate 130. In some embodiments, the modular control unit 100 includes a device control assembly 110 and a backplate 130. In this regard, a mounting assembly may include a backplate 130 such that the backplate 130 may be semi-permanently connected to the electrical junction box 102, provide one or more connections to electrical wiring within the electrical junction box 102, and provide for interchangeable coupling and/or toolless coupling with a device control assembly 110. In some embodiments, the modular control unit does not include a faceplate 104. In this way, the device control assembly 110 may fully cover the electrical junction box 102 when coupled with a backplate 130. In some embodiments, the modular control unit 100 includes a device control assembly 110 configured to directly connect to the electrical wiring system and fully cover the electrical box 102 without a faceplate 104.

In some embodiments, a modular control unit 100 may include one or more components suitable for wired connections between a backplate 130 and a device control assembly 110. In this regard, data and/or electrical power may be transferred between the backplate 130 and the device control assembly 110. For example, the backplate 130 may contain, but is not required to contain, logic, memory or a communication transceiver. Further, the communication transceiver might use a technique such as, but not limited to, one-wire, I2C, SPI, USB, or a serial communication interface for data transfer.

FIGS. 2A through 2F illustrate a modular control unit 100 including a backplate 130 configured to interchangeably couple with device control assemblies 110 by way of a wired electrical connection, in accordance with one or more embodiments of the present disclosure. In some embodiments, a backplate 130 is configured to shield the electrical contacts of the backplate (e.g. backplate contacts 140) when no device control assembly 110 is inserted. In some embodiments, an air gap actuator 144 provides access to backplate contacts 140 while engaged in an open position (see FIGS. 2C and 2D) and is further configured to prohibit access to backplate contacts 140 while engaged in a closed position (see FIGS. 2A and 2B). The air gap actuator 144 may translate between a closed position and an open position to regulate access to the backplate contacts 140.

Figure 2A:
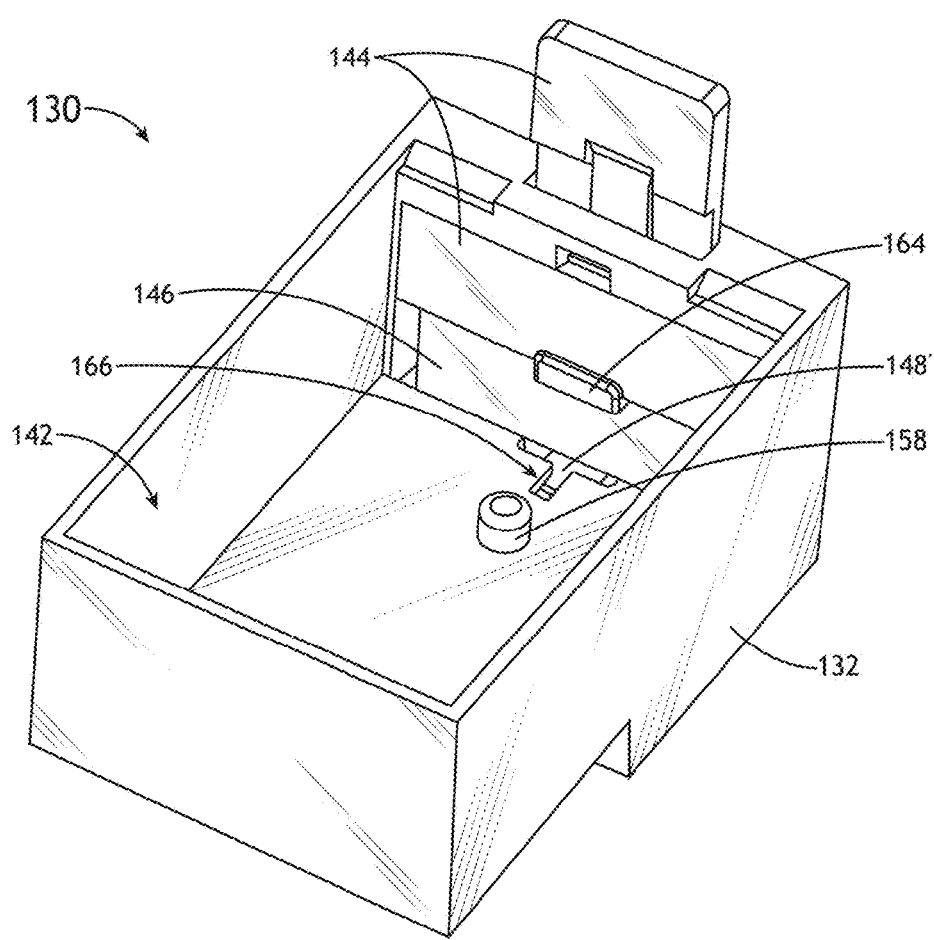
FIG. 2A is an isometric view illustrating a backplate with an air gap actuator in a closed position and including a recessed air gap actuator lock accessible through an opening in an inner wall of the casing of the backplate, in accordance with one or more embodiments of the present disclosure.
Figure 2B:
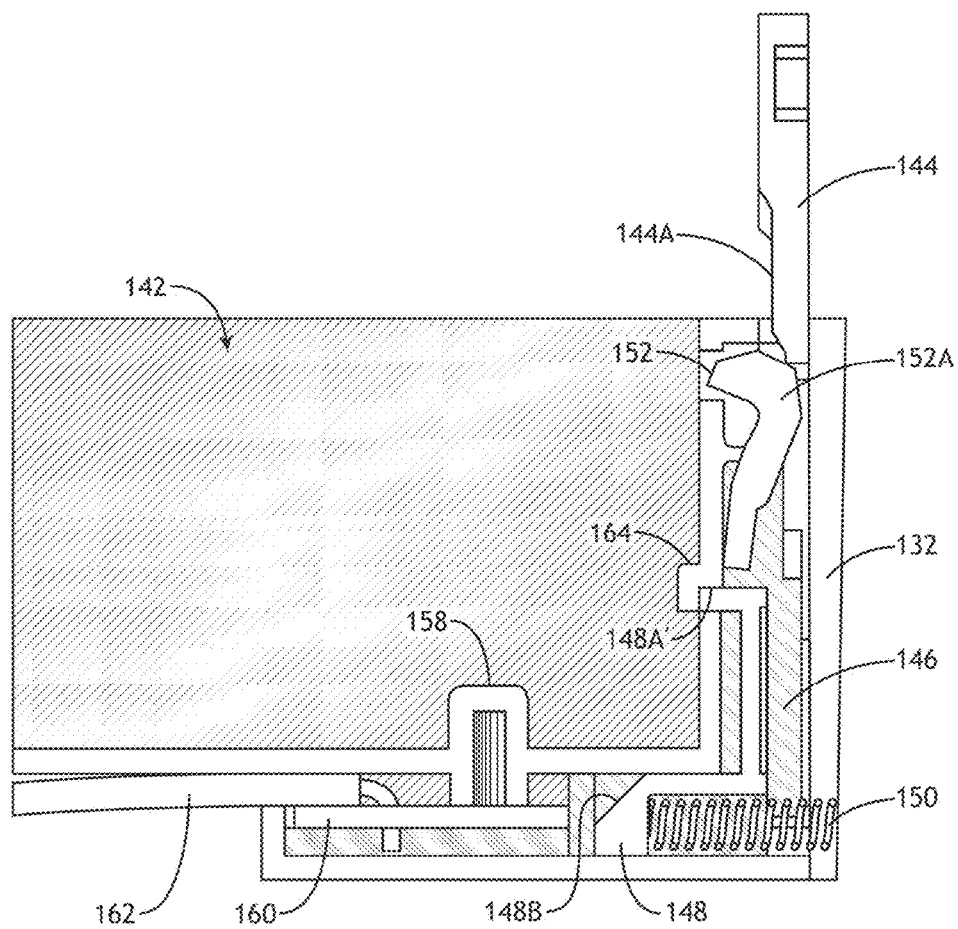
FIG. 2B is a cross-sectional view illustrating a backplate with an air gap actuator in a closed position and including a recessed air gap actuator lock accessible through an opening in an inner wall of the casing of the backplate, in accordance with one or more embodiments of the present disclosure.
Figure 2C:
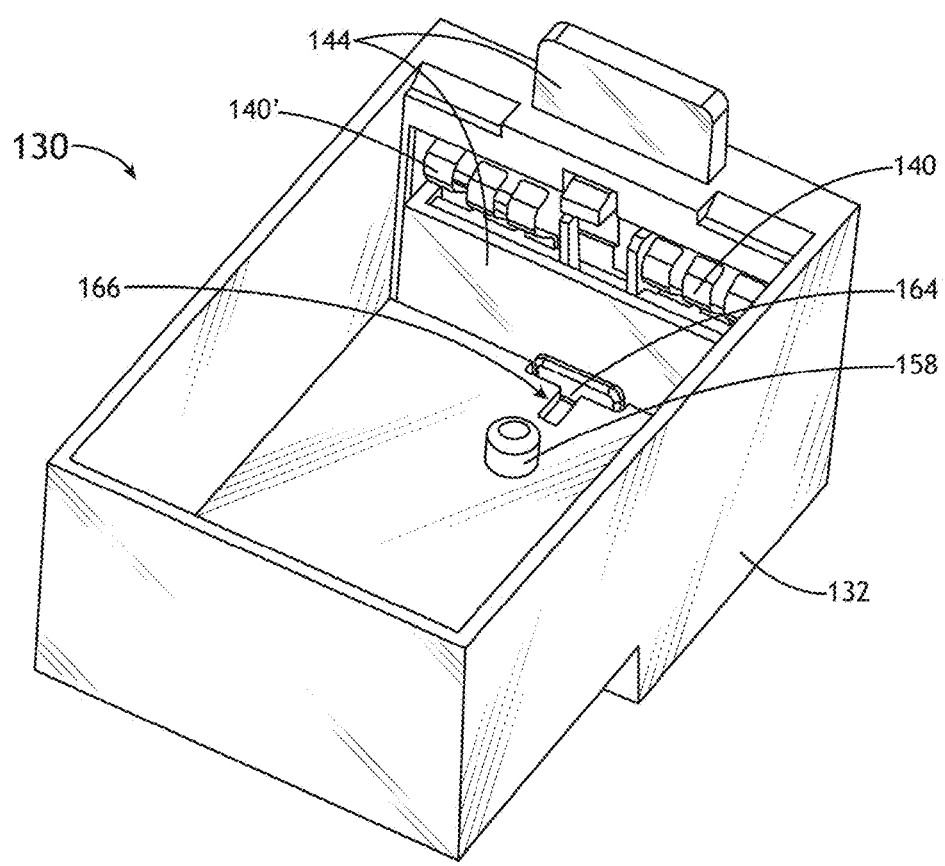
FIG. 2C is an isometric view illustrating a backplate with an air gap actuator in an open position and a recessed air gap actuator lock, in accordance with one or more embodiments of the present disclosure.
Figure 2D:
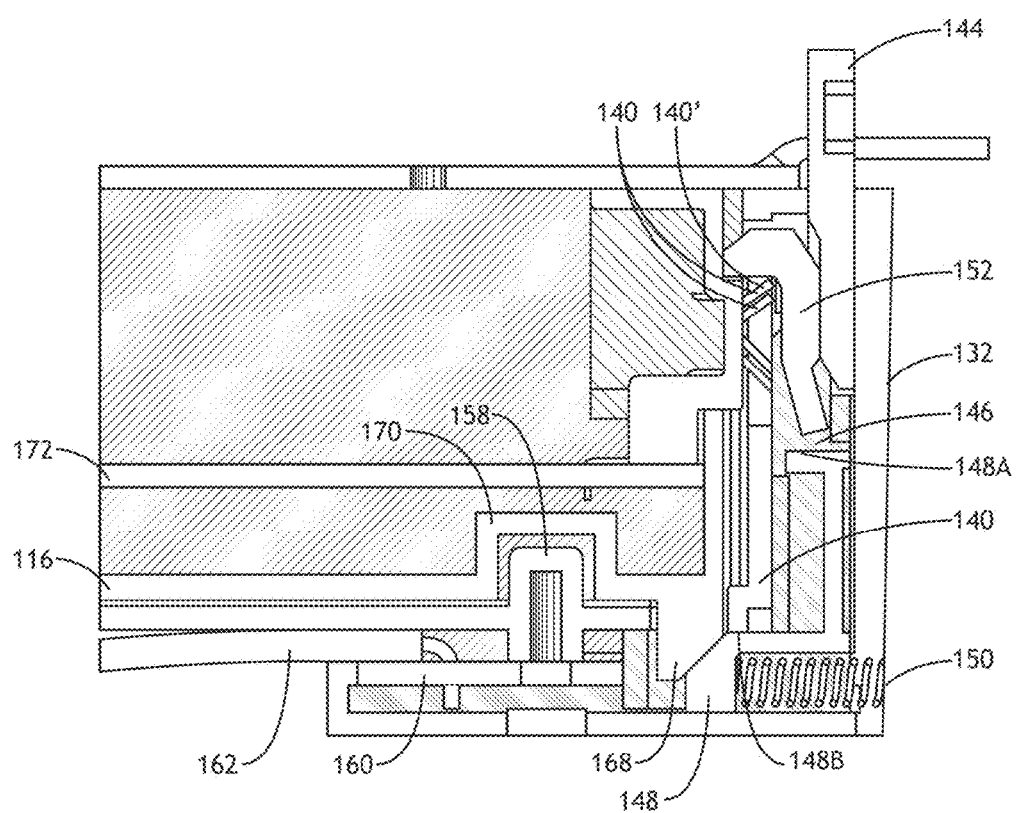
FIG. 2D is a cross-sectional view illustrating a backplate with an air gap actuator in an open position and a recessed air gap actuator lock, in accordance with one or more embodiments of the present disclosure.
Figure 2E:
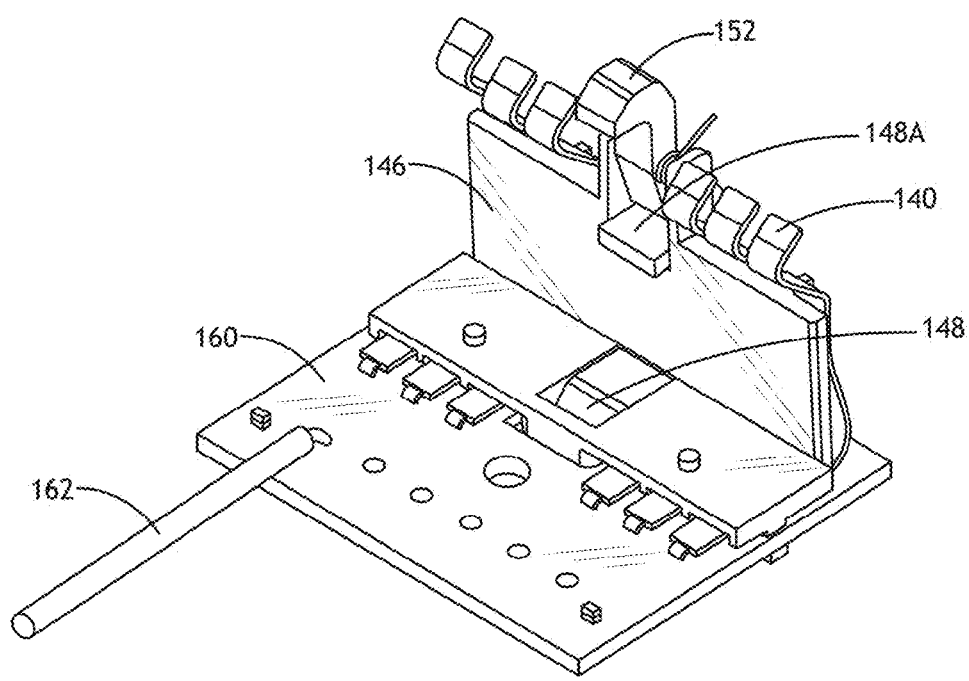
FIG. 2E is an isometric view of a backplate board assembly to mount the backplate contacts illustrating the recessed air gap actuator lock, in accordance with one or more embodiments of the present disclosure.

FIGS. 2A and 2B are isometric and cross-sectional views illustrating a backplate 130 with an air gap actuator 144 in a closed position and including a recessed air gap actuator lock 148 accessible through an opening 166 in an inner wall of the casing 132 of the backplate 130. FIGS. 2C and 2D are isometric and cross-sectional views illustrating a backplate 130 with an air gap actuator 144 in an open position and a recessed air gap actuator lock 148. FIG. 2C illustrates the backplate 130 without a coupled device control assembly 110 and FIG. 2D illustrates the backplate 130 with a coupled device control assembly 110 for illustrative purposes; however, it is noted that the backplate 130 may be configured (e.g. via the air gap actuator 144, the air gap actuator lock 148, the locking lever 152, keyed features 158, or the like) such that the air gap actuator 144 may only occupy an open position (e.g. to provide access to backplate contacts 140) when coupled to a device control assembly 110. FIG. 2E is an isometric view of a backplate board assembly 146 illustrating the backplate contacts 140 and a recessed air gap actuator lock 148.

Figure 2F:
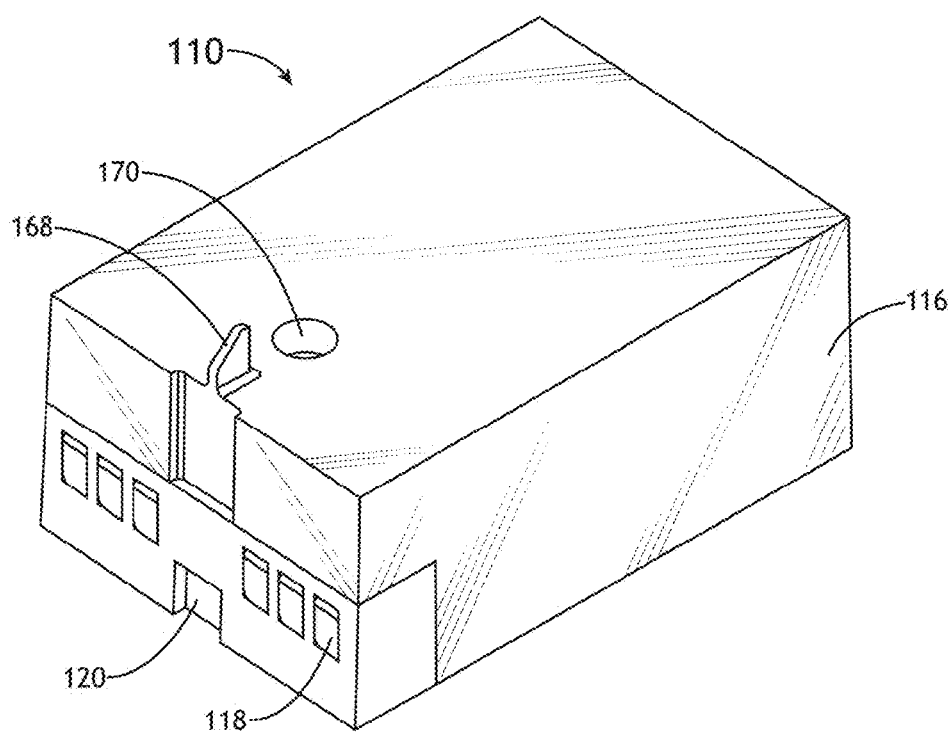
FIG. 2F is an isometric view illustrating a back side of a device control assembly including a coupling tab, in accordance with one or more embodiments of the present disclosure.

FIG. 2F is an isometric view illustrating a back side of a device control assembly 110 including a coupling tab 168. For example, the coupling tab 168 may pass through opening 166 of the backplate 130 to actuate the air gap actuator lock 148 when coupling the device control assembly 110 to the backplate 130.

In some embodiments, the casing 132 of the backplate 130 includes one or more keyed features 158 to facilitate alignment of a device control assembly 110 into a backplate 130. The one or more keyed features 158 may be of any type known in the art. For example, the one or more keyed features 158 may include, but are not limited to, raised features, recessed features, or grooves. In some embodiments, a keyed feature 158 is a raised feature with a height equal to or greater than a height of the air gap actuator lock 148 in a locked position. In this regard, air gap actuator lock 148 is accessible to objects with one or more corresponding keyed features (e.g. keyed features 170 on a device control assembly 110).

In some embodiments, the opening 166 in the casing 132 of the backplate 130 is configured to restrict access to the air gap actuator lock 148. For example, the opening 166 may have a restrictive size (e.g. smaller than a human fingertip, or the like) to prevent undesired objects (e.g. a human fingertip, or the like) from accessing the air gap actuator lock 148. In this regard, the opening 166 and the coupling tab 168 may operate as keyed features with corresponding shapes such that the coupling tab 168 may be inserted into the opening 166 only when the device control assembly 110 is properly oriented.

In some embodiments, the air gap actuator lock 148 includes a blocking feature 148A (e.g. a portion of the air gap actuator lock 148, or the like). For example, the blocking feature 148A of the air gap actuator lock 148 may restrict the motion of the air gap actuator 144 (e.g. by occupying a portion of a translation path of the air gap actuator 144, or the like). In this regard, the blocking feature 148A may prevent the air gap actuator 144 from translating to the open position (e.g. to expose the backplate contacts 140) when the air gap actuator lock 148 is locked. In some embodiments, translation of the air gap actuator lock 148 to the unlocked position provides clearance for the air gap actuator 144 to translate to the open position. Further, the air gap actuator lock 148 may be maintained in a locked position (e.g. to prevent the air gap actuator 144 from translating from a closed position to an open position) by a spring 150.

In some embodiments, the air gap actuator lock 148 may be translated to an unlocked position by coupling with a coupling tab 168 of a device control assembly 110 during insertion. For example, the insertion of a device control assembly 110 into a backplate 130 may provide a force to translate the air gap actuator lock 148 (e.g. via the coupling tab 168) to an unlocked position. Accordingly, the translation of the air gap actuator lock 148 may translate the blocking feature 148A out of the translation path of the air gap actuator 144. In this regard, the air gap actuator 144 may translate to an open position to expose the backplate contacts 140 to the inserted device control assembly 110.

In some embodiments, the air gap actuator 144 includes a shroud 164 to conceal the blocking feature 148A of the air gap actuator 148 when the air gap actuator 144 is in the closed position (e.g. as illustrated in FIG. 2C). In this regard, the shroud 164 restricts access to the blocking feature 148A of the air gap actuator lock 148 (e.g. to a user, or the like).

In some embodiments, the air gap actuator lock 148 includes a graded feature 148B (e.g. a portion of the air gap actuator lock 148, or the like) to provide contact with a device control assembly 110 during coupling between the device control assembly 110 and the backplate 130. For example, contact between the coupling tab 168 of the device control assembly 110 and the graded feature 148B of the air gap actuator lock 148 may cause the air gap actuator lock 148 to translate from a locked position to an unlocked position (e.g. in a direction orthogonal to the motion of the coupling tab 168 as shown in FIGS. 2B and 2D). The graded portion 148B of the air gap actuator lock 148 may have any shape suitable for translating the air gap actuator lock 148 to a locked position upon insertion of a device control assembly 110 such as, but not limited to a flat graded surface (e.g. a surface at a 45 degree angle relative to the translation direction) or a curved surface.

In some embodiments, electrical connections between backplate contacts 140 and contact pads 118 of an inserted device control assembly 110 are provided in an ordered configuration. For example, a backplate contact 140 associated with a ground connection between the backplate 130 and the inserted device control assembly 110 (e.g. associated with a ground wire from the electrical wiring system, a common ground between the backplate 130 and the device control assembly 110, or the like) may be provided prior to establishing one or more additional electrical connections (e.g. a "hot" connection, or the like). In this regard, providing an ordered configuration of electrical connections between the backplate 130 and the device control assembly 110 may facilitate the connection and/or disconnection of a device control assembly 110 from a backplate 130 when the backplate 130 is connected to a "live" power source (e.g. via wires 162). For example, an ordered configuration of electrical connections may prevent damage (e.g. due to arcing, or the like) to the backplate 130 and/or the device control assembly 110. In some embodiments, the order in which electrical connections are made between pairs of contact pads 118 and backplate contacts 140 is determined by the relative positions of the backplate contacts 140 and/or the contact pads 118. For example, as shown in FIGS. 2C, 2D and 2E, in some embodiments, one or more backplate contacts 140' may extend further in a direction towards a front face of the backplate 130 than other backplate contacts 140. Accordingly, an electrical connection between backplate contact 140' and a corresponding contact pad 118 may be provided prior to other electrical connections between backplate contacts 140 and corresponding contact pads 118. In some embodiments, though not shown, a position of one or more contact pads 118 may be configured to provide ordered electrical connections between backplate contacts 140 and contact pads 118.

In some embodiments, the backplate 130 includes a locking lever 152 to secure a device control assembly to the backplate 130 when the air gap actuator 144 is in an open position (e.g. the backplate contacts 140 are in connection with the contact pads 118 of the device control assembly 110). For example, the locking lever 152 may couple to locking features 120 to secure an inserted device control assembly 110 to the backplate 130. In some embodiments, the locking lever 152 is mounted to a rod 154 on the backplate board assembly 146 and held in tension against the air gap actuator 144 via a torsion spring 150. Further, the motion of the locking lever 152 may be governed by the position of the air gap actuator 144. For example, the air gap actuator 144 may include a graded portion 144A to couple with a graded portion 152A of the locking lever 152. In this regard, the locking lever 152 may rotate to provide clearance for a device control assembly 110 (not shown) when the air gap actuator 144 is in a closed position (e.g. as illustrated in FIG. 2B ). Similarly, the locking lever 152 may be rotated to couple with locking features 120 of a device control assembly 110 as the air gap actuator 144 translates to an open position (e.g. as illustrated in FIG. 2D ).

Figure 3:
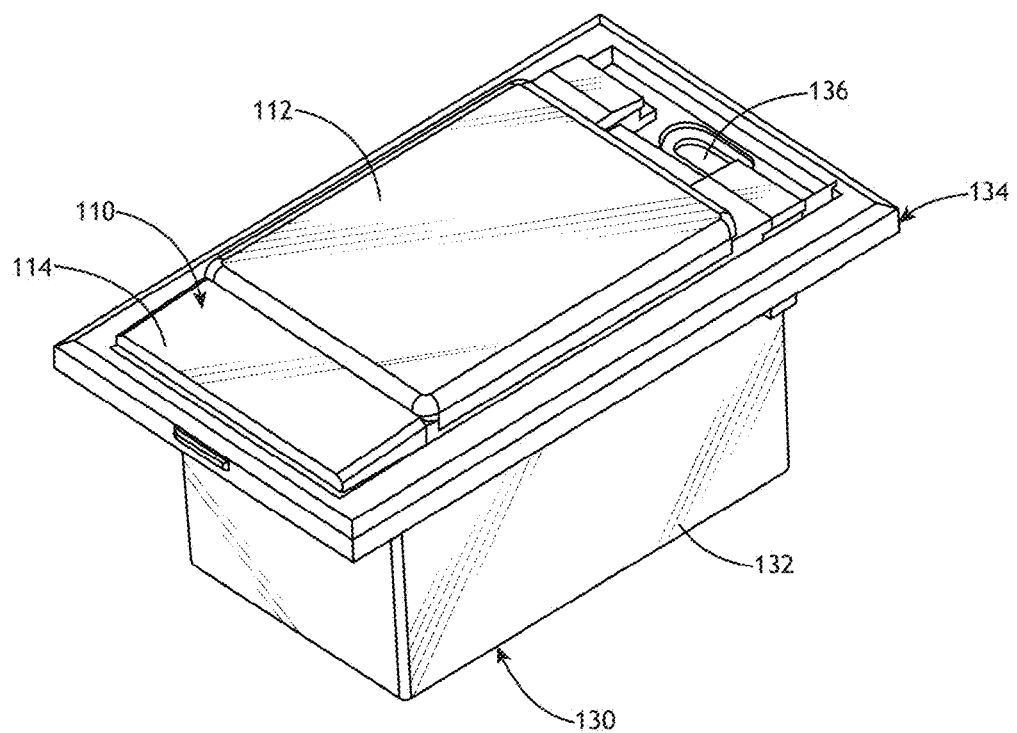
FIG. 3 is an isometric view of a device control assembly coupled to a backplate, in accordance with one or more embodiments of the present disclosure.

FIG. 3 is an isometric view of a device control assembly 110 coupled to a backplate 130, in accordance with one or more embodiments of the present disclosure. In some embodiments, the device control assembly 110 securely fits within the opening 142 of the backplate 130 such that all electrical connections (e.g. the backplate contacts 140 and the contact pads 118) are inaccessible (e.g. to a user).

In some embodiments, a modular control unit 100 may include one or more components suitable for wireless coupling between a backplate 130 and a device control assembly 110. In this regard, data and/or electrical power may be transferred between the backplate 130 and the device control assembly 110. For example, the backplate 130 and the device control assembly 110 may contain a wireless transmitter and/or a wireless receiver. For example, the backplate 130 and the device control assembly 110 may be coupled via a wireless coupling technique such as, but not limited to, Bluetooth Low Energy (BLE), WiFi, inductive coupling, or capacitive coupling.

Figure 4A:
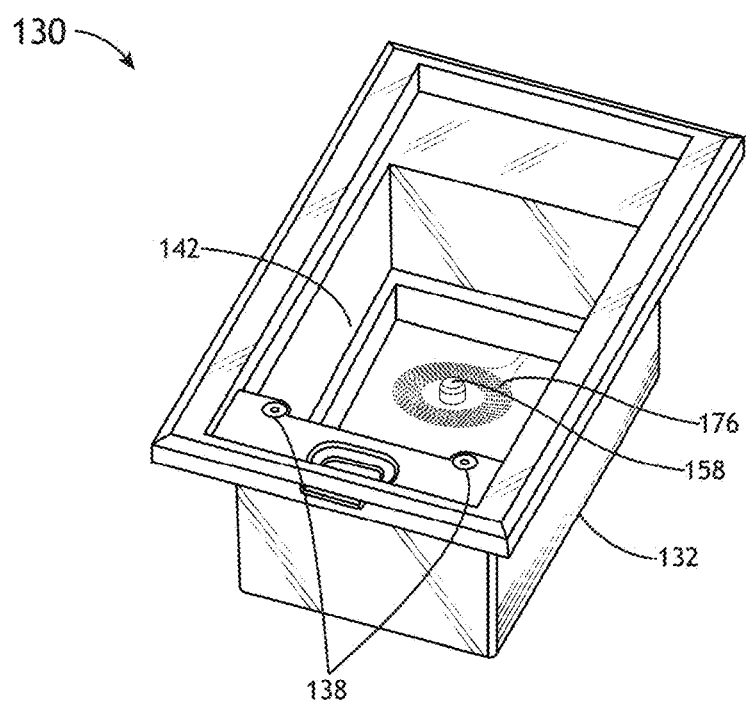
FIG. 4A is an isometric view of a backplate including a backplate induction coil, in accordance with one or more embodiments of the present disclosure.
Figure 4B:
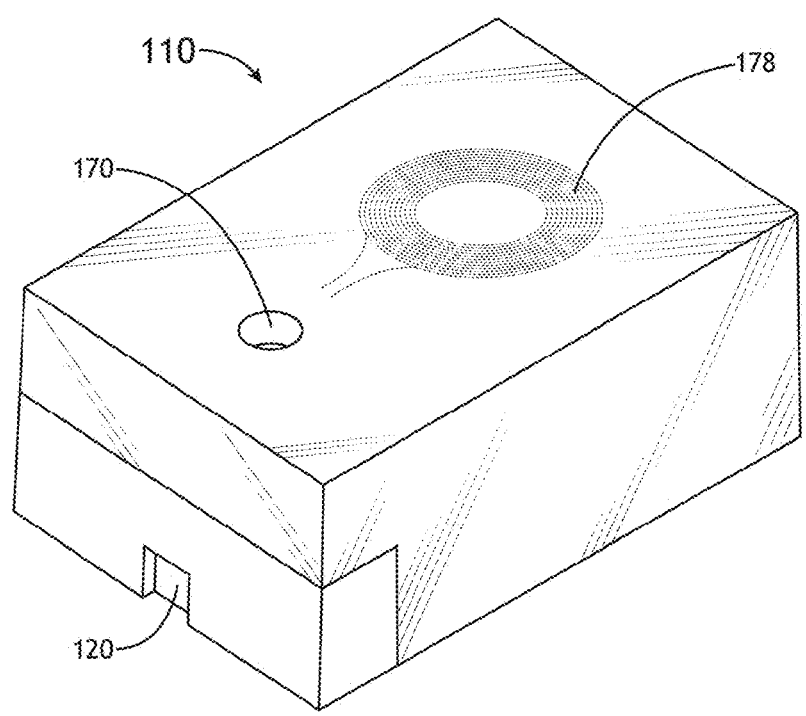
FIG. 4B is an isometric view of a back side of a device control assembly illustrating a device control assembly induction coil, in accordance with one or more embodiments of the present disclosure.

FIG. 4A is an isometric view of a backplate 130 including a backplate induction coil 176, in accordance with one or more embodiments of the present disclosure. FIG. 4B is an isometric view of a back side of a device control assembly 110 illustrating a device control assembly induction coil 178, in accordance with one or more embodiments of the present disclosure. In some embodiments, the backplate induction coil 176 may be connected to the circuit board 160. Accordingly, the backplate induction coil 176 may be suitable for the transmission of data and or electrical power to a nearby induction coil (e.g. device control assembly induction coil 178).

In some embodiments, the backplate induction coil 176, shown in dotted lines in FIG. 4A, is located underneath the surface of the casing 132 of the backplate 130 near the cavity 142. In this regard, the backplate induction coil 176 may not be exposed to and may thus not be accessible to the cavity 142. Similarly, in some embodiments, the device control assembly induction coil 178, shown in dotted lines in FIG. 4B, is located underneath the surface of the casing 116 of the device control assembly 110. Further, the backplate induction coil 176 and the device control assembly induction coil 178 may be aligned when the device control assembly 110 is inserted into the backplate 130 such that data and/or electrical power may be transferred via inductive coupling. In addition, electrical components of the backplate 130 and/or the device control assembly 110 may be shielded regardless of whether a device control assembly 110 is inserted into a backplate 130.

It is noted herein that a device control assembly 110 and a corresponding cavity 142 of a backplate 130 may have any shape. For example, as illustrated in FIGS. 4A through 4B, a device control assembly 110 may have a rectangular shape configured to be inserted into a rectangular-shaped cavity 142 of a backplate 130. By way of another example, a device control assembly 110 may have a circular shape configured to be inserted into a circular-shaped cavity 142 of a backplate 130.

Figure 4C:
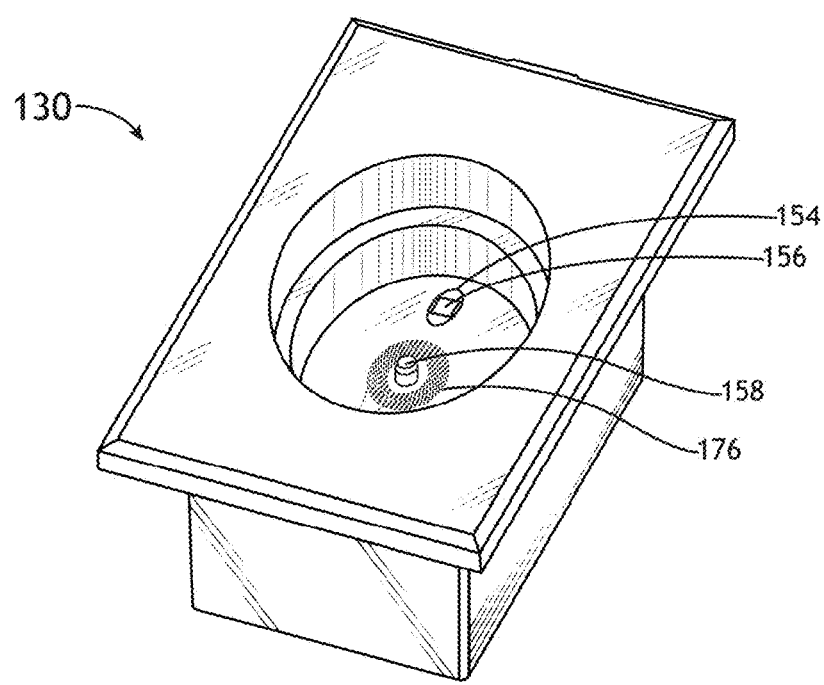
FIG. 4C is an isometric view illustrating a backplate having a circular shape, in accordance with one or more embodiments of the present disclosure.
Figure 4D:
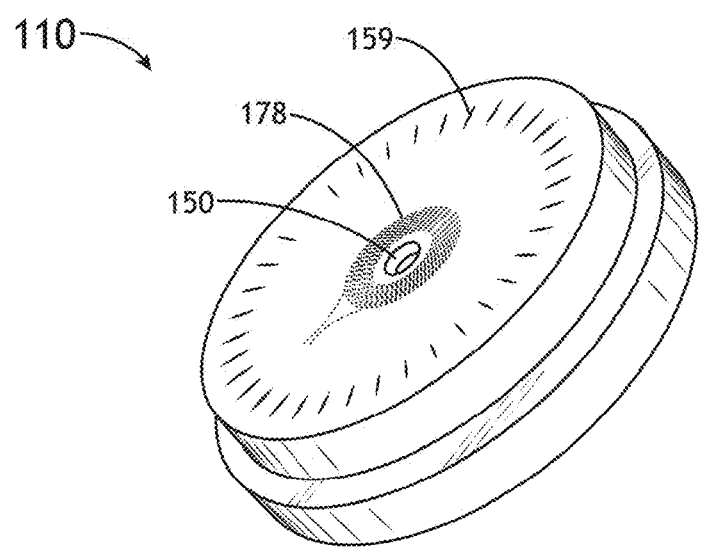
FIG. 4D is an isometric view of a back side of a device control assembly configured with a circular housing, in accordance with one or more embodiments of the present disclosure.

FIG. 4C is an isometric view illustrating a backplate 130 having a circular shape, in accordance with one or more embodiments of the present disclosure. FIG. 4D is an isometric view of a back side of a device control assembly 110 configured with a circular housing. In some embodiments, the backplate 130 includes a backplate induction coil 176 for transfer of data and/or electrical power via inductive coupling. Similarly, in some embodiments, the device control assembly 110 includes a device control assembly induction coil 178 for transfer of data and/or electrical power via inductive coupling (e.g. through inductive coupling with the backplate induction coil 176).

In some embodiments, a circular device control assembly 110 coupled to a backplate 130 may be rotated within the cavity 142 of the backplate 130. Further, a position of a circular device control assembly 110 within the cavity 142 of a backplate 130 may be measurable. For example, the position of a circular device control assembly 110 within the cavity 142 of a backplate 130 may be measurable via a rotary encoder (e.g. an optical encoder, a capacitive encoder, or the like), or one or more sensors (e.g. one or more accelerometers located within the device control assembly 110, or the like).

In some embodiments, a position of a circular device control assembly 110 within the cavity 142 of a backplate 130 may be utilized as a variable input parameter. In this regard, a user may adjust the variable input parameter by rotating the device control assembly 110 within the cavity 142 of the backplate 130. For example, a light level of luminaires connected to a circular device control assembly 110 including a dimmer may be adjustable by rotating the device control assembly 110 within the cavity 142 of the backplate 130. By way of another example, a speed of a fan connected to a circular device control assembly 110 including a variable fan speed controller may be adjustable by rotating the device control assembly 110 within the cavity 142 of the backplate 130. By way of another example, a volume of a multimedia device connected to a circular device control assembly 110 may be adjustable by rotating the device control assembly 110 within the cavity 142 of the backplate 130. By way of a further, example, a temperature of a heating/cooling system connected to a circular device control assembly 110 may be adjustable by rotating the device control assembly 110 within the cavity 142 of the backplate 130. In some embodiments, a direction and/or a speed of a circular device control assembly 110 rotating within the cavity 142 of a backplate 130 may be utilized as a variable input parameter.

In some embodiments, as illustrated in FIGS. 4C and 4D, the backplate 130 includes an encoder to determine the position of a coupled device control assembly 110. For example, the backplate 130 may include a transparent cover plate 154 placed over an optical reader 156. In some embodiments, the device control assembly 110 includes optical marks 159 on the back portion of the device control assembly 110 housing. For example, as illustrated in FIG. 4D, the optical marks may be lines radially disposed about the back portion of the device control assembly housing. By way of another example, the optical marks 159 may include a pattern disposed circularly about the back portion of the device control assembly 110 housing. In this regard, the optical reader 156 may identify one or more optical marks 159 on the device control assembly 110 to determine the position of the device control assembly 110 within the cavity 142 of the backplate 130. Further, the optical reader 156 may include any number of optical components known in the art suitable for identifying the one or more optical marks 159 such as, but not limited to, a photodiode. In some embodiments, the backplate 130 includes a light source (e.g. a light emitting diode, a laser diode, or the like) suitable for illuminating the one or more optical marks 159.

It is to be understood that components for determining the position of the device control assembly 110 within the cavity 142 of the backplate 130 may be distributed between the device control assembly 110 and the backplate 130 in any configuration. For example, the device control assembly 110 may include an optical reader 156 to monitor one or more optical marks 159 distributed on the backplate 130. By way of another example, a device control assembly 110 may independently determine its orientation (e.g. using one or more accelerometers, or the like) and optionally report this orientation to the backplate 130.

Figure 5:
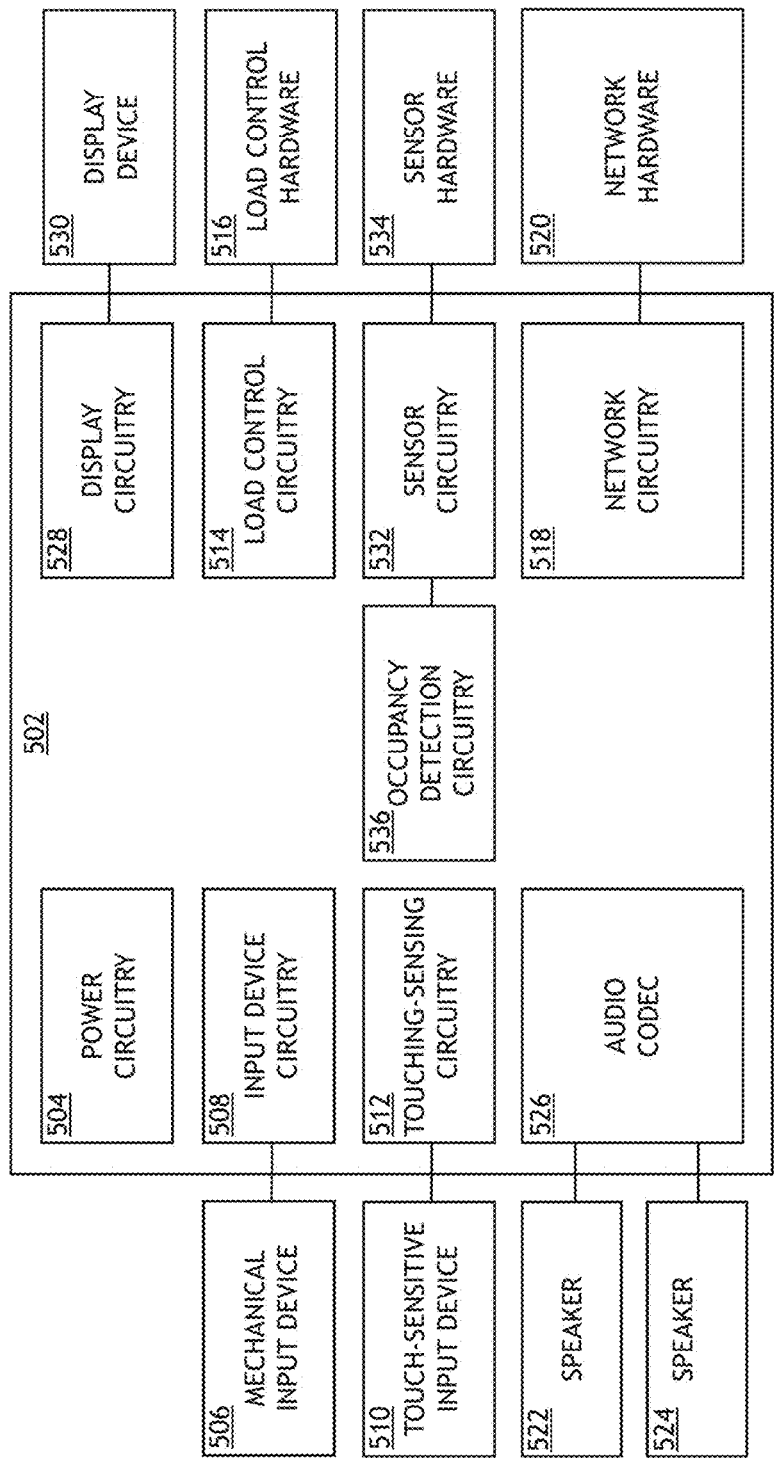
FIG. 5 is a block diagram illustrating components of a device control assembly, in accordance with one or more embodiments of the present disclosure.

FIG. 5 is a block diagram illustrating components of a device control assembly 110, in accordance with one or more embodiments of the present disclosure.

In some embodiments, a device control assembly 110 includes control circuitry 502. For example, control circuitry 502 may be located on circuit board 172. Further, the control circuitry 502 may include one or more processors. In some embodiments, the one or more processors are configured to execute a set of program instructions maintained in a memory medium, or memory. Further, the control circuitry 502 may include one or more modules containing one or more program instructions stored in the memory medium executable by the one or more processors. The one or more processors of control circuitry 502 may include any processing element known in the art. In this sense, the one or more processors may include any microprocessor-type device configured to execute algorithms and/or instructions. In some embodiments, one or more components of the control circuitry 502 are located external to the casing 116 of the device control assembly 110. For example, one or more components of the control circuitry 502 may be located in the backplate 130. By way of another example, one or more components of the control circuitry 502 may be located external to the modular control unit 100. In this regard, the device control assembly 110 may be communicatively coupled with an external controller including one or more processors. For example, one or more components of the control circuitry 502 may include, but are not limited to, a desktop computer, mainframe computer system, workstation, image computer, parallel processor, a locally-hosted system, a remotely-hosted system, a cloud-based system, or the like. It is noted herein that providing one or more components of the control circuitry 502 external to the device control assembly 110 may efficiently utilize processing resources and/or memory resources in the device control assembly 110 by off-loading processing-intensive tasks (e.g. occupancy detection, or the like). It is further recognized that the term "processor" may be broadly defined to encompass any device having one or more processing elements, which execute program instructions from a non-transitory memory medium.

It is recognized herein that the steps described throughout the present disclosure may be carried out by the control circuitry 502. Further, the controller may be formed from a single component or multiple components. It is further noted herein that the multiple components of the control circuitry 502 may be housed in a common housing or within multiple housings. In this way, any controller or combination of controllers may be separately packaged as a module suitable for integration into the modular control unit 100.

The memory medium may include any storage medium known in the art suitable for storing program instructions executable by the associated one or more processors. For example, the memory medium may include a non- transitory memory medium. As an additional example, the memory medium may include, but is not limited to, a read-only memory, a random access memory, a Flash memory, a magnetic or optical memory device (e.g., disk), a magnetic tape, a solid state drive and the like. It is further noted that memory medium may be housed in a common controller housing with the one or more processors. In some embodiments, the memory medium may be located remotely with respect to the physical location of the one or more processors and controller . For instance, the one or more processors of control circuitry 502 may access a remote memory (e.g., server), accessible through a network (e.g., internet, intranet and the like). Therefore, the above description should not be interpreted as a limitation on the present invention but merely an illustration.

In some embodiments, a device control assembly 110 includes power circuitry 504. For example, the device control assembly 110 may include elements to control the distribution of electrical power within the device control assembly including, but not limited to, a voltage regulator or an AC to DC converter to convert AC electrical power from the electrical wiring system to DC power suitable for powering one or more components on a circuit board 172.

In some embodiments, the device control assembly 110 includes a mechanical input device 506. For example, a device control assembly 110 may include, but is not limited to, a toggle switch, a button, or a dome switch. In some embodiments, the mechanical input device provides tactile feedback when actuated. In some embodiments, mechanical input device 506 provides audible and/or tactile (haptic) feedback when actuated. In this regard, actuation of the mechanical input device 506 is broadcast (e.g. to a user). In some embodiments, the mechanical input device 506 is coupled to input device circuitry 508 to provide an input signal associated with actuation of the mechanical input device 506.

In some embodiments, a device control assembly 110 includes a touch-sensitive input device 510 coupled with touch-sensing circuitry 512. The touch-sensitive input device 510 provides a means for user input in which a user may contact (e.g. with a finger) a portion of the touch-sensitive input device 510 to generate an input signal. The touch-sensitive input device 510 may include any touch-sensitive input device 510 known in the art including, but not limited to, capacitive-type or resistive-type devices. Further, the input signal may provide information to the control circuitry 502 such as, but not limited to, a number of contact points on the touch-sensitive input device 510 (e.g. a number of fingers in contact), a location of one or more contact points on the touch-sensitive input device 510, or a pressure of one or more contact points. Accordingly, a user may interact with a touch-sensitive input device 510 through any method suitable for generating an input signal including, but not limited to, a single tap, multiple taps, a tap and hold, depressing a button one or more times, or depressing and holding a button.

In some embodiments, the device control assembly 110 includes load-control circuitry 514 coupled to load control hardware 516. In some embodiments, the load control hardware 516 actuates, regulates, or otherwise controls a connected load. As described above, a device control assembly 110 (e.g. as part of a modular control unit 100) connected to a power distribution panel in an electrical wiring system may control the electrical power to load device connected to the electrical wiring system. Accordingly, the load control hardware may include, but is not limited to, one or more mechanical relays, one or more electrical relays, one or more diodes, one or more TRIACs, one or more MOSFETs, one or more resistors, one or more capacitors, or one or more integrated circuits.

Figure 6A:
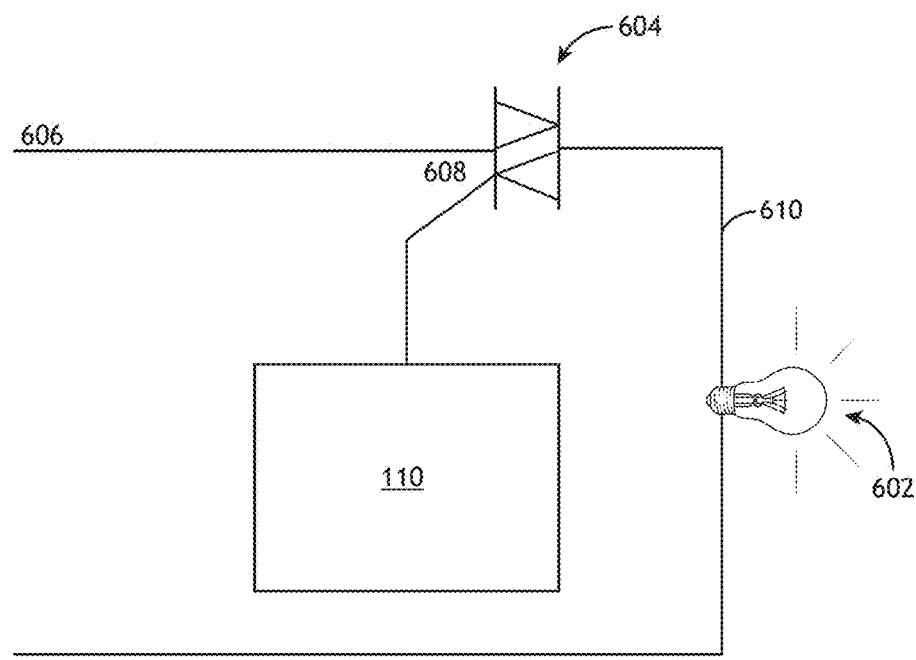
FIG. 6A is a schematic view of an electronic lighting dimmer circuit, in accordance with one or more embodiments of the present disclosure.
Figure 6B:
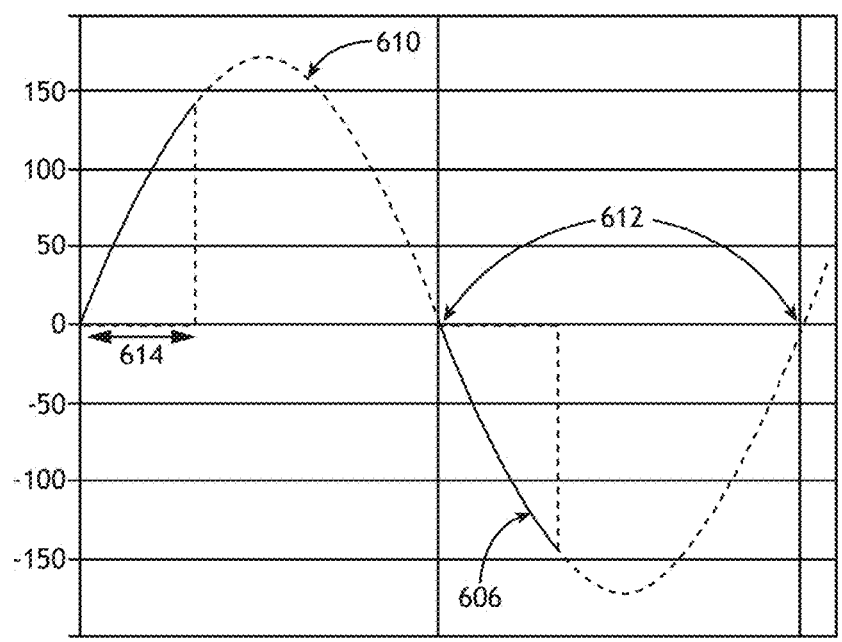
FIG. 6B is a plot illustrating the input AC waveform and a dimmed AC waveform, in accordance with one or more embodiments of the present disclosure.

FIG. 6A is a schematic view of an electronic lighting dimmer circuit 600, in accordance with one or more embodiments of the present disclosure. In some embodiments, the load-control circuitry 514 and/or the load control hardware 516 include an electronic lighting dimmer circuit 600 that controls the amount of current delivered to a load device 602. For example, a TRIAC-based dimmer circuit as illustrated in FIG. 6 may include a TRIAC 604 accepting an input AC waveform 606 and a gate signal 608 for controlling the dim level of the load device 602. FIG. 6B is a plot illustrating the input AC waveform 606 and a dimmed AC waveform 610, in accordance with one or more embodiments of the present disclosure. In some embodiments, the electronic lighting dimmer circuit 600 dims the load device 602 by controllably reducing the average voltage level to the load device 602 via modifications to the gate signal 608. For example, the electronic lighting dimmer circuit 600 may detect a zero crossing 612 of the input AC waveform 606, not drive the gate signal 608 for a determined time delay 614 based on a desired dim level, and then drive the gate signal 608 to allow current to flow to the load device 602 until the next zero crossing 612. Accordingly, the input AC waveform 606 may be alternately switched on and off to control the average voltage to the load device 602.

In some embodiments, the dim level is determined by the control circuitry 502. In some embodiments, the requested dim level of a load device 602 is set by the user.

It is noted herein that the electronic lighting dimmer circuit 600 may be suitable for dimming an electrically-connected load device 602. In some embodiments, the dimming level can also be expressed as a percentage of the half-cycle instead of the phase-angle.

Figure 6C:
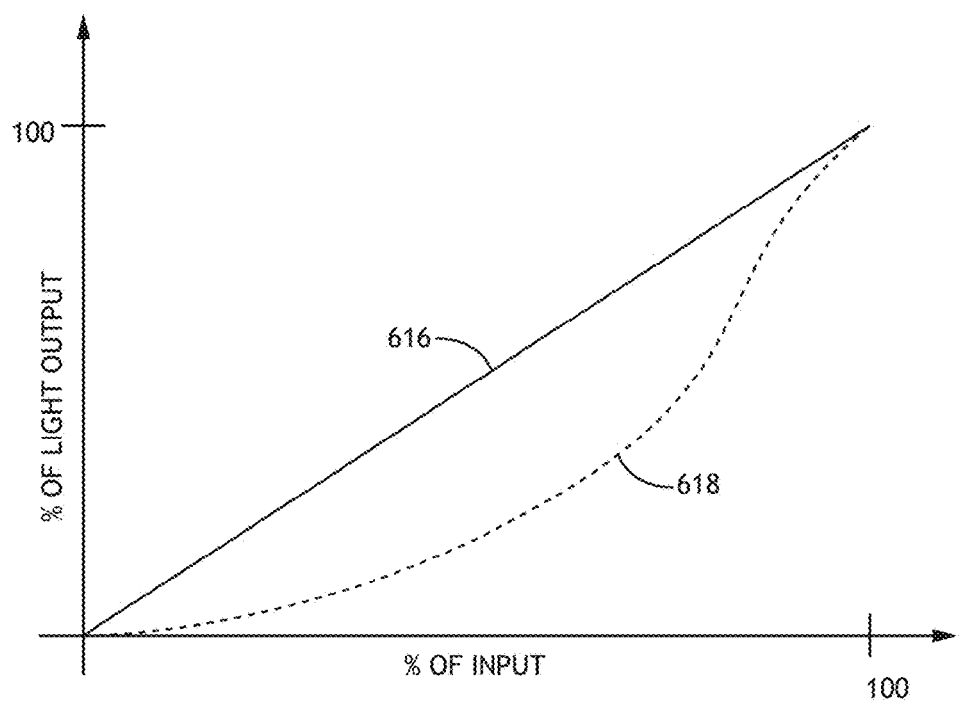
FIG. 6C is a plot illustrating a linearized lighting curve and a non-linearized lighting curve, in accordance with one or more embodiments of the present disclosure.

In some embodiments, the lighting device control assembly 110 adjusts the luminary level of a load device in accordance with a chosen linearization pattern. FIG. 6C is a plot illustrating a linearized lighting curve 616 and a non-linearized lighting curve 618, in accordance with one or more embodiments of the present disclosure. In some embodiments, a lighting level of a load device (e.g. a perceived brightness of the load device, or the like) may not vary linearly in response to a modification of an input AC waveform 606 (e.g. by electronic lighting dimmer circuit 600, or the like). For example, a given modification of an input AC waveform 606 may provide the non-linearized lighting curve 618. However, the device control assembly 110, in applying a linearization profile, may alter the dimming characteristics of the load-control circuitry 514 to provide the linearized lighting curve 616. In one instance, the device control assembly 110 may modify the time delay 614 associated with each desired dimming level. It is noted herein that the optimal linearization pattern may change depending on the type of load device and that the plot illustrated in FIG. 6C is provided solely for illustrative purposes and should not be interpreted as limiting. Accordingly, a linearization pattern for one type of load device may not function to linearize another type of load device.

In some embodiments, the device control assembly 110 detects the type of load device to which it is coupled. For example, a device control assembly 110 may detect if the load device is a compact fluorescent, incandescent or Light Emitting Diode (LED). Further, the device control assembly 110 may determine whether or not the load device is dimmable. In some embodiments, the type of load device is detectable by measuring the current through the load device over time and matching the current levels to a known current versus time profile. In some embodiments, a load device may be identified by the electrical current properties measured for the new load device when it is inserted into the device control assembly 110. In some embodiments, a user may be prompted to select the load device type (e.g. via a mobile phone application controlling the device control assembly 110, through interaction with the device control assembly 110 directly, or the like).

In some embodiments, a device control assembly 110 detects changes of a coupled load device and correspondingly modifies the linearization pattern applied to the load device. For example, if an incandescent load device is replaced with a LED load device, the device control assembly 110 may identify the new load device and apply a corresponding linearization pattern to produce a linear dimming curve for a LED load device.

In some embodiments, the device control assembly 110 includes a light sensor to measure the light output from a coupled load device. In this regard, the device control assembly 110 may measure light levels produced by the load device relative to expected values. In one instance, output from a light sensor may be utilized to generate a linearization profile for a load device. In another instance, a light sensor may be utilized to determine the type of load device coupled to the device control assembly 110.

In some embodiments, a device control assembly 110 includes network circuitry 518 coupled to network hardware 520. In some embodiments, the network circuitry 518 is coupled to an antenna to provide wireless data communication. In this regard, the antenna may be configured to operate in any frequency band known in the art. In some embodiments, the network circuitry and the antenna are configured to operate in a Radio Frequency (RF) band. In this regard, the network circuitry 518 may be compatible with any wireless protocol known in the art, such as, but not limited to, Bluetooth, Bluetooth Low Energy (BLE), WiFi, RFID, Zigbee, Z-Wave, Thread, 802.15.4, or the like. It is noted herein that the antenna (e.g. a portion of the network hardware 520 ) may be of any type known in the art, including, but not limited to, an embedded antenna or an external antenna.

In some embodiments, the network circuitry 518 is coupled to network hardware 520 to provide wired data communication. In some embodiments, the network circuitry 518 and network hardware 520 provide data communication over one or more electrical wires associated with the electrical wiring system (e.g. one or more wires in a power cable connected to the modular control unit 100). In this regard, the network circuitry 518 may be compatible with any wired protocol known in the art such as, but not limited to, universal powerline bus, X10, LonTalk, Homeplug AV, or Powerline AV.

In some embodiments, a device control assembly 110 forms a configurable network for data communication with one or more devices through the network circuitry 518 and network hardware 520. For example, a device control assembly 110 may form a network including one or more data connection pathways to at least a second device control assembly 110. As another example, a device control assembly 110 may form a network including one or more wireless devices (e.g. one or more wireless sensors, one or more wireless luminaires, one or more wireless electrical sockets, or the like). As a further example, a device control assembly 110 may form a network including one or more wired devices (e.g. one or more powerline devices). Additionally, a device control assembly 110 may form a network with any combination of device control assemblies 110, wireless devices, or wired devices. In this regard, a device control assembly 110 may transmit or receive data over one or more data pathways associated with the configurable network.

It is noted herein that the configurable network may have any topology known in the art including, but not limited to a mesh topology, a star topology, a ring topology, a line topology, or a bus topology. It is further noted herein that data pathways between device control assemblies 110 within the configurable network may include single-hop (e.g. a direct connection) or multi-hop pathways (e.g. a connection including one or more additional nodes to repeat and/or facilitate the data connection). For example, the configurable network may have a flood mesh topology. In this regard, data sent from a first device (e.g. one node) on the network intended for a second device (e.g. a second node) is sent to all nodes on the network. Further, any additional nodes on the network may repeat or retransmit the data such that the data is received by the second device by one or more data pathways. As another example, the configurable network may have a routed mesh topology in which routing information describing data pathways for data communication between nodes of the network is defined and stored (e.g. by any of the nodes on the network or a controller).

The configurable network may include (e.g. as nodes of the network) one or more additional connected devices in addition to device control assemblies 110 such as, but not limited to, sensors, luminaires, or configurable electrical sockets. The connected devices may be connected to the configurable network through wired pathways (e.g. via a data connection provided by power cables associated with the electrical wiring system) or wireless pathways (e.g. via Bluetooth, Bluetooth Low Energy (BLE), WiFi, RFID, Zigbee, Z-Wave, Thread, 802.15.4, or the like). Further, the configurable network may include one or more electrical appliances connected (e.g. via wired or wireless pathways) such as, but not limited to, connected televisions, connected set-top boxes (e.g. Apple TV, Roku, Chromecast, or the like), connected thermostats (e.g. Nest, Ecobee, or the like), or connected speakers audio devices (e.g. Amazon Echo, Sonos, or the like). Additionally, the configurable network may include one or more mobile devices (e.g. phones, tablets, wearable devices, or the like).

In some embodiments, the device control assembly 110 includes WiFi circuitry to make a connection to the Internet. For example, the device control assembly 110 may include a bridge or access point hub to communicate with a WiFi router. By way of another example, the access point hub may integrate into the device control assembly 110 and be integrated in the mesh network. For instance, each device control assembly 110 may use one or more access point hubs to connect to the Internet. In some embodiments, the device control assembly 110 may operate as an access point to the local network (e.g. a mesh network of device control assemblies 110, sensors, or the like) or to the internet.

In some embodiments, a device control assembly 110 may provide one or more physical functions and/or one or more addressable functions (e.g. in response to command instructions from another device on the network. For example, the physical function of a device control assembly (e.g. regulating a current and/or a voltage to a load device) may be performed by electrical and/or mechanical elements (e.g. switches, relays, or the like) within the casing of the device control assembly 110. In some embodiments, a device control assembly 110 provides a physical function upon actuation of a user input device (e.g. a mechanical input device 506 or a touch-sensitive input device 510). For example, a device control assembly 110 may operate as a dimmer switch to regulate electrical power to one or more connected luminaires by swiping a finger along a linear path on a touch-sensitive input device 510. In this regard, an input signal generated by the touch-sensing circuitry 512 including a location of a finger contact may determine the relative brightness of the connected luminaires. Further, an input signal generated by the touch-sensing circuitry 512 including a location of a finger contact may determine the color output of a multi-color luminaire.

In some embodiments, a device control assembly 110 is directed to perform a physical function (e.g. control one or more load devices using load control circuitry 524 coupled to load control hardware 526) by at least one other device (e.g. a second device control assembly 110) on a configurable network via data communication. Accordingly, a device control assembly 110 may have an addressable function in which the device control assembly 110 directs one or more additional device control assemblies to perform their associated physical functions. In some embodiments, the physical and addressable functions of a device control assembly 110 are independent. In this regard, a device control assembly 110 may perform a physical function without actuation of an input device of the device control assembly 110 (e.g. a mechanical input device 506 or a touch-sensitive input device 510).

Similarly, a device control assembly 110 may provide an addressable function by directing at least a second device control assembly 110 to perform a physical function via data communication. For the purposes of the present disclosure, for example, a device control assembly 110 may be configured to direct a second device control assembly to actuate a load (e.g. toggle the state of a connected electrical device) upon actuation of an input device (e.g. a mechanical input device 506 or a touch-sensitive input device 510). In this way, actuation of a device control assembly 110 (e.g. via a mechanical input device 506 or a touch-sensitive input device 510) may cause the regulation of a load device by another device control assembly 110. In this regard, a device control assembly 110 may perform an addressable function without performing a physical function.

In some embodiments, a device control assembly 110 provides multiple functions including one more physical functions and one or more addressable functions. For example, a device control assembly 110 is configured to provide a physical function upon actuation of a first portion of a touch-sensitive input device 510 and is further configured to provide an addressable function upon actuation of a second portion of the touch-sensitive input device 510. In this regard, a device control assembly 110 may operate as a multi-function keypad.

For the purpose of the present disclosure, a device control assembly 110 is paired with a load device if the device control assembly 110 is configured to control the load through a physical or an addressable function. It is noted herein that a device control assembly 110 may be configured to exclusively perform one or more addressable functions by only pairing the device with one or more loads not regulated by a physical function of the device control assembly 110 (e.g. not pairing the device control assembly 110 with a load associated with a physical function).

In some embodiments, pairings between device control assemblies 110 and load devices within a configurable network are dynamically assignable. In some embodiments, device pairings are defined and stored locally on each device control assembly 110 within the network. Accordingly, a device control assembly 110 is physically paired with a load if the device control assembly 110 is configured to regulate electrical power to the load device through load control circuitry 514 and associated load control hardware 516 (e.g. as a physical function). Similarly, a device control assembly is addressably paired with a load device if the device control assembly 110 is configured to direct one or more additional device control assemblies 110 to regulate the load device through load control circuitry 524 and associated load control hardware 526 of the one or more additional device control assemblies.

In some embodiments, a pairing for a device control assembly 110 and a load is determined by the device control assembly 110 itself. In some embodiments, pairings between device control assemblies 110 and load devices within a configurable network are determined by a controller associated with the configurable network. The controller may have any type of architecture known in the art such as, but not limited to a centralized architecture or a distributed architecture. In some embodiments, one device controller within the configurable network operates as the controller (e.g. to define, store, and distribute device pairings to device control assemblies 110 on the network). In some embodiments, a controller for assigning device control assembly pairings 110 is distributed. In this regard, one or more device control assemblies 110 operate together as the controller. In a further embodiment, a controller is an element on the network other than a device control assembly 110 such as, but not limited to, a hub, a centralized server, or a distributed server.

In some embodiments, the controller includes one or more processors. Further, the one or more processors may be configured to execute a set of program instructions maintained in a memory medium, or memory. The one or more processors of a controller may include any processing element known in the art. In this sense, the one or more processors may include any microprocessor-type device configured to execute algorithms and/or instructions. In some embodiments, the one or more processors may consist of a stand-alone device hub, a desktop computer, a mainframe computer system, a workstation, or any other computer system (e.g., networked device) configured to execute a program configured to operate the configurable network, as described throughout the present disclosure. It is further recognized that the term "processor" may be broadly defined to encompass any device having one or more processing elements, which execute program instructions from a non-transitory memory medium.

Figure 7:
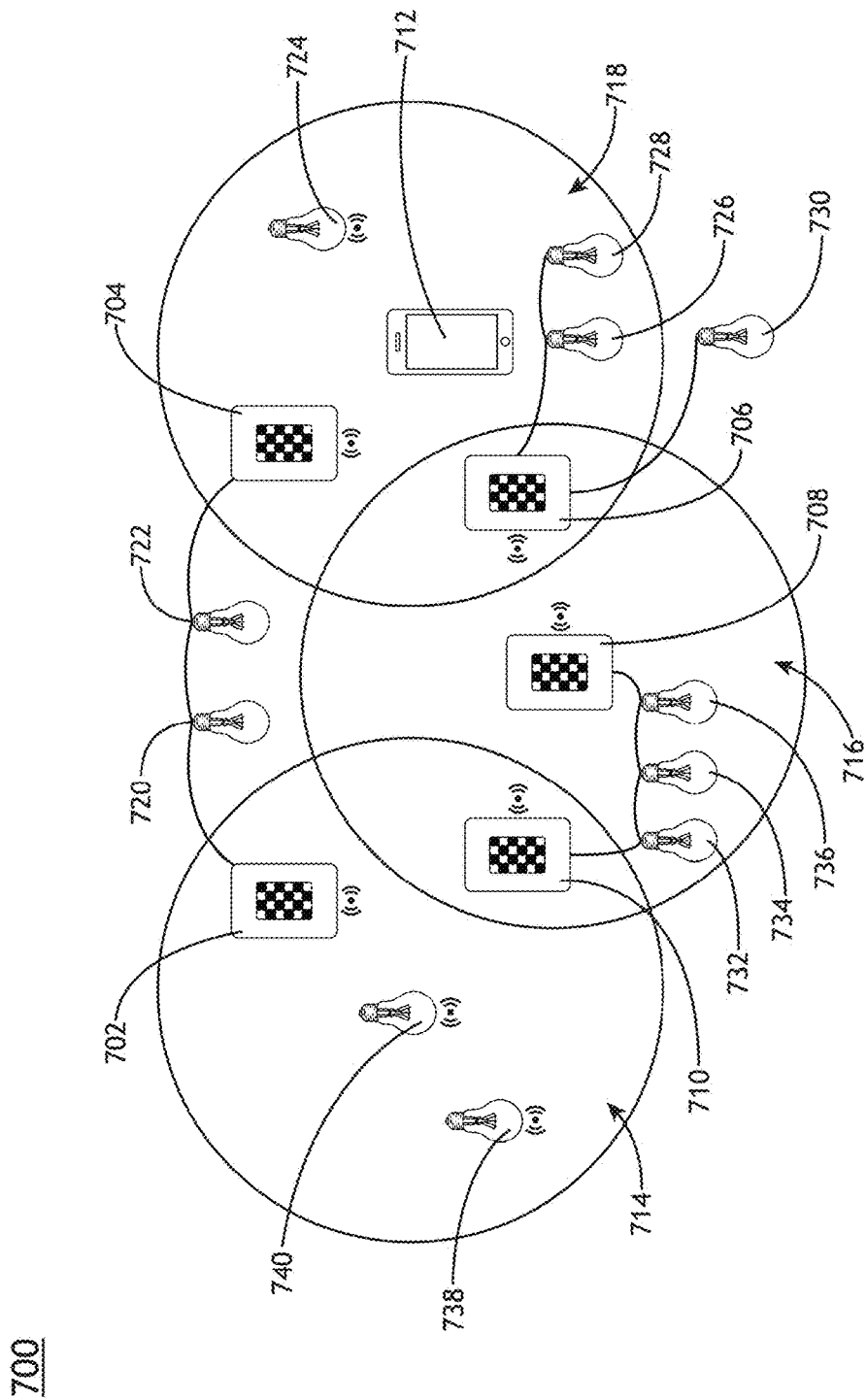
FIG. 7 is an illustration of a configurable network, in accordance with one or more embodiments of the present disclosure.

FIG. 7 is an illustration of a configurable network 700, in accordance with one or more embodiments of the present disclosure. It is noted herein that the network 700 described herein is provided solely for illustrative purposes and should not be interpreted as limiting the present disclosure. In some embodiments, the network includes device control assemblies 702-710 and a connected mobile device 712 (e.g. a phone, a tablet, a wirelessly-connected computer, or the like) configured to control one or more load devices 720-740.

In some embodiments, device control assemblies 702 and 704 are physically paired to load devices 720 and 722 and are configured to operate as a three-way switch. In some embodiments, device control assembly 706 is physically paired to load devices 726-730 and is configured to operate as a multi-function keypad to operate load devices 726-728 and load device 730 independently. In some embodiments, device control assemblies 708 and 710 are physically paired to load devices 732-736 and are configured to operate as a three-way switch. Further, device control assembly 708 and device control assembly 710 may each be configured to operate as a dimmer switches. In some embodiments, load devices 724, 738, and 740 are wirelessly connected to the network 700 and are further not physically paired with any device control assembly 702-710.

In some embodiments, device control assemblies 702-710 are wirelessly connected within the network 700 via one or more data pathways. In some embodiments, network circuitry 518 and associated network hardware 520 of the device control assemblies 110 are configured to connect via a Bluetooth Low Energy (BLE) protocol in a mesh network topology (e.g. a flood mesh topology). Further, mobile device 712 and load devices 724, 738, and 740 are nodes within the mesh network 700. In this regard, each node on the mesh network may transmit or retransmit mesh network traffic such that all nodes of the mesh network may communicate (e.g. via single-hop or multi-hop paths). Accordingly, mobile device 712 can be paired with load devices 738 and 740 via the network 700. For example, mobile device 712 may have a data range 718 insufficient to reach load device 738. However, device control assembly 708 may serve as a repeater (e.g. in a flood mesh network). In this regard the data range 716 overlaps with data range 718 of mobile device 712 and data range 714 of load device 738 to provide data communication. In some embodiments, the mobile device 712 connects to a device control assembly (e.g. device control assembly 706) for communication with load devices within the network 700. In this regard, device control assembly 706 may operate as a bridge to communicate data between the mobile device 712 and any device on the network 700. It is noted herein that mobile device 712 or, alternately any connected device (e.g. a connected television, a connected electrical appliance, a wearable device, or the like), may not include appropriate hardware to properly communicate on the network 700. However, a device control assembly (e.g. device control assembly 706) may simultaneously connect with the network 700 on a first protocol (e.g. a flood mesh protocol) and a connected device on a second protocol (e.g. a Bluetooth protocol) to provide a bridge for data communication between the connected device and one or more devices on the network 700.

It is noted herein that any number of device pairings between device control assemblies 702-710, mobile device 712, and load devices 720-740 may be established via the configurable network 700. Accordingly, the descriptions of pairings above are intended solely for illustrative purposes and should not be interpreted as limiting.

In some embodiments, a device control assembly 110 includes at least one of a microphone 522 or a speaker 524 coupled with an audio codec 526. In this regard, the device control assembly 110 may accept and/or emit audio signals.

In some embodiments, a device control assembly 110 includes display circuitry 528 coupled to a display device 530 for driving the display device 530. The display device 530 may be any type of display device known in the art suitable for displaying visual information including, but not limited to, a light-emitting diode (LED), a LED display, an organic light-emitting diode (OLED) display, a liquid crystal display (LCD), a thin-film transistor (TFT) display, or an electronic ink (E-ink) display. In some embodiments, the display circuitry 528 may provide a programmable user interface for the programming of one or more functions (e.g. actuating load devices, responding to notifications, or the like).

Figure 8:
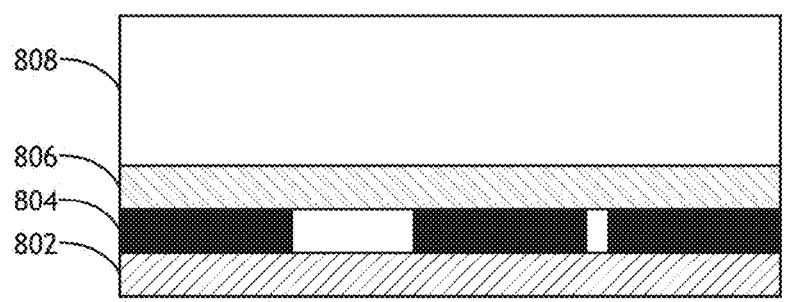
FIG. 8 is a cross section view illustrating a display device configured to display visual information using deadfronting, in accordance with one or more embodiments of the present disclosure.

In some embodiments, the display device 530 uses a deadfronting technique to display visual information. FIG. 8 is a cross section view illustrating a display device 530 configured to display visual information using deadfronting, in accordance with one or more embodiments of the present disclosure. In some embodiments, the display device includes a backlight 802. The backlight 802 may include one or more optical components suitable for generating illumination such as, but not limited to, one or more LEDs, one or more light guides, one or more lasers, one or more homogenizers, one or more filters, or one or more polarizers. Further, the backlight 802 may produce illumination of any color such as, but not limited to white light or light of a particular color. In some embodiments, the color of illumination provided by the backlight 802 is adjustable. In some embodiments, the display device 530 includes an opaque layer 804. For example, the opaque layer 804 may include one or more transparent regions (e.g. portions of transparent material, holes, voids, or the like) corresponding to one or more images to be displayed. Further, the opaque layer 804 may be positioned proximate to the backlight 802 such that illumination from the backlight 802 propagates through the one or more transparent regions to produce one or more illuminated images to be displayed. In some embodiments, the display device 530 includes a semi-transparent layer 806. For example, the semi-transparent layer 806 may be located proximate to the opaque layer 804 such that the transparent regions and the opaque regions of the opaque layer 804 are distinguishable only when illuminated by the backlight 802. In some embodiments, the display device 530 includes a cover lens 808. For example, the cover lens 808 may be positioned proximate to the semi-transparent layer 806. In this regard, the cover lens 808 may protect underlying layers. In some embodiments, the display device 530 and the touch-sensitive input device 510 are integrated into a single unit (e.g. a user interface 112).

In some embodiments, the display device 530 may operate in any number of display modes. For example, a display device 530 may have multiple display modes in which a different image or set of images is displayed in each display mode. In this regard, user input (e.g. signals from a display device 530 coupled with a touch-sensitive input device 510) may be interpreted differently by the control circuitry 502 based on the current display mode. Accordingly, a user may interface with different features of the device control assembly 110 through different display modes.

Figure 9A:
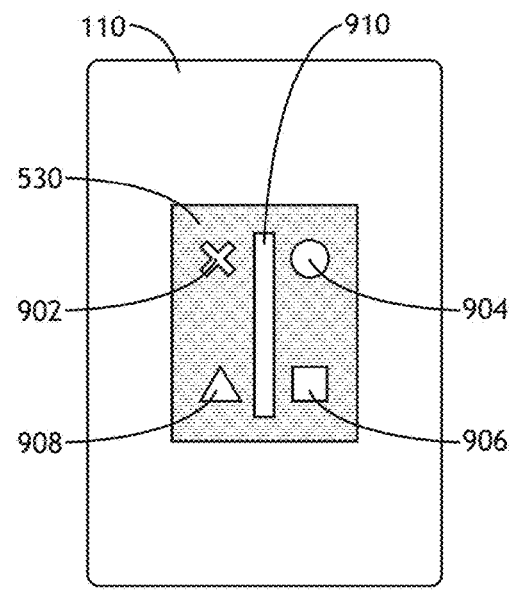
FIG. 9A is a top view of an opaque layer including shapes that are transparent to illumination from the backlight.

In some embodiments, a display device 530 incorporating a deadfront display (e.g. as illustrated in FIG. 8) may include images and/or patterns associated with each display mode. FIG. 9A is a top view of an opaque layer (e.g. opaque layer 804, or the like) including shapes 902-910 that are transparent to illumination from the backlight 802. In this regard, any combination of shapes 902-910 may be selectively illuminated by the backlight 802 in a given display mode. Further, any of shapes 902-910 may function as soft buttons. Accordingly, a user may tap, press, tap and hold, or otherwise interact with the display device at a location corresponding to the shapes 902 -910 to generate one or more input signals (e.g. to be interpreted by the touch-sensing circuitry 512, or the like) indicating a desired function.

Figure 9B:
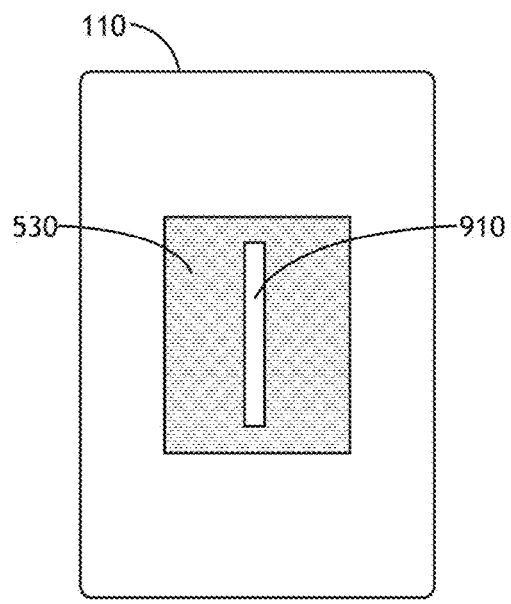
FIG. 9B is a top view of a device control assembly having a display device in a Dimmer display mode, in accordance with one or more embodiments of the present disclosure.

In some embodiments, a display mode includes a dimmer display mode. FIG. 9B is a top view of a device control assembly 110 having a display device 530 in a Dimmer display mode, in accordance with one or more embodiments of the present disclosure. In some embodiments, a shape 910 including a rectangular shape is illuminated in the Dimmer mode. In one instance, a user may adjust a dim level for a load based on a location of a finger along the shape 910. Further, the intensity of illumination may correspond to a current dim level. For example, the shape 910 may be nominally illuminated with a first illumination profile (e.g. an illumination brightness and/or color) such that the entire outline of the shape 910 may be seen. Additionally, a portion of the shape 910 may be illuminated with a second illumination profile to indicate a current dim level. In another instance, a press of the display device 530 may toggle between dim levels (e.g. on, off, preset dim levels, or the like).

Figure 9C:
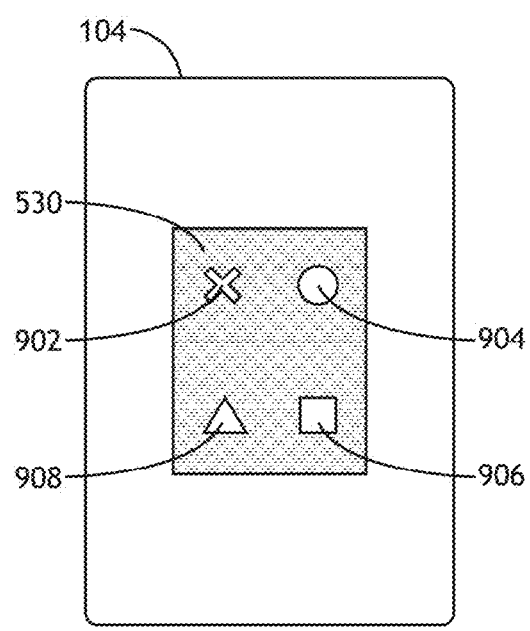
FIG. 9C is a top view of a device control assembly having a display device in a Keypad display mode, in accordance with one or more embodiments of the present disclosure.

In some embodiments, a display mode includes a Keypad display mode. FIG. 9C is a top view of a device control assembly 110 having a display device 530 in a Keypad display mode, in accordance with one or more embodiments of the present disclosure. In some embodiments, shapes 902-908 are illuminated in the Keypad mode. Further, the illumination profile of each shape 902-908 may correspond to a current state of a function associated with the shape 902 -908. For example, shapes 902-908 may be illuminated with a first illumination profile to provide visibility. Additionally, one or more shapes 902-908 may be illuminated with an additional illumination profile when selected by a user.

In some embodiments, a user may interact with a display device 530 in a Keypad display mode through a variety of input methods. For example, each shape 902-908 may serve as a soft button to initiate a desired feature. By way of another example, a user may simultaneously select two or more shapes (e.g. with two or more fingers) to initiate additional features. Further, the mode of user input may differentiate between desired functions. In one instance, a single tap on a shape 902-908 may initiate a first function (e.g. turning off one or more loads, or the like), a double tap on a shape 902-908 may initiate a second function (e.g. initiating a scene including preset states of one or more loads, or the like), and so on. By way of a further example, a button press may initiate an additional function (e.g. toggle one or more load devices, or the like).

Figure 9D:
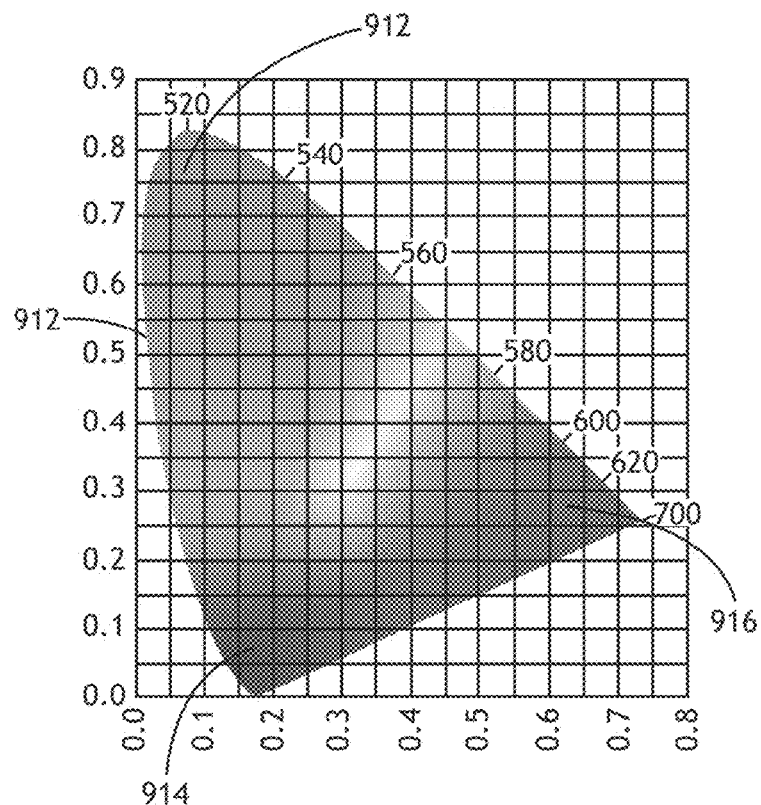
FIG. 9D is a top view of a device control assembly having a display device in a Color Selection display mode, in accordance with one or more embodiments of the present disclosure.
Figure 9E:
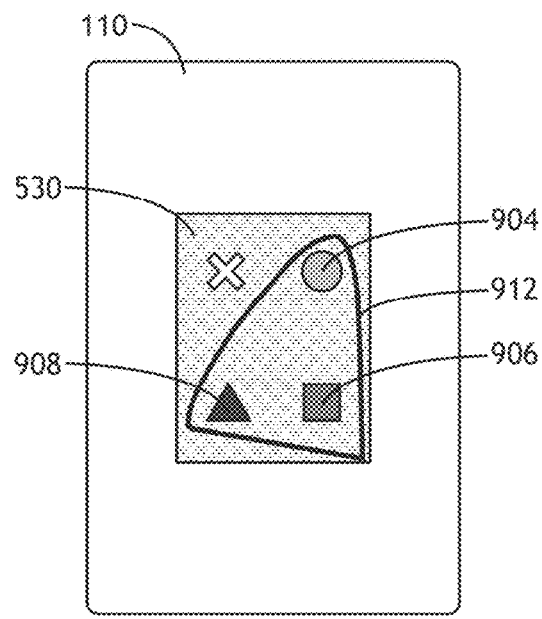
FIG. 9E is a plot illustrating a color chart, in accordance with one or more embodiments of the present disclosure.

In some embodiments, a display mode includes a Color Selection display mode. FIG. 9D is a plot illustrating a color chart 914 (e.g. a 1931 CIE color chart, or the like), in accordance with one or more embodiments of the present disclosure. In some embodiments, a display device 530 in a Color Selection display mode may facilitate the modification of a color (e.g. a hue, or the like) of a color-controllable luminaire. FIG. 9E is a top view of a device control assembly 110 having a display device 530 in a Color Selection display mode, in accordance with one or more embodiments of the present disclosure. In some embodiments, a selection region 912 of a display device 530 in a Color Selection display mode may correspond to a color chart (e.g. a reversed version of the color chart illustrated in FIG. 9D) such that the display device 530 may control the color of a color-controllable luminaire based on a location of a finger of a user within the selection region, which further corresponds to a color of the color chart. For example, a first region 916 of the color chart may indicate hues of green, a second region of the color chart 918 may indicate hues of red, and a third region of the color chart 920 may indicate hues of blue. Further, the selection region 912 may include continuously varying regions such that a color on a continuous scale may be selected. In some embodiments, the selection region 912 is visible (e.g. the selection region 912 corresponds to a pattern in an opaque layer 804 of a deadfront display, or the like). In some embodiments, the selection region 912 is not visible on the display device 530. In some embodiments, one or more portions of the display device 530 may be illuminated to provide visual feedback of a current color state. Further, the mode of user input may differentiate between desired functions. In one instance, a button press may initiate an additional function (e.g. toggle one or more load devices, or the like).

Figure 9F:
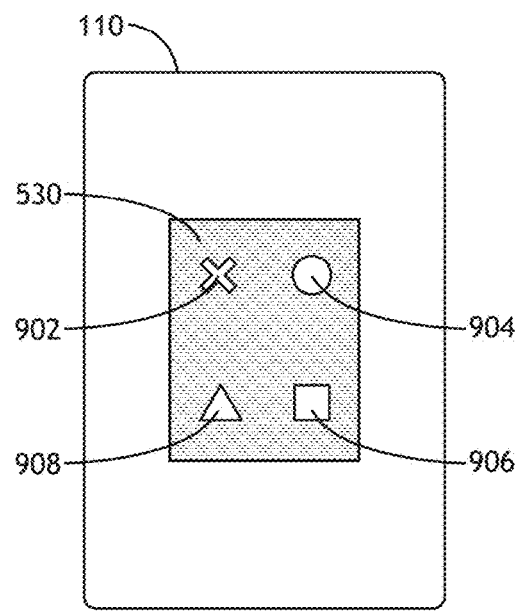
FIG. 9F is a top view of a device control assembly having a display device in a Notification display mode, in accordance with one or more embodiments of the present disclosure.

In some embodiments, a display mode includes a Notification display mode. FIG. 9F is a top view of a device control assembly 110 having a display device 530 in a Notification display mode, in accordance with one or more embodiments of the present disclosure. In some embodiments, one or more shapes 902-910 may illuminate with a notification illumination profile (e.g. an intensity and/or color associated with a notification). For example, a shape 902-910 may blink red to indicate a notification. In response, a user may interact with the blinking shape 902-908 (e.g. via a tap, a double tap, or the like) to respond to the notification. In one instance, the triangle 908 may blink red to indicate that a door (e.g. a garage door, a front door, or the like) is open or unlocked. In response, the user may tap the triangle 908 to address the notification (e.g. close the garage door, lock the front door, or the like) and reset the notification (e.g. return the triangle 908 to a nominal illumination profile). In some embodiments, each shape 902-908 may indicate a different notification (e.g. an open door, an open window, a missed telephone call, or the like). Further, each shape may illuminate with any number of illumination profiles (e.g. combinations of color and intensity) to indicate any number of notifications.

Figure 9G:
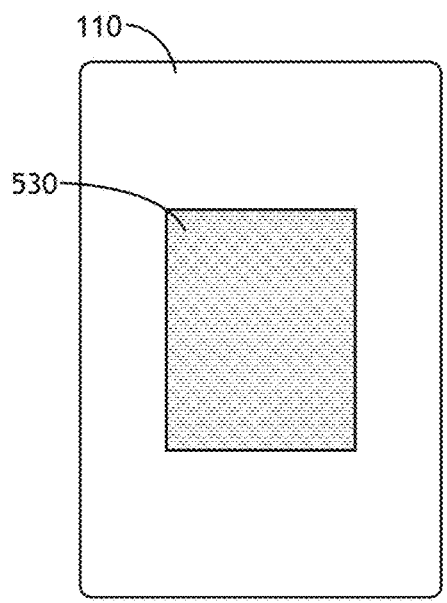
FIG. 9G is a top view of a device control assembly having a display device in an
Off display mode, in accordance with one or more embodiments of the present disclosure.

In some embodiments, a display mode includes an Off display mode. FIG. 9G is a top view of a device control assembly 110 having a display device 530 in an Off display mode, in accordance with one or more embodiments of the present disclosure. In some embodiments, in an Off display mode, none of the shapes 902-910 are illuminated. In one instance, an Off display mode may function as a load toggle. In this regard, interacting with the display device may toggle and/or actuate a desired function (e.g. actuate a load device, actuate a defined grouping of load devices, start a function, or the like). In another instance, an Off display mode may indicate a selection state such that a display mode may be selected. In this regard, interacting with the display device 530 (e.g. at any location) may switch the display mode and illuminate any number of shapes 902-908.

FIG. 9H is a table providing an exemplary illustration of different ways of accessing the different display modes via an Off mode, in accordance with one or more embodiments of the present disclosure.

In some embodiments, the device control assembly 110 includes sensor circuitry 532 coupled to one or more sensors (e.g. sensor hardware 534). For example, a device control assembly 110 may include, but is not limited to, a visible light sensor, a temperature sensor, a proximity sensor, a pressure sensor, a passive infrared (PIR) sensor, an active infrared sensor, or a thermopile sensor. In this regard, the sensor circuitry 532 may generate one or more sensor input signals associated with an environment proximate to the device control assembly 110.

In some embodiments, the device control assembly 110 includes occupancy detection circuitry 536 coupled to the sensor circuitry 532 and/or the sensor hardware 534 to determine occupancy of a room in which the device control assembly 110 is located based on signals from the sensor hardware 534. In some embodiments, the occupancy detection circuitry 536 performs occupancy detection and vacancy detection. Further, the device control assembly 110 may detect one or more occupants in a space (e.g. a room, an area proximate to the device control assembly 110, or the like). Additionally, the device control assembly 110 may detect stationary or moving occupants.

Figure 10:
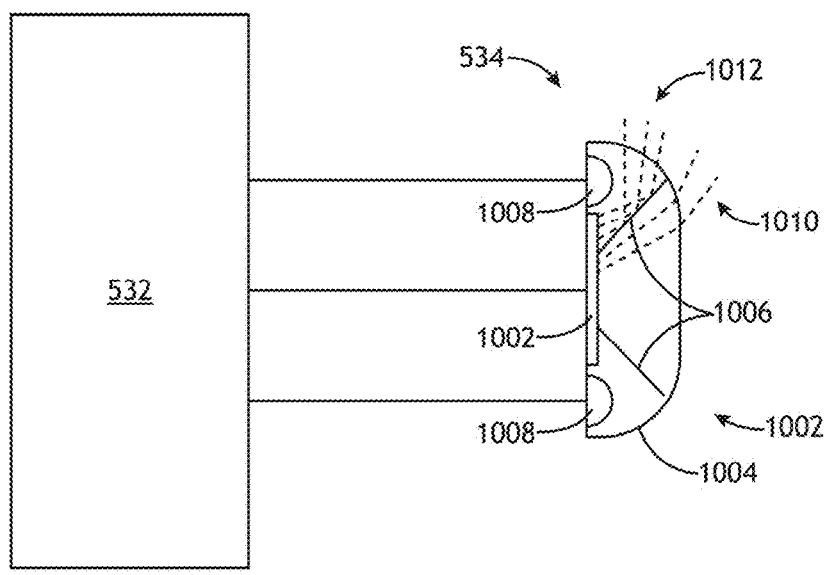
FIG. 10 is a conceptual view of sensor hardware, sensor circuitry, and occupancy detection circuitry of a device control assembly for occupancy detection, in accordance with one or more embodiments of the present disclosure.

FIG. 10 is a conceptual view of sensor hardware 534 and sensor circuitry 532 of a device control assembly 110 for occupancy detection (e.g. in communication with occupancy detection circuitry 536), in accordance with one or more embodiments of the present disclosure. In some embodiments, the sensor hardware 534 includes a sensor assembly 1002. For example, the sensor assembly 1002 may include one or more components to capture light such as, but not limited to, a complementary metal-oxide semiconductor (CMOS) sensor, a charge-coupled device (CCD), a thermopile array (TPA) sensor, a passive infrared (PIR) sensor, or the like. In this regard, the sensor assembly 1002 may capture light (e.g. visible light, infrared light, or the like) from sources external to the device control assembly 110. In one instance, a sensor assembly 1002 may capture infrared light from one or more occupants (e.g. human occupants, animal occupants, or the like). In another instance, a sensor assembly 1002 may capture ambient infrared light.

In some embodiments, the sensor hardware 534 includes a lens 1004 to collect infrared light and direct the infrared light to the sensor assembly 1002. The lens 1004 may include any type of lens known in the art that is at least partially transparent to infrared radiation detectable by the sensor assembly 1002. Further, a shape of the lens 1004 may enable a wide field of view. For example, the lens 1004 may include a fish-eye lens. By way of another example, the lens 1004 may include a multi-field lens. In this regard, the lens 1004 may include one or more mirror-like surfaces 1006 to divide light from certain incident angles on the lens 1004 to certain portions of the sensor assembly 1002. In some embodiments, as illustrated in FIG. 10, the lens 1004 includes a tri-field lens that creates three different sections on the image sensor corresponding to light from different incident angles. Further, the outside sections may be mirrored in one axis relative to a middle section. For example, illumination 1010 from a first set of solid angles may propagate through the lens 1004 and interact with a first portion of the sensor assembly 1002, while illumination 1012 from a second set of solid angles may reflect off of one of the mirror-like surfaces 1006 and interact with a second portion of the sensor assembly 1002. In some embodiments, the mirror-like surfaces 1006 in the lens 1004 create a nearly 180 degree field of view. It is noted herein that the outside sections of the lens 1004 may distort light (e.g. similar to distortion induced by a fish eye lens, or the like). In some embodiments, the occupancy detection circuitry 536 performs image processing. In this regard, the device control assembly 110 may correct for distortions and/or aberrations (e.g. defocus, astigmatism, coma, chromatic aberrations, or the like) induced by the lens 1004 (e.g. via the sensor circuitry 532 and/or the occupancy detection circuitry 536).

In some embodiments, the sensor assembly 1002 includes a single type of sensor. For example, the sensor assembly 1002 may include any one of a CMOS sensor, a CCD, a TPA, or a PIR. In some embodiments, the device control assembly 110 determines occupancy at least in part based on capturing still and/or sequential images. For example, still and/or sequential images may be captured by a CMOS sensor, a CCD, or the like.

Figure 11A:
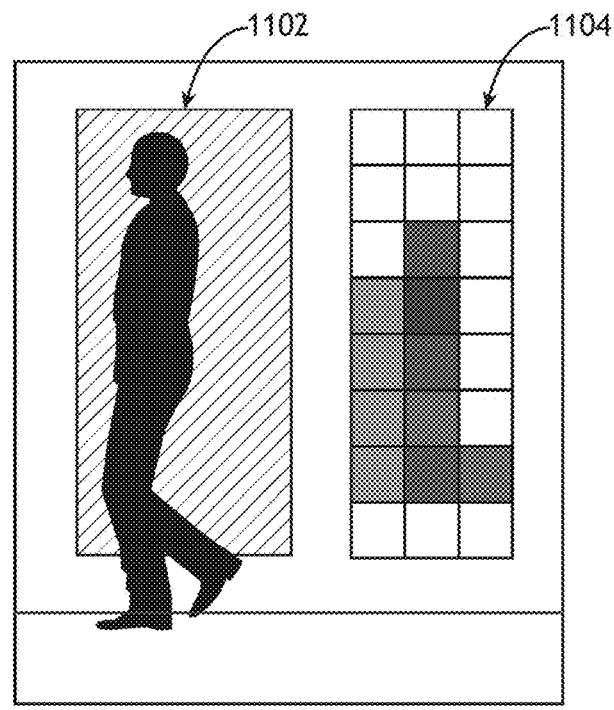
FIG. 11A is a conceptual view of a person in motion and a corresponding heat map as imaged by a TPA, in accordance with one or more embodiments of the present disclosure.
Figure 11B:
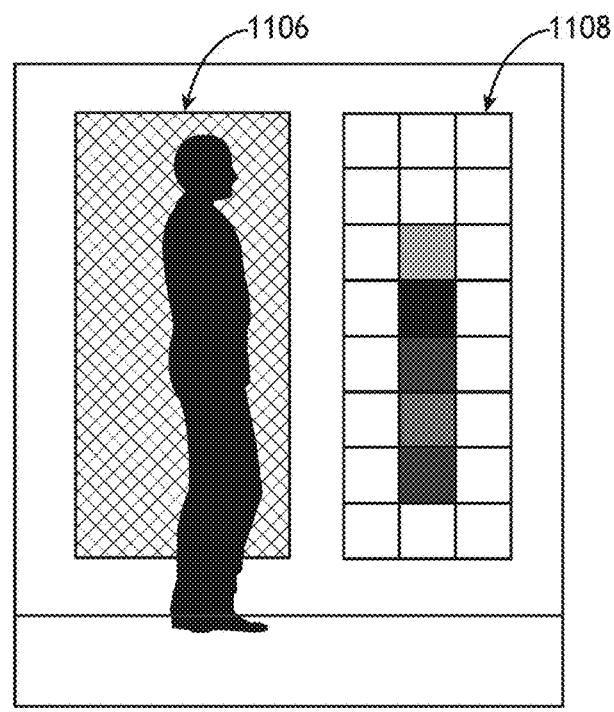
FIG. 11B is a conceptual view of a stationary person and a corresponding heat map 1108 as imaged by a TPA, in accordance with one or more embodiments of the present disclosure.

In some embodiments, the device control assembly 110 determines occupancy at least in part based on measuring the temperature (e.g. actual temperature, relative temperature, or the like) of the field of view of the sensor assembly 1002. For example, TPA and a directional lens may measure the temperature of an area surrounding the device control assembly 110. In this regard, a resolution of the temperature measurement may be related to a resolution of the TPA (e.g. the number of thermopile sensors, the size of thermopile sensors, or the like) and/or a resolution of the lens 1004. FIG. 11A is a conceptual view of a person in motion 1102 and a corresponding heat map 1104 as imaged by a TPA, in accordance with one or more embodiments of the present disclosure. FIG. 11B is a conceptual view of a stationary person 1106 and a corresponding heat map 1108 as imaged by a TPA, in accordance with one or more embodiments of the present disclosure. For example, a grayscale value in the heat map 1104 may correspond to measured temperature such that darker grayscale values may indicate higher measured temperatures. In some embodiments, TPA measurements are reported in a heat map grid where darker grid locations indicate higher measurement readings.

In some embodiments, the sensor assembly 1002 includes a combination of multiple sensor types to provide enhanced occupancy detection relative to the use of a single type of sensor. For example, the sensor assembly 1002 may include a CMOS sensor and a PIR sensor. In one instance, a PIR sensor may be tuned for long-range detection (e.g. by adjusting the gain of a sensing element, the sensitivity to changes in temperature, or the like) to complement the shorter range, but higher resolution of a CMOS sensor. In this regard, the combined sensor assembly 1002 may be suitable for picking up motion of warm, moving bodies at long distances in order to maintain an occupancy detection status when an object is out of range of the CMOS sensor. By way of another example, the sensor assembly 1002 may include a CMOS sensor and a TPA sensor. In this regard, an image associated with the CMOS sensor and an image associated with the TPA sensor may be overlaid to provide a multidimensional image to further improve the accuracy of the occupancy detection circuitry 536.

In some embodiments, the sensor hardware 534 includes one or more IR emitters 1008 to emit one or more wavelengths of infrared light that may be detected by the sensor assembly 1002. IR emitters 1008 may include any type of source suitable for emitting infrared light such as, but not limited to, an infrared diode, an infrared laser, or the like. In this regard, the device control assembly 110 may include an active infrared occupancy sensor (AIROS). It is noted herein that IR illumination may allow a consistent depiction of the room regardless of the current ambient light level. In some embodiments, one or more IR emitters 1008 illuminate a room with infrared light for a period of time to facilitate detection of infrared light reflected from objects within the room (e.g. human occupants, animals, surfaces, or the like). In some embodiments, the IR emitters 1008 are modulated synchronously to the sensor assembly 1002 (e.g. a CMOS sensor, or the like) to cancel out the effect of external sources of infrared light. For example, remote controllers, reflections from moving window blinds and/or doors may act as sources of infrared light and/or influence the distribution of infrared light collected by the sensor assembly 1002.

In some embodiments, the device control assembly 110 captures an image with and without the one or more IR emitters 1008 illuminating the space. In this regard, the occupancy detection circuitry 536 may generate a difference image by taking the difference of two acquired images. For example, the difference is taken of two acquired images where one image is taken of the space illuminated by the IR emitters 1008 and the other image was taken without the space being illuminated by the one or more IR emitters 1008. Further, the difference image may provide an image of the room free from variations due to ambient light. In some embodiments, the occupancy detection circuitry 536 may perform image processing to determine a background image (e.g. an image of the unoccupied space) and one or more foreground images that are analyzed to determine occupancy.

Referring generally to FIGS. 12A through 12H, in some embodiments, the occupancy detection circuitry 536 utilizes shape detection to identify one or more objects. In some embodiments, the occupancy detection circuitry 536 performs one or more image processing steps to an image (e.g. an image generated by the sensor assembly 1002, or the like). For example, the occupancy detection circuitry 536 may, but is not limited to, perform image filtering, binarization, edge detection, contour detection, or morphological image processing (e.g. image opening, image closing, or the like). By way of another example, the occupancy detection circuitry 536 may, but is not required to, utilize shape identification algorithms. The occupancy detection circuitry 536 may utilize any shape and/or object identification algorithm known in the art such as, but not limited to, Hough transforms, convolution, differential methods, Fourier Transform-based detection, or blob detection. In some embodiments, the device control assembly 110 utilizes pose detection (e.g. static pose detection, dynamic pose detection, or the like) to identify one or more poses and/or gestures of an identified object. In this regard, the occupancy detection circuitry 536 may identify the orientations of one or more body parts of an occupant such as hands, fingers, arms, legs, head, or the like. For example, the occupancy detection circuitry 536 may generate a wire frame representation of an identified object (e.g. an identified person, or the like) for pose detection in which select body parts are identified as basic shapes and/or lines. In some embodiments, the device control assembly 110 may be controllable through identified poses and/or gestures. In this regard, the occupancy detection circuitry 536 may identify one or more poses and/or gestures and may perform one or more functions (e.g. turning on one or more luminaires, or the like) based on the one or more identified poses and/or gestures.

Figure 12A:
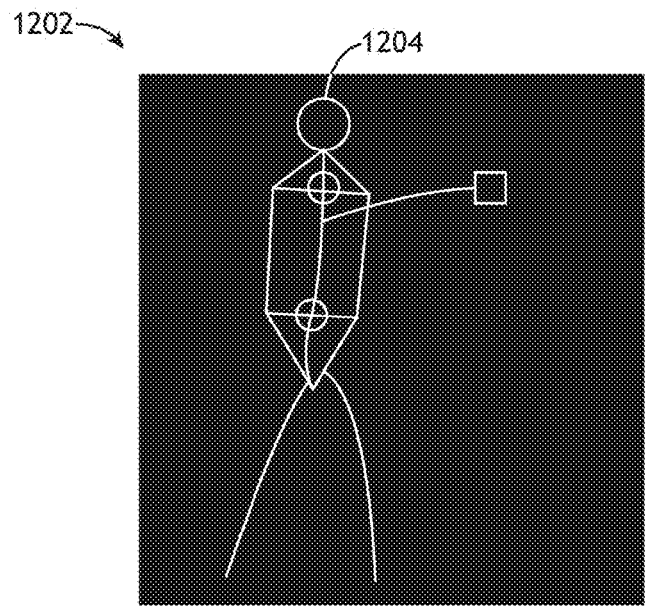
FIG. 12A is a processed image illustrating a wire frame of a person as identified by the occupancy detection circuitry from a static foreground image.
Figure 12B:
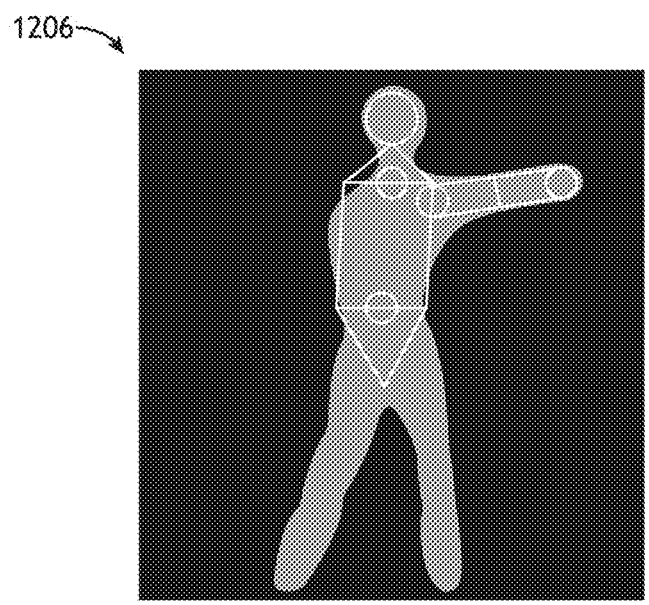
FIG. 12B is a processed image illustrating the wire frame of the identified person as shown in FIG. 12A superimposed over a binarized image of the identified person, in accordance with one or more embodiments of the present disclosure.
Figure 12C:
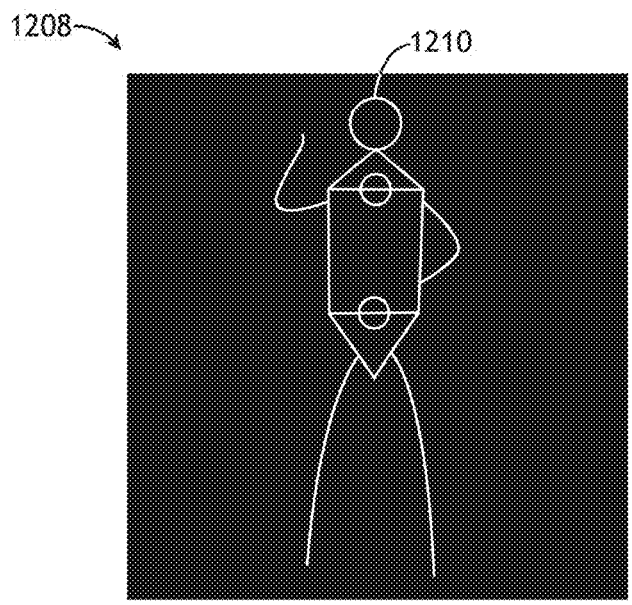
FIG. 12C is a processed image illustrating a wire frame of a person as identified by the occupancy detection circuitry 536 from a static foreground image.
Figure 12D:
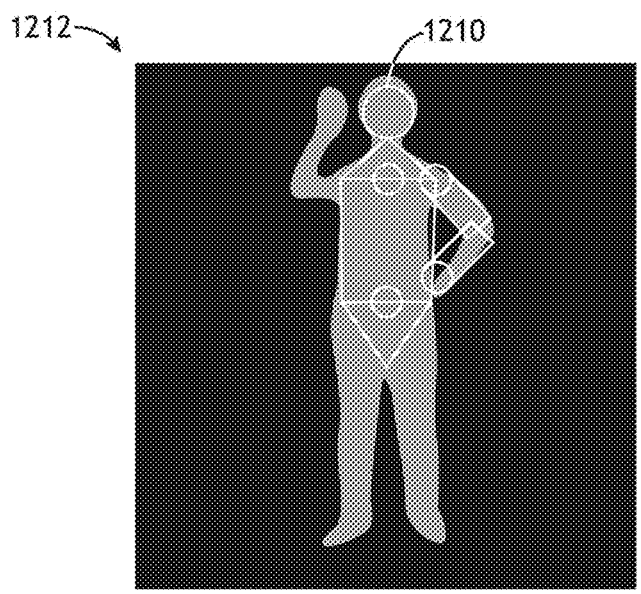
FIG. 12D is a processed image illustrating the wire frame of the identified person shown in FIG. 12C superimposed over a binarized image acquired by the occupancy detection circuitry.
Figure 12E:
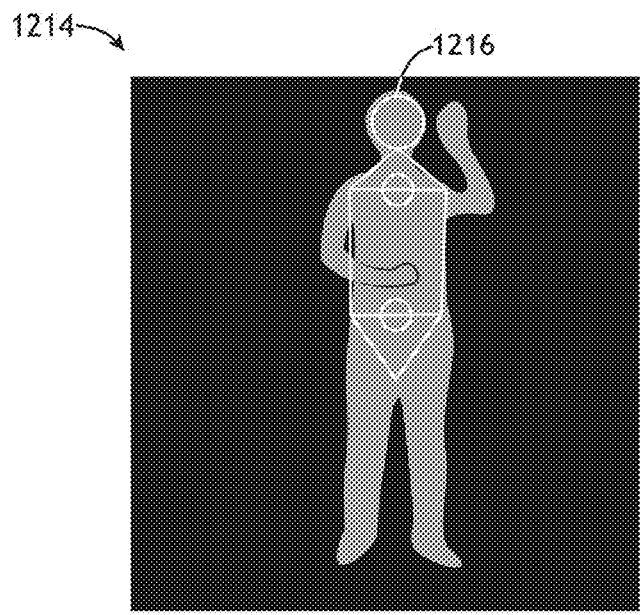
FIG. 12E is a processed image illustrating a wire frame of a person holding an arm in front of his/her body as identified by the occupancy detection circuitry from a static foreground image, in accordance with one or more embodiments of the present disclosure.
Figure 12F:
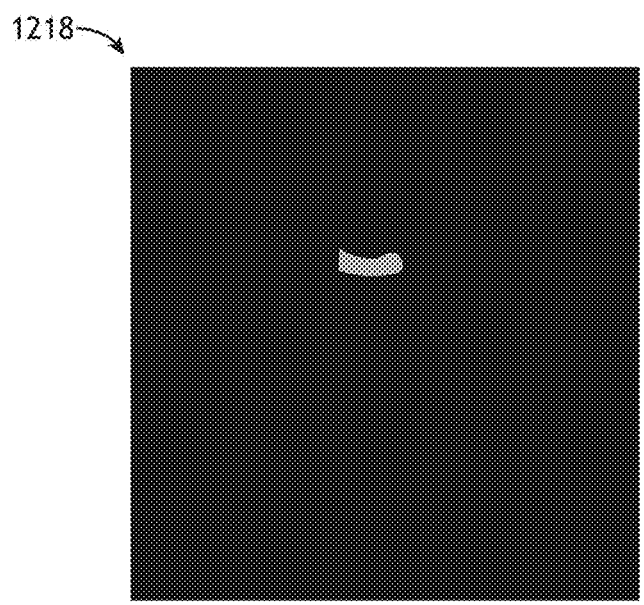
FIG. 12F is a processed image illustrating the location of the arm of FIG. 12E alone, in accordance with one or more embodiments of the present disclosure.
Figure 12G:
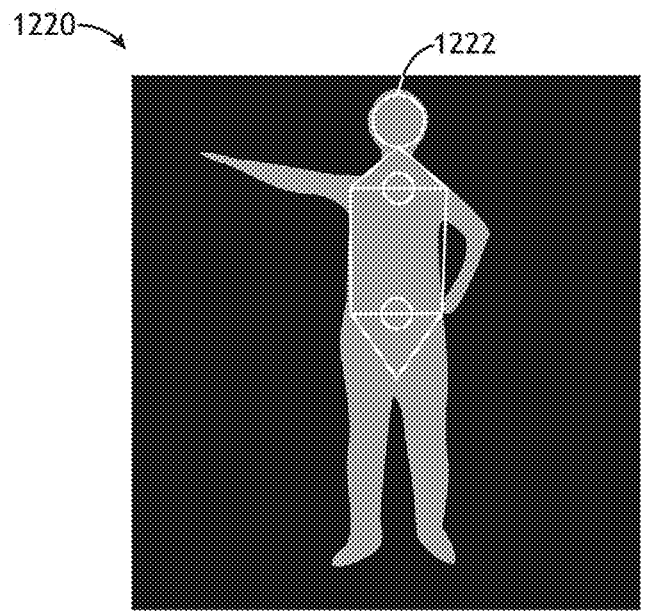
FIG. 12G is a processed image illustrating a wire frame of an identified person superimposed over a binarized image acquired by the occupancy detection circuitry from a static foreground image, in accordance with one or more embodiments of the present disclosure.
Figure 12H:
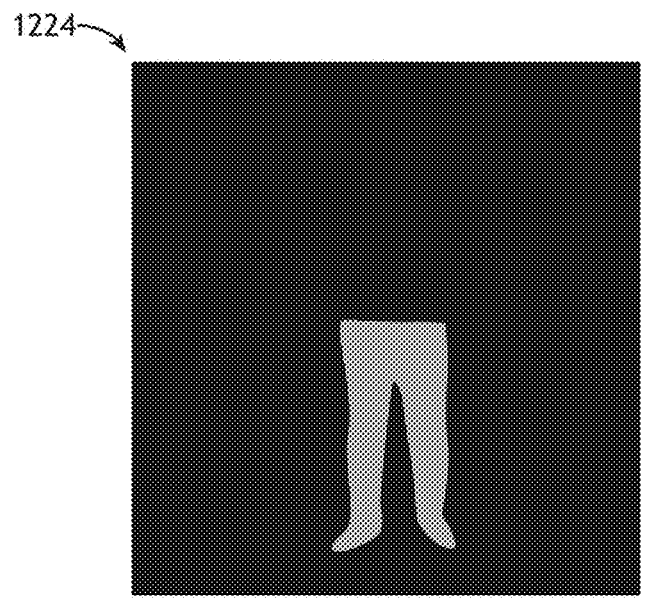
FIG. 12H is a processed image illustrating the position of the legs of the person identified in FIG. 12G, in accordance with one or more embodiments of the present disclosure.

FIG. 12A is a processed image 1202 illustrating a wire frame 1204 of a person as identified by the occupancy detection circuitry 536 from a static foreground image, in accordance with one or more embodiments of the present disclosure. For example, the head may be represented as a circle, a torso may be represented as a series of triangles and rectangles, arms and legs may be represented as lines, and hands may be represented as circles or squares. FIG. 12B is a processed image 1206 the wire frame 1204 of the identified person as shown in FIG. 12A superimposed over a binarized image of the identified person (e.g. acquired by the device control assembly 110), in accordance with one or more embodiments of the present disclosure. For example, FIGS. 12A and 12B may illustrate a pose including an outstretched arm. FIG. 12C is a processed image 1208 illustrating a wire frame 1210 of a person as identified by the occupancy detection circuitry 536 from a static foreground image, in accordance with one or more embodiments of the present disclosure. FIG. 12D is a processed image 1212 illustrating the wire frame 1210 of the identified person shown in FIG. 12C superimposed over a binarized image acquired by the occupancy detection circuitry 536, in accordance with one or more embodiments of the present disclosure. For example, FIGS. 12C and 12D may illustrate a pose indicating a particular orientation of two arms. In some embodiments, the occupancy detection circuitry 536 may distinguish between one or more overlapping body parts of an occupant in an image. FIG. 12E is a processed image 1214 illustrating a wire frame 1216 of a person holding an arm in front of his/her body as identified by the occupancy detection circuitry 536 from a static foreground image, in accordance with one or more embodiments of the present disclosure. FIG. 12F is a processed image 1218 illustrating the location of the arm of FIG. 12E alone, in accordance with one or more embodiments of the present disclosure. FIG. 12G is a processed image 1220 illustrating a wire frame 1222 of an identified person superimposed over a binarized image acquired by the occupancy detection circuitry 536 from a static foreground image, in accordance with one or more embodiments of the present disclosure. FIG. 12H is a processed image 1224 illustrating the position of the legs of the person identified in FIG. 12G, in accordance with one or more embodiments of the present disclosure. In some embodiments, shape and motion detection will be used to identify moving objects. In this regard, the occupancy detection circuitry 536 may discriminate between human occupants and additional objects such as pets, insects, or the like.

In some embodiments, the sensor hardware 534 includes a microphone 522. For example, the microphone 522 may be used to listen to ambient noise in a space to determine occupancy. Further, the occupancy detection circuitry 536 may utilize a combination of audio and visual sensor inputs to determine occupancy.

Figure 13:
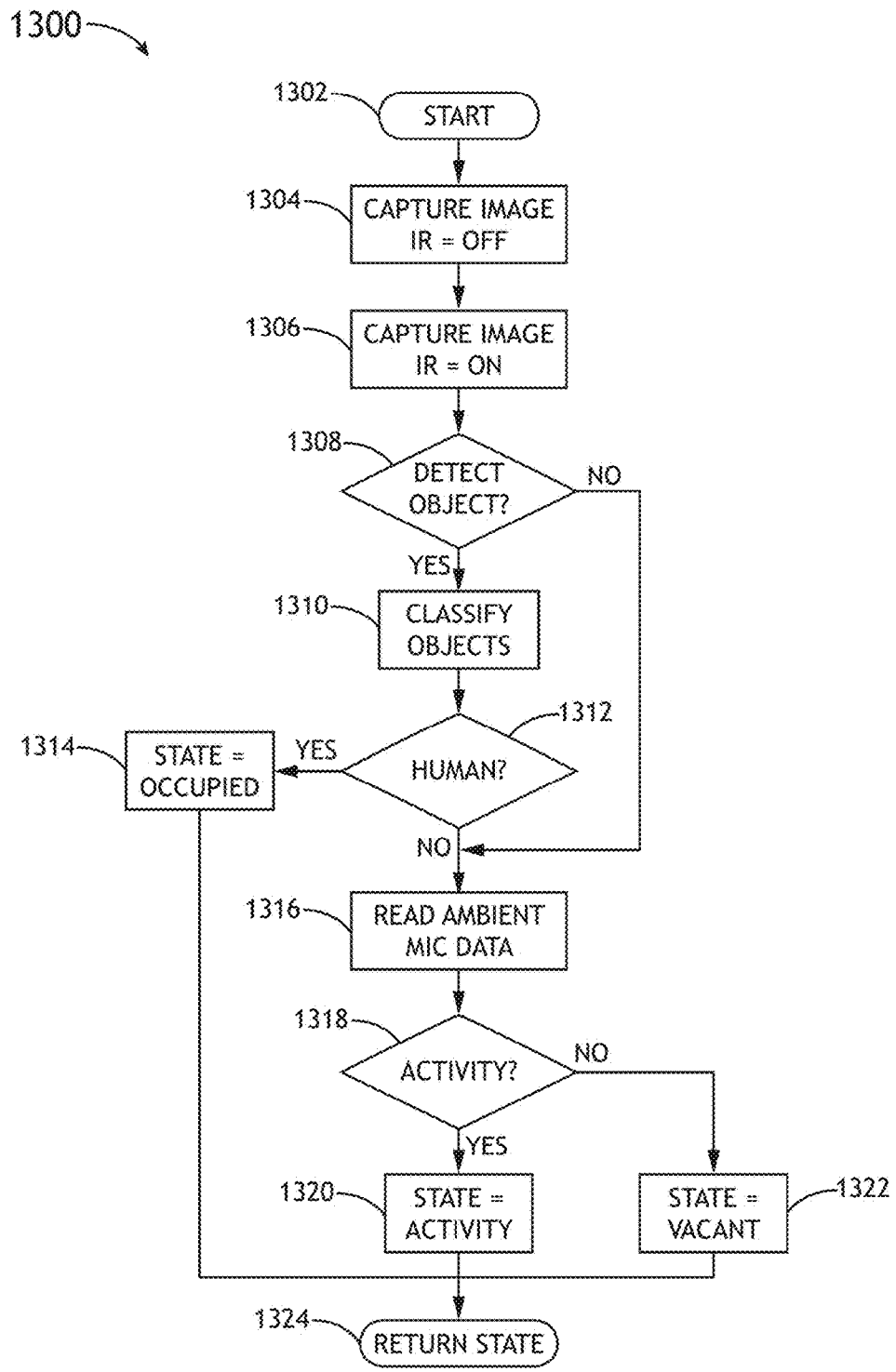
FIG. 13 is a flow diagram illustrating a method for occupancy detection, in accordance with one or more embodiments of the present disclosure.

FIG. 13 is a flow diagram illustrating a method 1300 for occupancy detection, in accordance with one or more embodiments of the present disclosure. Applicant notes that the embodiments and enabling technologies described previously herein in the context of modular control unit 100 should be interpreted to extend to method 1300. It is further noted, however, that the method 1300 is not limited to the architecture of the modular control unit 100.

In some embodiments, a step 1302 includes starting the method. In some embodiments, a step 1304 includes capturing a first image without the use of IR emitters 1008. In some embodiments, a step 1306 includes capturing a second image with IR illumination from one or more IR emitters 1008. In some embodiments, a step 1308 includes detecting one or more objects based on the first and/or the second images. For example, the first image may be subtracted from the second image to generate a difference image (e.g. a static foreground image, or the like). Further, one or more image processing steps may be applied to any image (e.g. the first image, the second image, a difference image, or the like) to facilitate the detection of one or more objects in the image. In some embodiments, a step 1310 includes classifying one or more identified objects. Objects may be classified into any number of classifications such as, but not limited to, human, animal, pet, insect, window, door, furniture, or the like. In some embodiments, a step 1312 includes determining whether any of the one or more identified objects are human. In some embodiments, a step 1314 includes classifying a state of the room as OCCUPIED if one or more humans are identified (e.g. by step 1310). In some embodiments, a step 1316 includes acquiring one or more additional sensor signals to determine ambient conditions in the room if a human is not determined to be in the room (e.g. in steps 1310 and 1312). For example, step 1316 may include reading audio data from a microphone, motion data from a PIR sensor, or the like. In some embodiments, a step 1318 includes determining whether activity is occurring in the room based on an image (e.g. the first image, the second image, a difference image, or the like) and/or audio data from the microphone. In some embodiments, a step 1320 includes classifying the state of the room as ACTIVITY if activity is identified in step 1318. In some embodiments, a step 1322 includes classifying the state of the room as VACANT if activity is not identified in step 1318. In some embodiments, a step 1324 includes providing the state of the room. In some embodiments, occupancy detection circuitry 536 may perform the method 1300 periodically to update the status of the room.

In some embodiments, occupancy detection circuitry 536 may perform biometric authentication of an identified person. The occupancy detection circuitry 536 may provide any method of biometric recognition known in the art. For example, an image provided by the sensor assembly 1002 may be analyzed to provide facial recognition, retinal recognition, fingerprint recognition or the like. By way of another example, a device control assembly 110 may include one or more dedicated biometric sensors for biometric identification of occupants.

In some embodiments, the occupancy detection circuitry 536 detects facial features and authenticates known users of a device control assembly 110. In some embodiments, the facial recognition function is enhanced using the IR emitters 1008 to create shadows on either side of a face.

Figure 14:
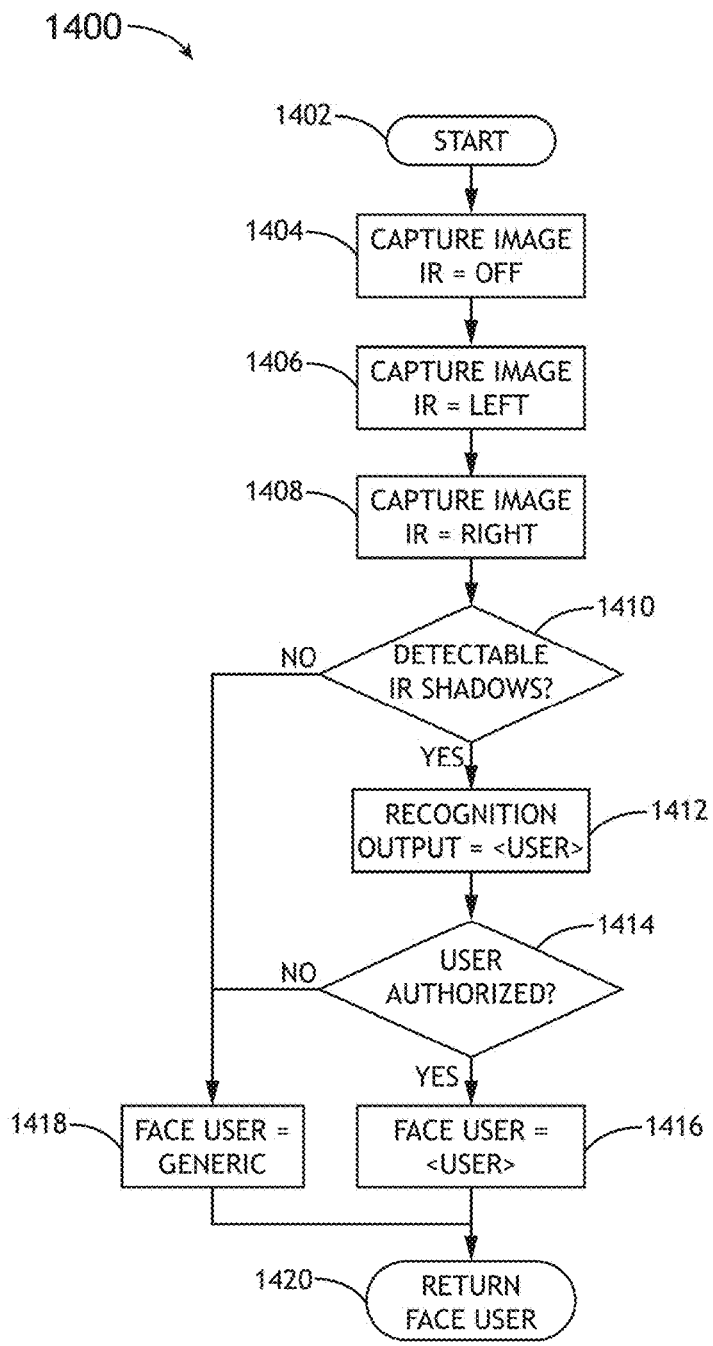
FIG. 14 is a flow diagram illustrating a method for facial detection, in accordance with one or more embodiments of the present disclosure.

FIG. 14 is a flow diagram illustrating a method 1400 for facial detection, in accordance with one or more embodiments of the present disclosure. Applicant notes that the embodiments and enabling technologies described previously herein in the context of modular control unit 100 should be interpreted to extend to method 100. It is further noted, however, that the method 1400 is not limited to the architecture of the modular control unit 100.

In some embodiments, a step 1402 includes starting the method. In some embodiments, a step 1404 includes capturing a first image of a target face without the use of IR emitters 1008. In some embodiments, a step 1406 includes capturing a second image with IR illumination from one or more IR emitters 1008 positioned to illuminate a left side of the target face. In some embodiments, a step 1408 includes capturing a third image with IR illumination from one or more additional IR emitters 1008 positioned to illuminate a right side of the target face. In some embodiments, a step 1410 includes detecting one or more shadows in at least one of the first, second, or third images. For example, occupancy detection circuitry 536 may detect and compare shadows on the target face for no IR illumination, left-side IR illumination, and right-side IR illumination. In this regard, the occupancy detection circuitry 536 may distinguish the presence of a human face from a printed image of a face by characterizing differences in shadows of the first, second, and third images. In some embodiments, a step 1418 includes classifying the target face as GENERIC. In some embodiments, a step 1412 includes performing user recognition. For example, the occupancy detection circuitry 536 may compare any combination of the first, second, or third images with a database of known users. In some embodiments, a step 1414 includes determining whether the target face is associated with a known user (e.g. based on a comparison performed in step 1412 ). In some embodiments, if the target face (e.g. as associated with any combination of the first, second, or third images) does not correspond to a known user, the method may proceed to step 1418 such that the target face is classified as GENERIC. In some embodiments, if the target face (e.g. as associated with any combination of the first, second, or third images) does not correspond to a known user, the method may proceed to step 1416 such that the target face is classified according to a USERNAME such as, but not limited to, a given name, or any type of user identifier known in the art. In some embodiments, a step 1420 includes returning the classification of the target face (e.g. GENERIC, a USERNAME, or the like).

In some embodiments, a device control assembly 110 may determine a distance between itself and another object (e.g. another device control assembly 110, an occupant, a mobile device, or the like). For example, a distance between two objects may be correlated to a ratio of a power of a transmitted signal from a first object and the power of the received signal at the second object. In this regard, a device control assembly 110 may include one or more components (e.g. one or more sensors, one or more radios, or the like) to determine a distance between the device control assembly 110 and an object.

In some embodiments, a device control assembly 110 utilizes triangulation to determine a location of an object with respect to one or more device control assemblies 110 in the network. In this regard, the distance data from multiple device control assemblies 110 with known positions and shared between the multiple device control assemblies 110 may be utilized to determine the location of the object in 3-dimensional space. In some embodiments, the occupancy detection circuitry 536 may utilize location information of one or more objects based on triangulation for occupancy detection.

It is noted herein that a location of an object may be determined using triangulation based on any type of signal known in the art. In some embodiments, a device control assembly 110 may include a depth sensor (e.g. a time of flight sensor, multiple cameras spaced at known distances, or the like) to measure a distance between the device control assembly 110 and the object for a triangulation calculation. In some embodiments, a device control assembly 110 includes radio frequency sensors suitable for detecting the distance between a radio-frequency identification tag (RFID tag) for a triangulation calculation. Accordingly, a location of a person or object with a RFID tag may be determined using triangulation.

In some embodiments, a device control assembly 110 includes one or more Bluetooth radios used as beacons to determine a distance between the device control assembly 110 and a Bluetooth object (e.g. a mobile phone, or the like). Accordingly, a location of a person or object with a Bluetooth device may be determined using triangulation. Further, Bluetooth information provided by the object may be used to determine the identity of an occupant.

Figure 15A:
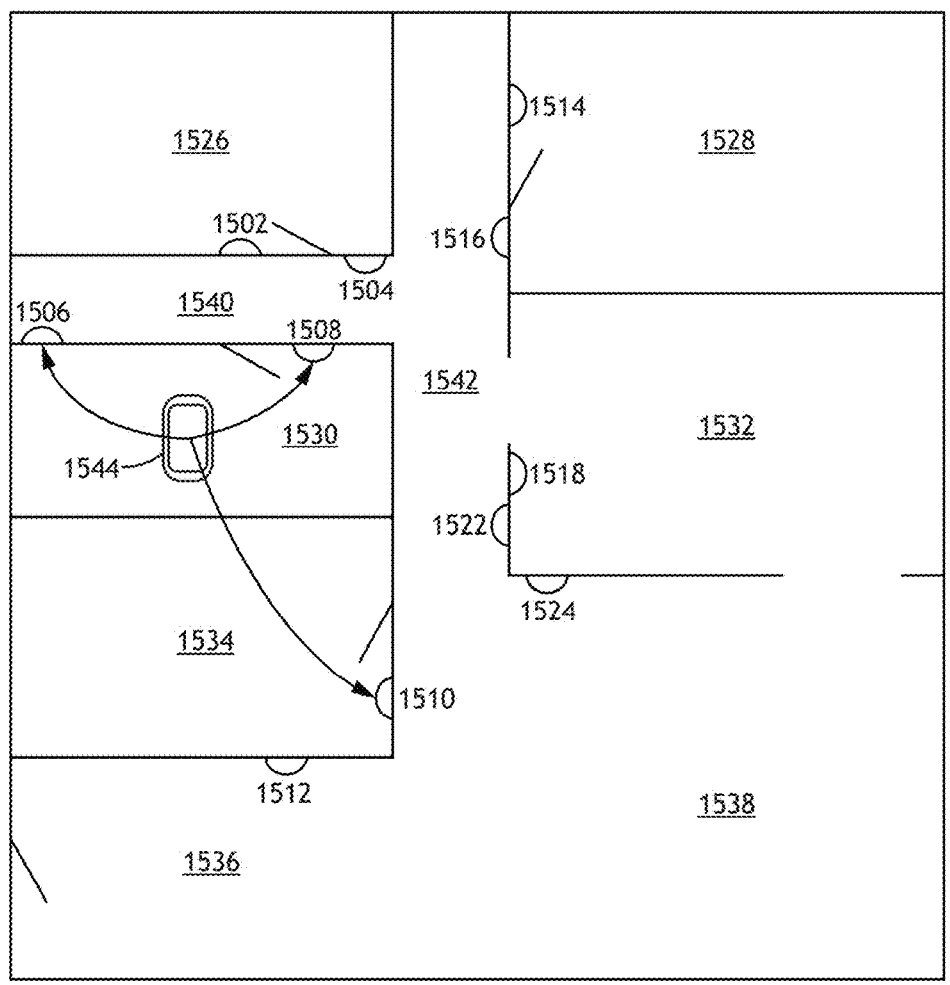
FIG. 15A is a conceptual view of a Bluetooth device (e.g. a mobile phone, or the like) located in a residence locatable via triangulation, in accordance with one or more embodiments of the present disclosure.

FIG. 15A is a conceptual view of a Bluetooth device (e.g. a mobile phone, or the like) located in a residence locatable via triangulation, in accordance with one or more embodiments of the present disclosure. In some embodiments, the residence includes device control assemblies 1502-1524 distributed throughout rooms 1526-1538 and hallways 1540-1542. For example, each device control assembly 1502-1524 may be, but is not required to be, coupled to a backplate (not shown) to form a complete modular control unit (not shown). In some embodiments, as illustrated in FIG. 15, a Bluetooth device 1544 (and potentially a user associated with the Bluetooth device) may be located within room 1530 by triangulation using device control assemblies 1506-1510. In this regard, each device control assembly 1506-1510 may determine the distance between itself and the Bluetooth device 1544 such that the location of the Bluetooth device 1544 may be determined via triangulation. In some embodiments, additional modular control units such as, but not limited to, modular control unit 1502, device control assembly 1504, or device control assembly 1502 may provide additional information to complement and verify the determination of the location of the Bluetooth device.

Figure 15B:
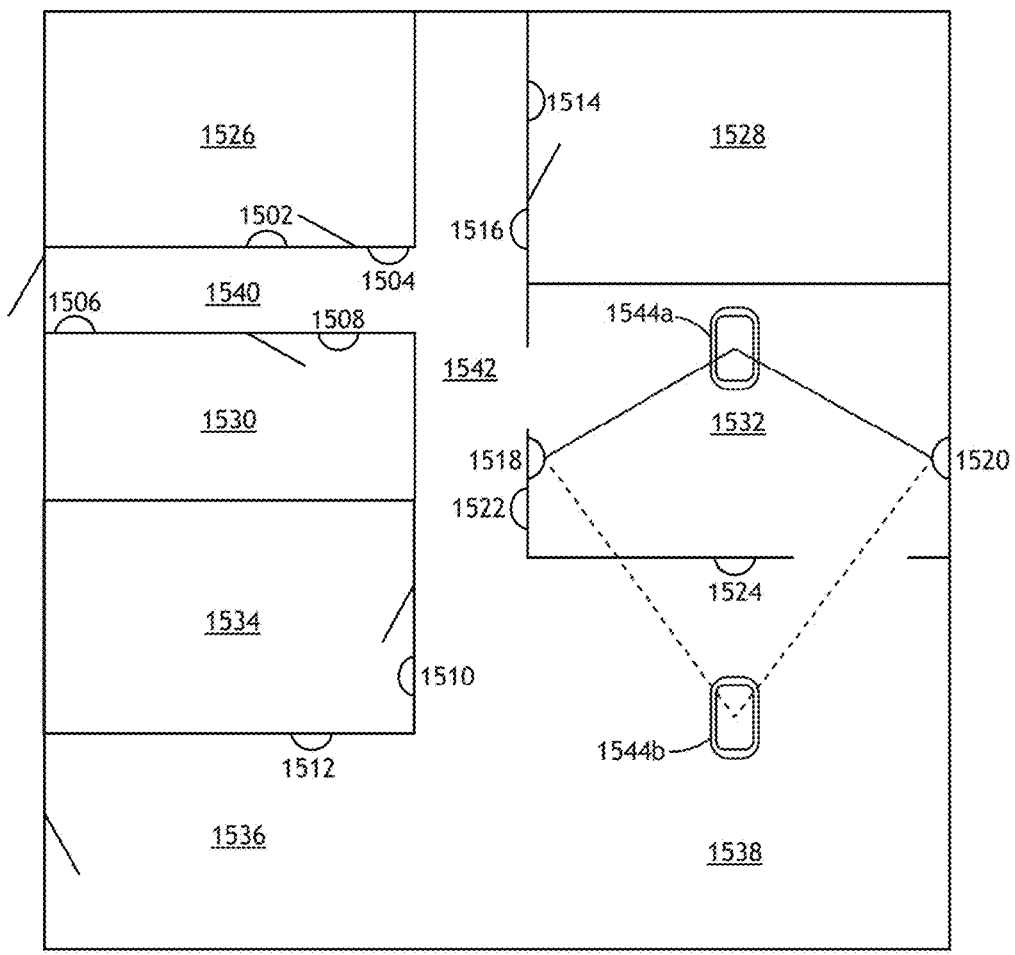
FIG. 15B is a conceptual view of a Bluetooth device (e.g. a mobile phone, or the like) located in a residence locatable via triangulation, in accordance with one or more embodiments of the present disclosure.

In some embodiments, a person, animal, or object carrying a Bluetooth device may be located through a combination of triangulation and triangulation. FIG. 15B is a conceptual view of a Bluetooth device (e.g. a mobile phone, or the like) located in a residence locatable via triangulation, in accordance with one or more embodiments of the present disclosure. In some embodiments, a Bluetooth device 1544 may be located equidistant from device control assemblies 1518-1520. Further, device control assembly 1524 is equidistant from device control assemblies 1518-1520. In this regard, triangulation may not be sufficient to determine whether the Bluetooth device is in room 1532 (e.g. illustrated as 1544a) or room 1538 (e.g. illustrated as 1544b). However, an occupancy sensor associated with any of device control assemblies 1518 -1524 may facilitate an accurate location determination based upon an occupant carrying the Bluetooth device).

In some embodiments, one or more device control assemblies 110 within a network of device control assemblies 110 may track and/or predict the movements of one or more occupants. For example, a single device control assembly 110 may monitor the occupancy within a detection zone proximate to the device control assembly 110. In this regard, a detection zone may define a detection range in which one or more occupants may be detected. In one instance, a detection zone may correspond to a field of view of the sensor assembly 1002 (e.g. as defined by the lens 1004). Further, a network of device control assemblies 110 may have a combined detection zone that includes the detection zones of each of the device control assemblies 110 within the network. It is noted herein that a detection zone of a device control assembly 110 may include an indoor space such as, but not limited to, a portion of a room or an entire room. Further, a detection zone of a device control assembly 110 may include an outdoor space. In this regard, a network of device control assemblies 110 may monitor occupancy in any combination of indoor or outdoor spaces.

In some embodiments, the relative locations of one or more device control assemblies 110 known and are made available to all devices in the network. In this regard, the detection zones of the device control assemblies 110 form a combined detection zone for occupancy detection. In some embodiments, the relative locations of one or more device control assemblies 110 on the network are known relative to a map of physical objects within the detection zones (e.g. a floorplan, or the like). In some embodiments, one or more device control assemblies 110 automatically determine their relative locations. For example, one or more device control assemblies 110 may utilize triangulation based on BLE signals transmitted and received by each other to determine their relative locations. In some embodiments, the locations of one or more device control assemblies 110 are provided by a user. In some embodiments, the relative locations of one or more backplates 130 are known. In this regard, one or more backplates 130, which may be semi-permanently mounted to electrical junction boxes 102, may have fixed positions that may be transmitted to any inserted device control assembly 110. For example, backplates 130 may include circuitry to store and transmit a location (e.g. a location relative to one or more other objects, a location relative to a common map, or the like) to an inserted device control assembly. Further, the locations of one or more backplates 130 may be determined by the backplates 130 themselves (e.g. through triangulation based on transmitted and received signals) or by inserted device control assemblies 110 that may transmit a location to a coupled backplate 130 for future use by the backplate 130 or another device control assembly 110 interchangeably coupled to the backplate 130.

In some embodiments, a device control assembly 110 classifies occupancy within a detection zone according to an occupancy state. For example, an occupancy state of a detection zone may include, but is not limited to, OCCUPIED (e.g. one or more occupants are detected), VACANT (e.g. no occupants are detected), NOISE or ACTIVITY (e.g. one or more actions are occurring).

In some embodiments, an OCCUPIED occupancy state may include an action of one or more occupants such as, but not limited to Enter (N) to describe occupants entering a field of view, Exit (X) to describe occupants exiting the field of view, Stationary (S) to describe occupants standing or sitting in a single place, or, Moving (M) to describe occupants moving throughout the field of view. In some embodiments, an OCCUPIED occupancy state may include a location of one or more occupants within the field of view (e.g. the field of view of the sensor assembly 1002) such as, but not limited to Floor Right (FR) to describe occupants at floor level in a right portion of the field of view, Floor Left (FL) to describe occupants at floor level in a left portion of the field of view, Floor Middle (FM) to describe occupants at floor level in a middle portion of the field of view, Lower Right (LR) to describe occupants in a lower-right portion of the field of view (e.g. on a staircase below a current floor level), Lower Middle (LM) to describe occupants in a lower-middle portion of the field of view, Lower Left (LL) to describe occupants in a lower-left portion of the field of view, Upper Right (UR) to describe occupants in an upper-right portion of the field of view (e.g. on a staircase above a current floor level), Upper Middle (UM) to describe occupants in an upper-middle portion of the field of view, Upper Left (UL) to describe occupants in an upper-right portion of the field of view. Further, an occupancy state may include an action as well as a location of an object. In some embodiments, a NOISE state may include, but is not limited to, Shuffling Feet (SF) to describe footsteps, Television (TV) to describe a television on in the zone, Conversation (TK) Music (MC), or Typing (TP).

For example, an occupancy state corresponding to occupant entering the right field of view of a device control assembly 110 at floor level may be, but is not required to be, described as N-FR. By way of another example, an occupancy state corresponding to occupant exiting an upper-left portion of a field of view of a device control assembly 110 (e.g. by going up a staircase, or the like) may be but is not required to be, described as X-UL. By way of another example, an occupancy state corresponding to occupant moving in an upper-left portion of a field of view of a device control assembly 110 (e.g. by going down a staircase, but remains within the field of view, or the like) may be but is not required to be, described as M-LR. By way of another example, an occupancy state corresponding to occupant stationary within the middle of a field of view of a device control assembly 110 at floor level may be, but is not required to be, described as S-FM. By way of a further example, an occupancy state corresponding to audible shuffling of feet (e.g. footsteps) may be, but is not required to be, described as A-SF.

In some embodiments, an occupancy state generated by a device control assembly 110 includes environmental conditions such as, but not limited to, ambient light values, ambient noise values, temperature, the time of day, the date, or weather information. In this regard, the environmental conditions may provide context for measured occupancy data. In some embodiments, an occupancy state generated by a device control assembly 110 includes an identified user. For example, an occupancy state may include a USERNAME associated with a user identified by facial detection, an identified Bluetooth device, an identified RFID tag, or the like.

Occupancy states generated by a device control assembly 110 in a network may be stored in device on the network such that occupancy states of all device control assemblies 110 within the network may be simultaneously available to any device in the network. In some embodiments, the output data of each device control assembly 110 in the network may be combined into a single frame of system occupancy data representing the occupancy states of all zones of the system. For example, the system occupancy data may be, but is not limited to be, captured at a fixed interval (e.g. 500 ms corresponding to a 2 Hz refresh rate, or the like). In this regard, updated occupancy data of the entire system including, but not limited to, identified users, unidentified users, occupied zones, vacant zones, or active zones may be available to any device in the network.

In some embodiments, the system occupancy data (e.g. occupancy data of one or more individual device control assemblies 110, system occupancy data including occupancy data of all device control assemblies 110, or the like) is stored on one or more devices of the network. In this regard, historical occupancy data may be available to any device on the network. For example, occupancy data may be stored on one or more of the device control assemblies 110 in the network. By way of another example, occupancy data may be stored on a dedicated storage system accessible to one or more devices on the network. By way of a third example, occupancy data may be stored on a device external to the network (e.g. an external server, a cloud-based storage system, or the like).

In some embodiments, occupancy data generated by one or more device control assemblies 110 may be utilized to track the movement of one or more occupants. In some embodiments, occupancy data generated by one or more device control assemblies 110 may be utilized to track one or more patterns of movement of one or more occupants. For example, an occupant may follow one or more routines. In one instance, a user may follow a certain routine on weekday mornings before work, another routine on weekday afternoons upon returning from work, and another routine on Sunday mornings. Accordingly, a network of device control assemblies 110 may track and/or record movements through any zones monitored by the device control assemblies 110.

Figure 16A:
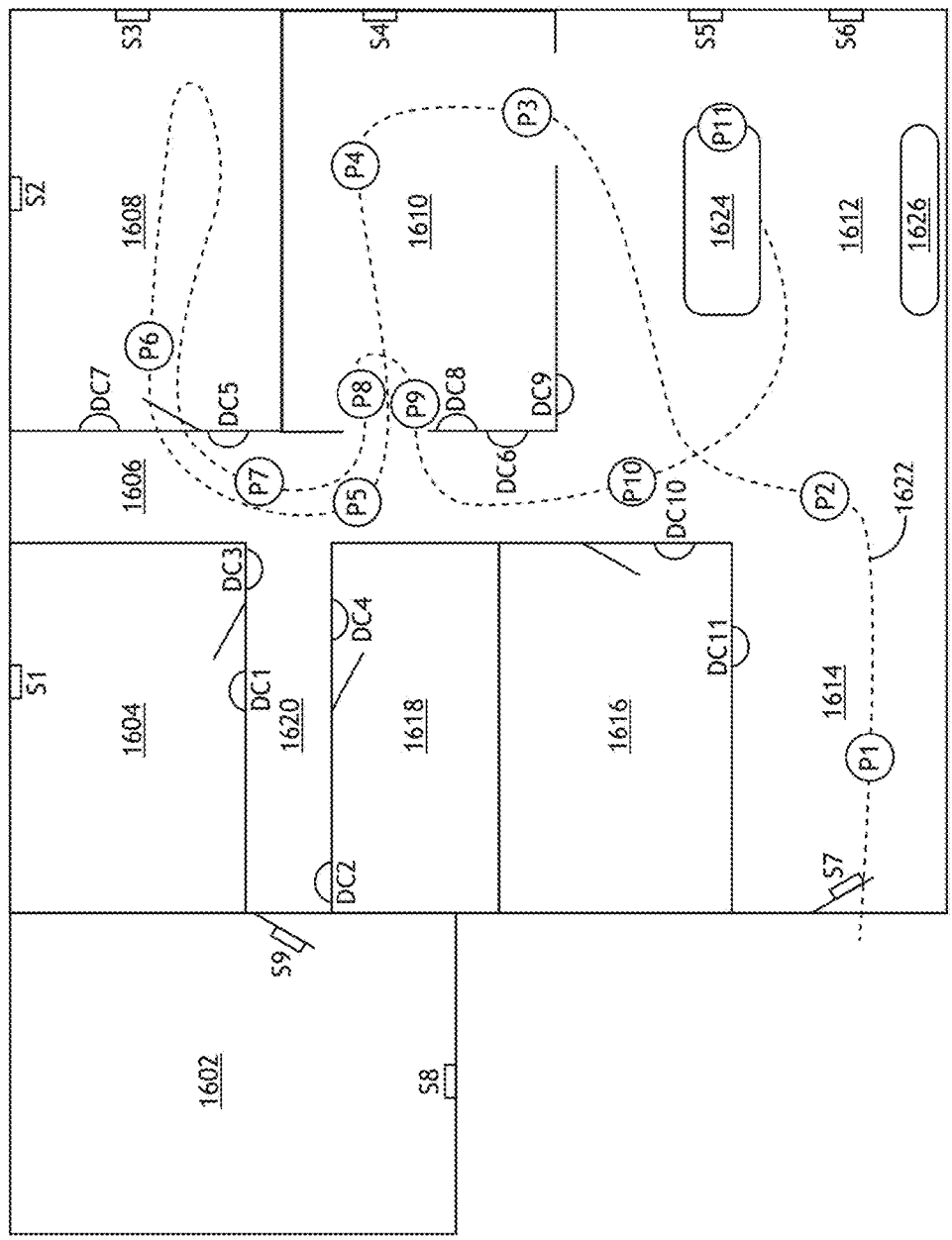
FIG. 16A is a conceptual view of a residence including a network of device control assemblies illustrating a path of a person through the residence, in accordance with one or more embodiments of the present disclosure.

FIG. 16A is a conceptual view of a residence including a network of device control assemblies illustrating a path of a person through the residence, in accordance with one or more embodiments of the present disclosure. In some embodiments, a residence includes garage 1602, Bedroom 2 (BR2) 1604, Hallway 1 (HW1) 1606, Bedroom 1 (BR1) 1608, Kitchen 1610, Living Room (LR) 1612, Entryway 1614, Bathroom 1616, Laundry Room 1618, and Hallway 2 (HW2) 1620. In some embodiments, the residence includes a network of device control assemblies 110 marked as DC1-DC11. For example, in some embodiments, the residence includes sensors marked S1-S9 (e.g. door sensors, window sensors, or the like) integrated into the network of device control assemblies 110. For example, the person may follow the path 1622 (e.g. indicated by the dotted line in FIG. 16A). FIG. 16B is a table including an exemplary description of occupancy data at positions P1-P11 illustrated in FIG. 16A, in accordance with one or more embodiments of the present disclosure. It is noted that occupancy data provided in FIG. 16B may include only a portion of system occupancy data measured by all device control assemblies 110 in the network. In this example, the person returns home from work at the end of a day and follows a typical pathway through the residence. The person may enter through a door including a door sensor S7 indicating that the person has entered the residence. Further, the person may walk through Entryway 1614 and further through the Living Room 1612 to the Kitchen 1610, where the person sets down his/her keys and wallet. The example continues with the person walking from the Kitchen 1610 through Hallway 1 1606 to Bedroom 1 1608 where the person sets down his/her bag. The example continues with the person walking from Bedroom 1 1608 through Hallway 1 1606 to the refrigerator in the Kitchen 1610. The example concludes with the person exiting the Kitchen 1610 and walking through Hallway 1 1606 to a couch 1624 in Living room 1612 and turning on the television 1626.

In some embodiments, occupancy data include a predicted next occupancy state in addition to a current occupancy state. For example, device control assemblies 110 in the network may predict behavioral patterns (e.g. routines, or the like) of one or more occupants based on current and historical occupancy data. For example, occupancy data may indicate that a person in Bedroom 1 1608 wakes up in the morning and exits Bedroom 1 1608, which may be detected by DC7 as occupancy state X-FR. The person may then walk down Hallway 1 1606, which may be detected by DC5 as a series of occupancy states N-FR, M-FM, and X-FL. Predicted occupancy data may include the person entering the Kitchen 1610, which may include a predicted occupancy state of N-FL by DC8. By way of another example, predictive occupancy data may include the person entering the Bathroom 1616, which may include a predicted occupancy state of N-FR by DC10.

In some embodiments, each device control assembly 110 provides a predicted occupancy state based on current and historical occupancy data from all device control assemblies 110 on the network. In some embodiments, at least a portion of the prediction of occupancy states is performed by an additional device on the network (e.g. a controller on the network, a remote server, a cloud-based service, or the like). Predicted occupancy data may be generated using any method known in the art suitable for determining one or more future occupancy states based on current and/or historical occupancy data. For example, predicated occupancy data may be generated using Recursive Bayesian Estimation (RBE). By way of another example, predicated occupancy data may be generated using a Kalman filter with a dynamically-weighted state-transition model (STM) predicted learning algorithm.

In some embodiments, predicted occupancy data may be based on one or more look-up tables. For example, a look-up table may include a series of starting occupancy states and predicted probabilities potential occupancy states for each starting occupancy state (e.g. based on historical occupancy data). In this regard, predicted occupancy data may be generated by matching a current occupancy state with a starting occupancy state in a look-up table and determining which potential occupancy state has the highest predicted probability.

Figure 17A:
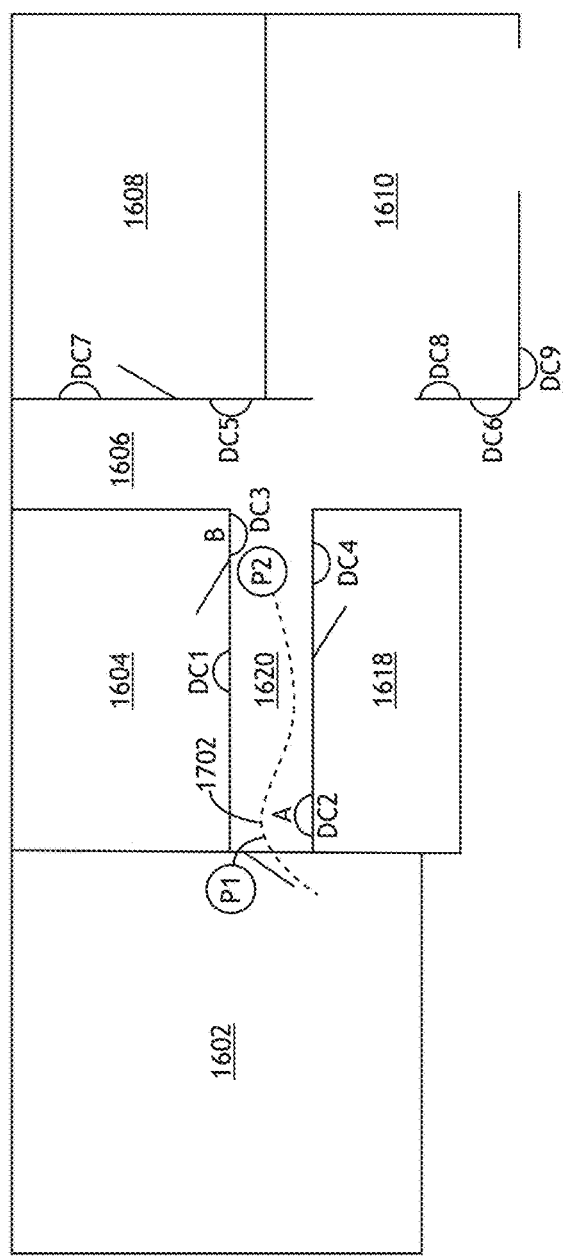
FIG. 17A is a conceptual view of a portion of the residence of FIG. 16A illustrating a path of a person, in accordance with one or more embodiments of the present disclosure.

FIG. 17A is a conceptual view of a portion of the residence of FIG. 16A illustrating a path 1702 of a person, in accordance with one or more embodiments of the present disclosure. For example, a person may enter Hallway 1 1620 from the Garage 1602, at 95 mpm (meters per minute), which may be detected by device control assemblies 110 DC2 and DC3. Further, DC2 and DC3 may generate a velocity vector for the person including the speed and direction of motion. FIG. 17B is a table including an exemplary look-up table for predicting a subsequent occupancy state based on the path 1702 and the associated velocity vector, in accordance with one or more embodiments of the present disclosure.

For example, the first row of FIG. 17B may most closely match the velocity vector for the person. Accordingly, it may be predicted that the person will enter Bedroom 2 1604 with a 10% probability, the Laundry Room 1618 with a 15% probability, Hallway 1 1606 with a 75% probability, and the Garage with a 0% probability. In one instance, a predicted occupancy state may include the person entering Hallway 1 1606, which may be associated with DC5 having a predicted occupancy state of N-FM and DC6 having a predicted occupancy state of N-FR. FIG. 17C is a table including exemplary occupancy states for position P1, P2, and the predicted next state, in accordance with one or more embodiments of the present disclosure.

In some embodiments, predicted probabilities of a look-up table are updated based on the actual next occupancy state as determined by the device control assemblies 110. In this regard, the look-up table may be continually updated. Further, the prediction of occupancy patterns may adapt to changing routines of occupants. FIG. 17D is a table including an updated version of FIG. 17B based on a case in which the user enters Bedroom 2 1604, in accordance with one or more embodiments of the present disclosure. For example, the number of total occurrences of the corresponding row (e.g. row 1 of the data) is increased from 60 to 61 and the number of occurrences of BR2 is increased from 6 to 7. Correspondingly, the probabilities are updated such that the probability of the person entering BR2 under the same conditions in the future may be raised to 11% and the probability of the person entering HW1 under the same conditions in the future is lowered to 74%.

It is to be understood that the exemplary description of determination of occupancy prediction based on look-up tables (e.g. FIGS. 17B-17D) is provided solely for illustrative purposes and should not be interpreted as limiting. For example, a look-up table may include additional data such as, but not limited to, a time of day. In this regard, predicted probabilities in the look-up table may be based at least in part on the time of day. Accordingly, varied behavioral patterns associated with different times of day (e.g. morning, evening, bedtime, or the like) may be accommodated in the prediction of occupancy. By way of another example, a look-up table may include additional data such as, but not limited to, a day of the week. In this regard, predicted probabilities in the look-up table may be based at least in part on the day of the week. Accordingly, varied behavioral patterns associated with the day of the week (e.g. specific days, weekends, weekdays, holidays, or the like) may be accommodated in the prediction of occupancy. By way of another example, a look-up table may include additional data such as, but not limited to, usernames associated with one or more identified users. In this regard, predicted probabilities in the look-up table may be based at least in part on the identity of the person. Accordingly, the prediction of occupancy states may accommodate different routines by different identified users. Further, the prediction of occupancy states may be based on the number of occupants. For example, a person may tend to follow certain routines when in the residence alone, but may follow different routines when one or more additional people are present.

In some embodiments, occupancy prediction may be based on a sequence of past occupancy states. For example, FIGS. 17B-17D illustrated occupancy prediction based on the current occupancy state (e.g. current system occupancy data associated with one or more device control assemblies 110). By way of another example, occupancy prediction (e.g. predicted probabilities of entering certain rooms found in a look-up table, or the like) may be based on the current occupancy state as well as one or more previous occupancy states. In this regard, occupancy prediction may accommodate routines in which a person travels through a particular sequence of rooms in a particular order (e.g. the routine illustrated in FIG. 16A, or the like).

In some embodiments, a network of device control assemblies 110 incorporating occupancy prediction further includes one or more load devices (e.g. as illustrated in FIG. 7, or the like). For example, the network may include a luminary, security system or other appliance that performs a service for a person (e.g. plays music through a speaker, or the like). Further, device control assemblies 110 in the network may automatically actuate one or more load devices based on current and/or predicted values of system occupancy data. Accordingly, device control assemblies 110 may automatically actuate one or more load devices based on learned routines associated with one or more users. In one instance, upon entering a residence, one or more device control assemblies 110 may predict that the person will enter one or more specific rooms based on historical occupancy data and actuate load devices (e.g. luminaires, fans, blinds, or the like) in the one or more specific rooms prior to the person entering those rooms.

Figure 18A:
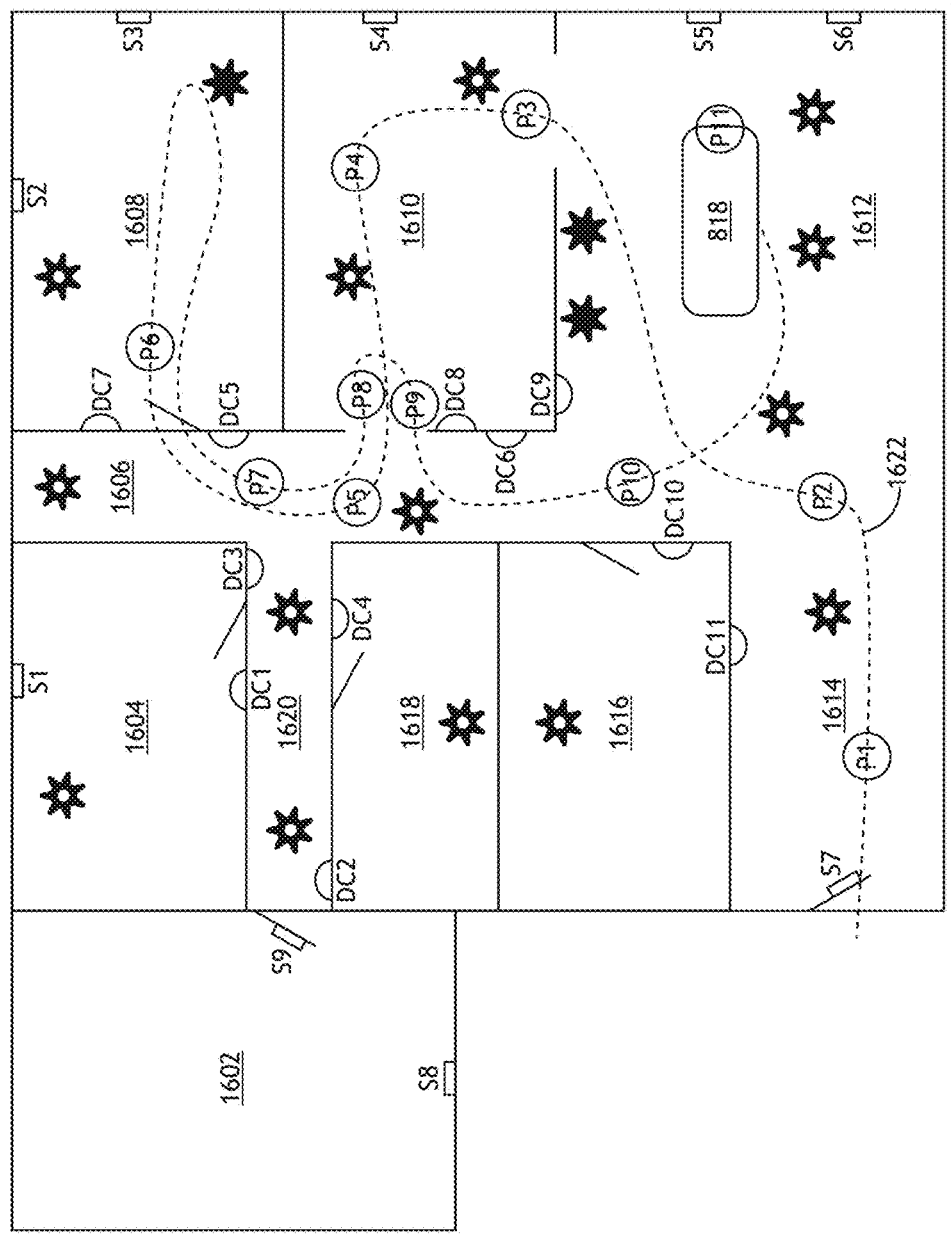
FIG. 18A is a conceptual view of a residence including a network of device control assemblies and luminaires illustrating a path of a person through the residence, in accordance with one or more embodiments of the present disclosure.

FIG. 18A is a conceptual view of a residence including a network of device control assemblies and luminaires illustrating a path of a person through the residence, in accordance with one or more embodiments of the present disclosure. For example, FIG. 18A corresponds to FIG. 16A with the addition of luminaires on the network to illustrate how occupancy data (e.g. generated by one or more device control assemblies 110 on the network, a separate controller on the network, an external server, a cloud-based service, or the like) may be applied to a lighting system. In some embodiments, luminaires electrically connected to the wiring system of the residence via a junction box (e.g. wired lighting) are illustrated with an open starburst icon in FIG. 18A. In some embodiments, luminaires electrically connected to an outlet (e.g. lamps, or the like) are illustrated with a closed (solid) starburst icon in FIG. 18A. In one instance, one or more device control assemblies 110 may turn on luminaires in the Entryway 1614, the Living Room 1612, and the Kitchen 1610 upon detecting a person entering the residence (e.g. via any combination of sensor S7, device control assembly DC11, or the like). Further, one or more device control assemblies 110 may turn off luminaires in the Entryway 1614 and the Living Room 1612 upon the person entering the Kitchen 1610. In another instance, one or more device control assemblies 110 may turn on luminaires in Bedroom 1 1608 upon the person exiting the Kitchen 1610. Further, the device control assemblies 110 may leave the luminaires in the Kitchen on in anticipation of the person returning to the Kitchen (e.g. in P8 of path 1622). In another instance, one or more device control assemblies 110 may turn off luminaires in Bedroom 1 1608 and the Kitchen 1610 and turn on luminaires in the Living Room 1612 upon the user exiting Kitchen 1610.

In some embodiments, one or more device control assemblies 110 may actuate loads based on a timer. For example, one or more device control assemblies 110 may turn on luminaires when occupancy is detected and may start a timer when occupancy is no longer detected (e.g. when a person exits a zone monitored by a device control assembly 110). Further, the device control assemblies 110 may turn off the luminaires when the timer expires if no further occupancy is detected within this time. In one instance, electrical loads in a room (e.g. luminaires, fans, appliances, or the like) may be turned off when a timer reaches 5 minutes of recorded inactivity or no occupants have been present in a room for 3 minutes. FIGS. 18B-1 and 18B-2 are two portions of a table including occupancy data illustrating the behavior of luminaires under control (LUC) in select rooms of FIG. 18A according to one exemplary embodiment, in accordance with one or more embodiments of the present disclosure. It is also noted herein that the table in FIGS. 18B-2 and 18B-2 additionally indicates the state of luminaires based on a three-minute timer.

FIG. 18C is a table including occupancy data associated with a predictive lighting system incorporating predictive occupancy data, according to another exemplary embodiment, in accordance with one or more embodiments of the present disclosure. For example, states of luminaires under control (LUC) generated based on predicted occupancy data are shaded in gray in the table of FIG. 18C. In some embodiments, one or more device control assemblies 110 actuate one or more load devices on the network based on environmental conditions. For example, a brightness of luminaires under control may be adjusted based on an ambient light level ambient temperature, time of day, latitude, longitude, or day of the year. Environmental conditions may be monitored by device control assemblies 110, additional sensors, on the network, or the like. For instance, in the example illustrated in FIG. 18C, consider that it is 6:00 pm PDT on January $10^{th}$ at 48° north latitude 122° west longitude. Now continuing this instance, consider that before a person enters Bedroom 1 1608, the ambient light level in Hallway 1 1606 and Bedroom 1 1608, the temperature in Bedroom 1 1608 is measured, and the position of the sun is determined (e.g. via a database, determined from an external server, or the like). In some embodiments, one or more device control assemblies 110 calculate a lighting level based on the environmental conditions as well as the past behavior of one or more occupants. For example, a lighting level at 1PM on a bright summer day may be 0% such that the lights do not turn on.

Figure 19:
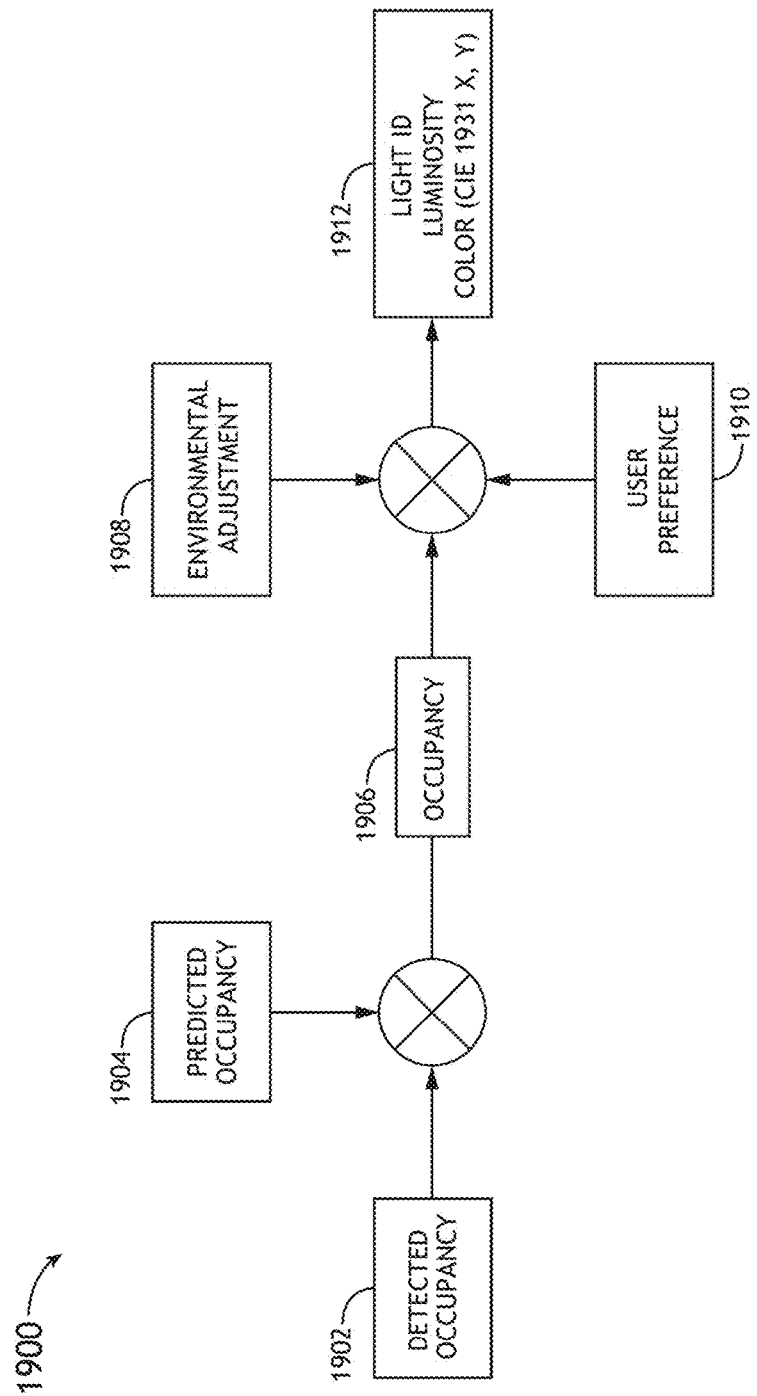
FIG. 19 is a flow diagram illustrating a method for the automatic adjustment of a lighting level based on occupancy and environmental conditions, in accordance with one or more embodiments of the present disclosure.

FIG. 19 is a flow diagram illustrating a method 1900 for the automatic adjustment of a lighting level based on occupancy and environmental conditions, in accordance with one or more embodiments of the present disclosure. Applicant notes that the embodiments and enabling technologies described previously herein in the context of modular control unit 100 should be interpreted to extend to method 1900. It is further noted, however, that the method 1900 is not limited to the architecture of the modular control unit 100.

In some embodiments, a step 1902 includes detecting occupancy of one or more zones (e.g. via one or more device control assemblies 110, or the like). In some embodiments, a step 1904 includes predicting the occupancy of one or more zones. For example, occupancy may be predicted via a look-up table utilizing historical occupancy data. In some embodiments, a step 1906 includes defining the occupancy of one or more zones based on the detected and predicted occupancy of steps 1902 and 1904. In some embodiments, a step 1908 includes determining an environmental adjustment to one or more luminaires in zones associated with the occupancy of step 1906. For example, environmental conditions such as, but not limited to, ambient light level, weather conditions, indoor ambient temperature, position of the sun, or time of day may be utilized to determine an adjusted lighting level. In some embodiments, a step 1910 includes determining a user preference for a lighting level. For example, user preference may include, but are not limited to, manual override of a light level, default preferences, or preselected preferences associated with an identified user. In some embodiments, a step 1912 includes setting the light level of the one or more luminaires associated with the occupancy of step 1906. For example, a lighting level may include, but is not limited to, a brightness level or a luminosity color (e.g. CIE 1931 coordinates, or the like).

In some embodiments, one or more device control assemblies 110 are capable of controlling blinds and façade to actively manage lighting and temperature based on occupancy. For example, a window exposure to the sun most of the day during the summer may increase the temperature inside a house. In some embodiments, one or more device control assemblies 110 may close the blinds and/or façade when no occupants are detected and open the blinds and/or façade when occupants are detected. In some embodiments, the one or more device control assemblies 110 may control the blinds and/or façade based on user behavior. For example, if an occupant opens a window, one or more device control assemblies 110 may close select blinds to block out the sun.

In some embodiments, the device control assembly 110 may be controlled via voice commands. For example, a user may provide one or more voice commands to initiate one or more functions of a device control assembly 110 such as, but not limited to, actuating a load.

In some embodiments, the device control assembly 110 performs voice recognition and command interpretation operations. For example, the device control assembly 110 may utilize speaker-independent speech recognition software to translate spoken words into text strings that may be interpreted as commands. By way of another example, the device control assembly 110 utilizes automatic speech recognition software (e.g. CMU Sphinx, or the like) to recognize speech. In some embodiments, the device control assembly 110 utilizes deep neural network (DNN) approaches to recognize speech.

In some embodiments, a device control assembly 110 records voice commands and sends them to a predetermined voice service for processing. The voice service may be any voice service known in the art suitable for performing speech recognition and/or command interpretation based on the recognized speech. For example, a voice service may include a controller on the network of device control assemblies 110. By way of another example, the voice service may include a controller (e.g. a server, or the like) located on an external network. By way of a further example, a voice service may include a third-party service such as, but not limited to, Siri, Cortana or Alexa.

In some embodiments, a device control assembly 110 may listen for a keyword such as, but not limited to, "Deako," and then initiate voice recognition and command interpretation (e.g. locally or via a voice service) for audio signals following the keyword. It is noted herein that longer keywords may be easier for speech recognition systems to identify which results in fewer missed commands. In some embodiments, a keyword verbally spoken is the sole action of the command. For example, a multiword, specific command, such as "Deako Toggle Lights" may be defined to achieve a simplified interface and accurate speech recognition. For instance, each time "Deako Toggle Lights" is identified by the device control assembly 110, the state of the lights may be toggled. In this regard, if the keyword "Deako Toggle Lights" is identified by the device control assembly 110 and the lights were on, the device control assembly 110 may turn the lights off. Similarly, if the keyword "Deako Toggle Lights" is identified by the device control assembly 110 and the lights were off, the device control assembly 110 would turn the lights on. In some embodiments, if connected load devices are dimmed, the dimming level may be maintained when the devices are turned back on.

In some embodiments, a voice command may be paired with a gesture to specify a specific function. For example, the keyword "Deako Toggle Lights" together with a pose or gesture detected by the device control assembly 110 may identify a select group of luminaires to actuate.

Figure 20:
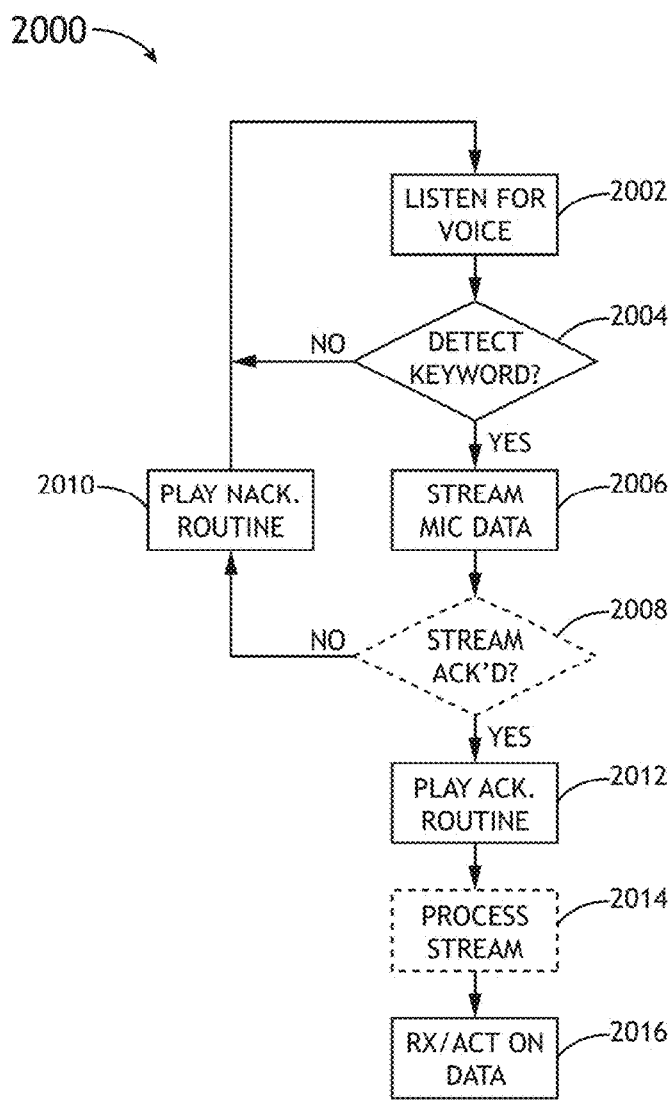
FIG. 20 is a flow diagram illustrating a method for notifying a user whether a voice stream process request was received and accepted, in accordance with one or more embodiments of the present disclosure.

In some embodiments, a voice service receives the voice stream, processes the request, and acknowledges receipt of the stream. FIG. 20 is a flow chart illustrating a method 2000 for notifying a user whether a voice stream process request was received and accepted, in accordance with one or more embodiments of the present disclosure. Applicant notes that the embodiments and enabling technologies described previously herein in the context of modular control unit 100 should be interpreted to extend to method 100. It is further noted, however, that the method 2000 is not limited to the architecture of the modular control unit 100.

In some embodiments, a step 2002 includes listening for voice. For example, a device control assembly 110 may include a microphone for monitoring audio signals. In some embodiments, a step 2004 includes detecting a keyword. For example, a device control assembly 110 may continuously monitor audio signals received by the microphone and scan for a keyword (e.g. "Deako," or the like). In some embodiments, if a keyword is detected, a step 2006 includes streaming audio data captured by the microphone to the voice service. In this regard, audio data following the keyword may be captured by the microphone may be sent to the voice service. In some embodiments, a step 2008 includes detecting whether the audio stream was acknowledged by the voice service. In some embodiments, if the audio stream is not acknowledged by the voice service (e.g. in response to a transmission error, or the like), a step 2010 includes initiating a no-acknowledged (Nack) routine. For example, the device control assembly 110 may, but it not required to, play an audio tone, or flash a light (e.g. a red LED). In some embodiments, if the audio stream is acknowledged by the voice serve, step 2012 includes initiating an acknowledgement routine. For example, the device control assembly 110 may, but it not required to, play an audio tone, or flash a light (e.g. a green LED). In some embodiments, the voice service streams back a voice response played by the device control assembly 110. In some embodiments, a step 2014 including processing a response from the voice service. For example, the device control assembly 110 may decode a command packet to generate a response to the user command. In some embodiments, a step 2016 includes initiating a response to the user command. For example, the device control assembly 110 may actuate a load in response to a voice command from a user.

In some embodiments, a network of device control assemblies 110 may provide one-way or multi-directional communication of audio and/or video signals. In this regard, a network of device control assemblies 110 may function as a multi-directional intercom (e.g. an audio intercom, a video intercom, or the like).

In some embodiments, the command interface of the intercom includes at least one of voice commands, a control panel, a mobile phone, or a universal remote. In some embodiments, an intercom "call" from one device control assembly 110 to another can be initiated by pressing a pre-defined part of the touch-sensitive input device 510. In some embodiments, an intercom "call" from one device control assembly 110 to another can be initiated by stating a voice command. For example, stating the voice command "Deako call rooms" may initiate an intercom accessible to any device control assembly 110 on the network. In some embodiments, an intercom could be established through a device application connected either wirelessly or by wireline to a device control assembly 110. Similarly, in some embodiments, a "call" may be terminated by pressing a pre-defined part of the touch-sensitive input device 510, through a voice command, or the like. Further, a mobile device may initiate and/or send requests for the network of device control assemblies 110 to control a load (e.g. a luminaire, an appliance that performs a service such as playing music, or the like).

In some embodiments, once a "call" is initiated at an initiating device control assembly 110, the device control assembly 110 digitizes input signals (e.g. audio input signals captured by a microphone, images and/or videos captured by sensor hardware 534, or the like) and sends a communication stream including the digitized input signals to one or more additional device control assemblies 110 on the network.

In some embodiments, the communication stream is available to all device control assemblies 110 in the network. Further, each device control assembly 110 on the network may decode the communication stream and broadcast the audio and/or video signals on a microphone and/or display device. In this regard, a device control assembly 110 that broadcasts data from a communication stream may be participating in a multi-device "call." Additionally, each device control assembly 110 on the "call" may provide audio and/or video as part of the communication stream to provide multi-directional communication between all device control assemblies 110.

In some embodiments, the network of device control assemblies 110 utilizes occupancy data (e.g. detected using the network of device control assemblies 110) to determine which device control assemblies 110 should broadcast the data from the communication stream. For example, data from the communication stream may be broadcast only in occupied rooms. By way of another example, data from the communication stream may be broadcast in rooms in which one or more luminaires are turned on.

Figure 21:
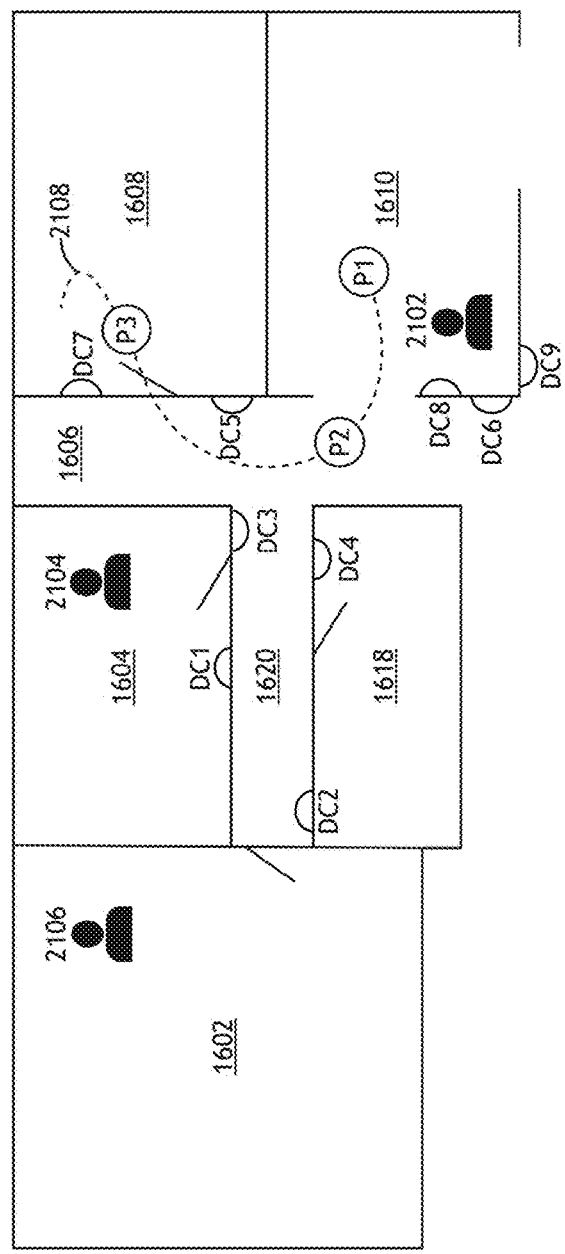
FIG. 21 is a conceptual view of a residence including a network of device control assemblies illustrating an occupancy-based communication system, in accordance with one or more embodiments of the present disclosure.

FIG. 21 is a conceptual view of a residence including a network of device control assemblies illustrating an occupancy-based communication system, in accordance with one or more embodiments of the present disclosure. For example, FIG. 21 may include a portion of the network illustrated in FIG. 16A. In one instance, a person 2102 is in the Kitchen 1610 and initiates occupancy-based communication on DC8 to alert person 2104 and person 2106. In this regard, device control assembly 110 DC1 detects the presence of person 2104 in Bedroom 2 1604 and DC4 detects the presence of person 2106 in the Laundry Room 1618. Further, all device control assemblies 110 may be alerted to the message, but only DC1 in Bedroom 2 1604 and DC4 in the laundry room participate in the "call." In some embodiments, DC1 notifies person 2104 and person 2106 of an intercom message by actuating the lights in Bedroom 2 1604 and the Laundry Room 1618 a pre-defined pattern. For example, DC1 may pulse or temporarily modify the color the lights in Bedroom 2 1604 and the Laundry Room 1618. By way of another example, DC1 or DC4 may produce an audible noise (e.g. a ringtone, or the like) to notify person 2104 and person 2106. In some embodiments, receiving device control assemblies 110 may automatically accept the "call" and broadcast data from the communication stream. Further, receiving device control assemblies 110 may automatically provide audio and/or video data to the communication stream. In some embodiments, receiving device control assemblies 110 may require manual acceptance of the "call" and/or manual approval to provide audio and/or video to the communication stream.

Further, a device control assembly 110 in an unoccupied room may display a notification (e.g. a blinking LED, a message on a display device 530, or the like). In this regard, the device control assembly 110 in the unoccupied room may join the "call" (e.g. if an occupant walks into the room).

In some embodiments, a user (e.g. any of people 2102-2106) may freely walk between rooms having device control assemblies 110 and maintain an active connection to the "call." In this regard, a network of device control assemblies 110 including occupancy-detection may track a user on a multi-directional communication "call" and dynamically determine which device control assembly 110 to associated with the user (e.g. to receive audio and/or video from the user as well as to broadcast data from the communication stream). For example, person 2102 may follow path 2108 and maintain an active intercom connection based on the room he/she is in at any given moment. In one instance, the DC8 may initially detect person 2102 at point P1 and later detect at point P2 that person 2102 has left the Kitchen 1610. Further, DC5 and DC6 may detect that person 2102 is in Hallway 1 1606. Accordingly, DC5 may become the active device control assembly 110, streaming the voice of person 2102 to DC 1 and DC4. When person 2102 enters Bedroom 1 1608, DC7 may become the active device control assembly 110 at point P3.

In some embodiments, a device control assembly 110 may initiate a "call" with one or more identified users based on occupancy data. For example, a user may use a voice command "Deako Call Dave" to initiate a "call" with Dave. In this regard, if Dave is in a space monitored by a device control assembly 110, a device control assembly 110 near Dave will notify Dave of an incoming "call".

In some embodiments, one or more device control assemblies 110 may connect to a mobile device to extend a "call" to a user outside of the house. In this regard, if Dave is in a space not monitored by a device control assembly 110, a device control assembly 110 in the network may initiate a call to Dave's mobile phone (e.g. using a pre-determined number associated with Dave in the system, or the like). Additionally, a device control assembly 110 may connect to a mobile device such that the mobile device may be within the network. Accordingly, a device control assembly 110 may operate as a "hand-free" speakerphone.

In some embodiments, one or more device control assemblies 110 may operate as wireless repeaters for a device connected to the network. For example, device control assemblies 110 may operate as Bluetooth repeaters. In this regard, the range of a mobile phone, a Bluetooth headset, or the like, may be extended through the network of device control assemblies 110.

In some embodiments, a network of device control assemblies 110 may provide surveillance and/or security features. For example, an audio/video stream generated by a device control assembly 110 may be broadcast to any other device control assembly 110, to a mobile phone, to an external controller (e.g. as a live stream on the internet), or recorded. In one instance, a device control assembly 110 may function as an audio and/or video baby monitor and transmit and audio and/or video feed to a mobile phone. In some embodiments, a network of device control assemblies 110 is used with a security system controller as a security system.

In some embodiments, a network terminal may access an audio/video stream from any device control assembly 110 on the network. For example, a network terminal may include one or more computers, mobile phones, video watches, tablets, televisions or headsets.

In some embodiments, occupancy data may be coupled to the video stream allowing pre-defined periods of time to be recorded. For example, if a person routinely leaves and returns to a house at certain times a video stream could be recorded by one or more device control assemblies 110 during this period of non-occupancy as surveillance footage. In some embodiments, a device control assembly 110 uses facial recognition to classify all occupants as authorized or unknown users. Further, a network of device control assemblies 110 may provide occupancy detection to track the locations each occupant. In some embodiments, a terminal coupled to a network of device control assemblies 110 may be alerted to a new entrant and provide an image of the new entrant. Further, the terminal may be provided a choice about how to respond to a new entrant. For example, if a new entrant is known, an intercom connection to the entrant may be initiated or the entrant may be granted access to the premises. By way of another example, if a new entrant is unknown, an alert may be sent to a designated user, group of users, or the police. Further, an option may be provided to set off an alarm or greet the new entrant. Additionally, an option may be provided to welcome the new entrant by actuating one or more luminaires, shades, or appliances that perform a service.

In some embodiments, a network of occupancy sensor assembly systems includes entry sensors that monitor entry through windows and doors. For example, an entry sensor (e.g. a door sensor, a window sensor, or the like) may include a battery, sensing hardware, and a BLE radio. In some embodiments, the entry sensor includes an accelerometer and a magnetic sensor. In some embodiments, the accelerometer detects motion. In some embodiments, the magnetic sensor detects the state of the window and/or door. In some embodiments, the magnetic sensor detects whether a window is locked. For example, the magnetic sensor may be placed sufficiently proximate to a locking mechanism having a piece of magnetic tape on a portion of the locking mechanism such that the sensor may detect whether the lock is engaged. In some embodiments, the magnetic sensor detects whether a door is open or closed. Further, entry sensors may be coupled with the network of device control assemblies 110 using any method known in the art. For example, entry sensors may be coupled to a device control assembly 110 via a wireless connection (e.g. WiFi, Bluetooth, ZigBee, ZWave, or the like). In some embodiments, entry sensors are connected to a hub, which is further connected to a device control assembly 110.

Figure 22:
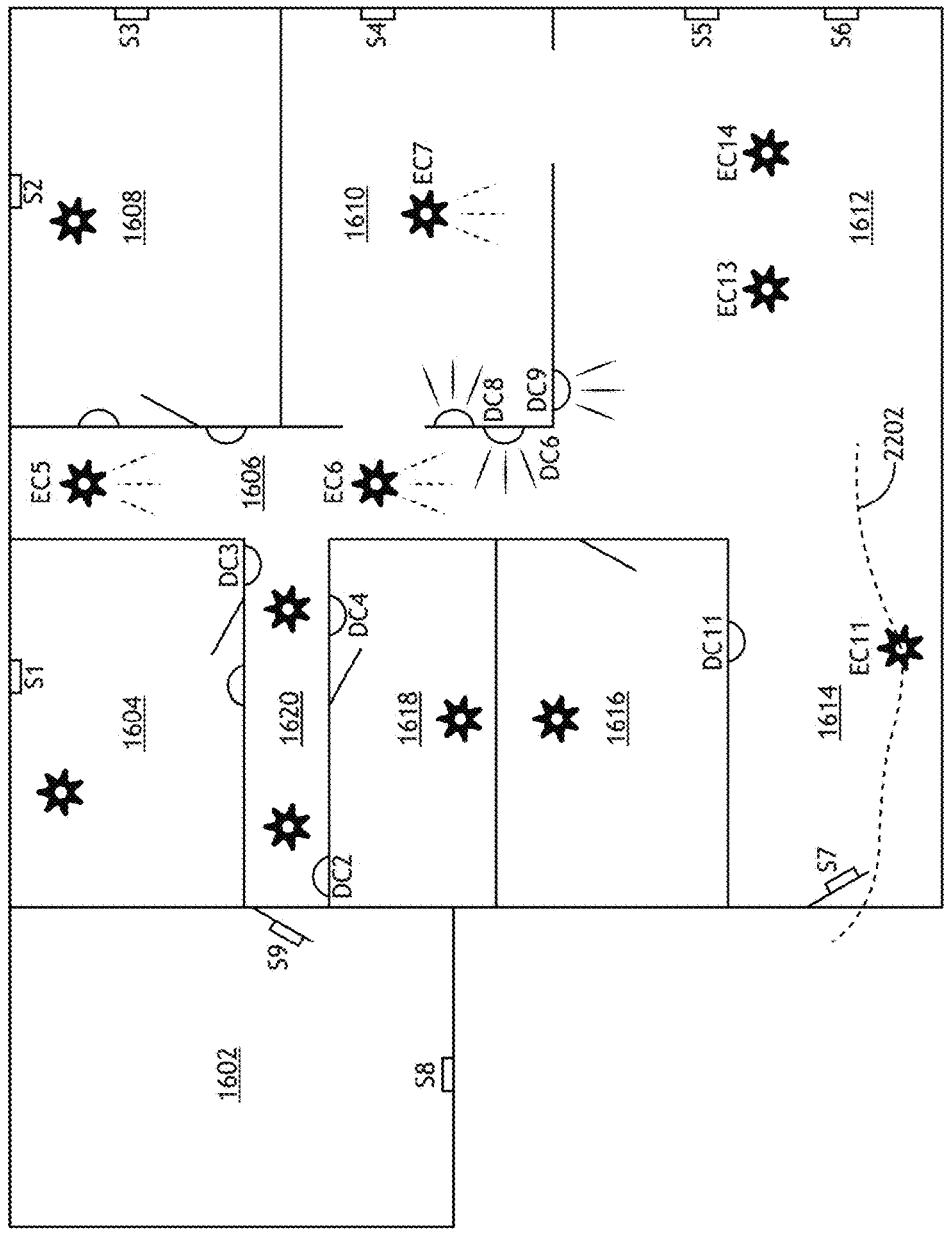
FIG. 22 is a conceptual view of a residence including a network of device control assemblies illustrating an occupancy-based security system, in accordance with one or more embodiments of the present disclosure.

FIG. 22 is a conceptual view of a residence including a network of device control assemblies illustrating an occupancy-based security system, in accordance with one or more embodiments of the present disclosure. In some embodiments, the occupancy-based security system may automatically initiate a security mode (e.g. the occupancy-based security system may be "armed") when no occupants are detected.

In some embodiments, if the occupancy-based security system is armed and an entry sensor is activated, one or more device control assemblies 110 provide an alert. For example, the one or more device control assemblies 110 may alert one or more authorized users, a system administrator, or the like. Further, the alert may include any type of alert such as, but not limited to, a message to a mobile device including a description of the activated entry sensor, or the like.

In some embodiments, if an entry sensor is activated, one or more device control assemblies 110 will start surveillance by the occupancy sensor assembly system closest to the activated entry sensor. In some embodiments, surveillance footage (e.g. images and/or videos) is captured and stored for later use. The surveillance footage may be stored on a local device within the network, a device on an external network, or a cloud-based server.

In some embodiments, a device control assembly 110 may identify a new entrant (e.g. using biometric recognition, or the like) and generate a response based on the result of the identification. For example, a device control assembly 110 may identify a user as being on a list of trusted users and may automatically disarm the security system. By way of another example, a new entrant may provide a security code to a device control assembly 110 or a dedicated device on the network.

In some embodiments, if the security system is not disarmed within a predefined amount of time after being armed the security system controller will initiate one or more deterrent measures. In some embodiments, deterrent measures of the security system include turning light on in other parts of the house. For example, deterrent measures of the security system may include playing sounds from device control assemblies 110 or one or more speakers in the network. For example, in FIG. 22, a person entering through the front door along path 2202 may activate the door sensor S7, which alerts one or more device control assemblies 110 to initiate a disarming timer. Continuing with this example, DC11 may detect the person and may simulate, based on the detected occupant position in Entryway 1614, activity in the one or more rooms as a deterrent measure if the security system is not disarmed. In one instance, simulated activity may include, but is not limited to, turning on one or more luminaires in Hallway 1 1606, or playing a recording of footsteps on DC5 or DC6 in Hallway 1 1606. In some embodiments, deterrent measures may include simulated activity in the Kitchen (e.g. played by DC8). For example, simulated kitchen activity may include, but is not limited to, recorded sounds of running, water, clanging dishes, a refrigerator door opening, a microwave in operation, a stove timer sounding, or a garbage disposal running. In some embodiments, if the security system is armed after a predefined amount of time after deterrent measures are initiated the security system will start "alarm measures" that alert all authorized users of a break-in event. In some embodiments, an alarm measure is to contact a security company. In some embodiments, an alarm measure includes playing loud alarm bell sounds out of the one or more device control assemblies 110. In some embodiments, an alarm measure includes continually strobing one or more luminaires.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected", or "coupled", to each other to achieve the desired functionality, and any two components capable of being so associated can also be viewed as being "couplable", to each other to achieve the desired functionality. Specific examples of couplable include but are not limited to physically interactable and/or physically interacting components and/or wirelessly interactable and/or wirelessly interacting components and/or logically interactable and/or logically interacting components.

All of the methods described herein may include storing results of one or more steps of the method embodiments in the memory. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc. Furthermore, the results may be stored "permanently," "semi-permanently," temporarily, or for some period of time. For example, the storage medium may be random access memory (RAM), and the results may not necessarily persist indefinitely in the storage medium.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A predictive control system, comprising:
two or more device control assemblies configured to be inserted into or removed from any selected backplates of two or more backplates by a user, wherein the two or more backplates are mounted within two or more electrical junction boxes distributed throughout a building, wherein locations of the selected backplates define two or more selected detection zones, wherein each of the two or more backplates include backplate electrical contacts connected to electrical wiring within an electrical junction box of the two or more electrical junction boxes, a user-translatable cover configured to electrically shield the backplate electrical contacts when in a closed position and expose the backplate electrical contacts when in an open position, and a lock configured to maintain the cover in the closed position unless disengaged, wherein the two or more device control assemblies are configured to be communicatively coupled to each other, wherein each of the device control assemblies comprise:
a feature configured to disengage the lock when inserted into the backplate to enable the cover to translate to the open position;
device control assembly electrical contacts configured to couple to the backplate contacts when the cover is in the open position; and
an occupancy sensor configured to detect a current occupancy state of a detection zone of the two or more selected detection zones, an occupancy state including at least one of occupied by one or more occupants or vacant of occupants;
wherein the two or more device control assemblies are configured to determine occupancy routines based on current and historical occupancy states of the two or more selected detection zones and are further configured to predict future occupancy states of the two one or more selected detection zones based on current occupancy states of the two or more selected detection zones and the occupancy routines, wherein at least one of the device control assemblies is configured to actuate an electrical load through electrical wiring connected to one of the selected backplates based on the predicted future occupancy states.

2. The system of claim 1, wherein the occupancy state includes a noise state.

3. The system of claim 2, wherein the noise state comprises:

at least one of silence, footsteps, ambient noise, music, conversation, or television.

4. The system of claim 1, wherein the occupancy state includes occupied by an occupant.

5. The system of claim 4, wherein the occupancy state includes an action of the occupant.

6. The system of claim 5, wherein the action of the occupant comprises:
at least one of entering a field of view of the occupancy sensor, moving through a field of view, remaining stationary within the field of view, or exiting the field of view.

7. The system of claim 4, wherein the occupancy state includes a position of the occupant within a field of view of the occupancy sensor.

8. The system of claim 1, wherein predicting the future occupancy states comprise:
predicting the future occupancy states based on the current occupancy states of the two or more selected detection zones and the occupancy routines using a recursive bayesian estimation.

9. The system of claim 1, wherein the two or more device control assemblies track a location of the occupant as the occupant moves between the two or more selected detection zones.

10. The system of claim 1, wherein a first device control assembly of the two or more device control assemblies detects an occupant leaving a first detection zone of the two or more detection zones and moving towards a second detection zone of the two or more detection zones, wherein the electrical load is within the second detection zone, wherein the first device control assembly actuates the electrical load prior to the occupant reaching the second detection zone.

11. The system of claim 1, wherein a first device control assembly of the two or more device control assemblies determines a distance to a second device control assembly of the two or more device control assemblies.

12. The system of claim 11, wherein the first device control assembly determines a distance between itself and the occupant based on a strength of a signal transmitted by the occupant and received by the first device control assembly.

13. The system of claim 11, wherein the signal comprises: a radio-frequency signal.

14. The system of claim 11, wherein the two or more device control assemblies determine distances between themselves based on strengths of signals transmitted and received between themselves.

15. The system of claim 11, wherein the signals comprise: radio-frequency signals.

16. The system of claim 1, wherein a zone of the one or more selected detection zones is indoors.

17. The system of claim 1, wherein a zone of the one or more selected detection zones is outdoors.

18. The system of claim 1, wherein the device control assembly is configured to toollessly couple to the backplate.

19. A system for occupancy prediction, comprising:
two or more backplates configured to be mounted within two or more electrical junction boxes distributed throughout a building, wherein each of the two or more backplates comprise:
backplate electrical contacts connected to electrical wiring within an electrical junction box of the two or more electrical junction boxes;
a user-translatable cover configured to electrically shield the backplate electrical contacts when in a closed position and expose the backplate electrical contacts when in an open position; and
a lock configured to maintain the cover in the closed position unless disengaged;
two or more device control assemblies configured to be inserted into or removed from any selected backplates of the two or more backplates by a user, wherein locations of the selected backplates define two or more selected detection zones, wherein the two or more device control assemblies are configured to be communicatively coupled to each other, wherein each of the device control assemblies comprise:
a feature configured to disengage the lock when inserted into the backplate to enable the cover to translate to the open position;
device control assembly electrical contacts configured to couple to the backplate contacts when the cover is in the open position; and
an occupancy sensor configured to detect an occupancy state of an occupant within the two or more selected detection zones, the occupancy state including at least one of a location, a direction of motion, or a speed of motion of the occupant;
wherein the two or more device control assemblies are configured to determine occupancy routines based on current and historical occupancy states of the occupant within the two or more selected detection zones and are further configured to predict a future occupancy state of the occupant within the two or more selected detection zones based on the current occupancy state and the occupancy routines, wherein at least one of the two or more device control assemblies is configured to actuate an electrical load through electrical wiring connected to one of the selected backplates based on the predicted future occupancy state of the occupant.

20. The system of claim 19, wherein the occupancy state includes an action of the occupant.

21. The system of claim 20, wherein the action of the occupant comprises:
at least one of entering a field of view of the occupancy sensor, moving through a field of view, remaining stationary within the field of view, or exiting the field of view.

22. The system of claim 19, wherein the occupancy state comprises:
a position of the occupant within a field of view of the occupancy sensor.

23. The system of claim 19, wherein predicting the future occupancy state comprises:
predicting the future occupancy state based on the current occupancy state and the occupancy routines using a recursive bayesian estimation.

24. The system of claim 19, wherein the device control assembly is configured to toollessly couple to the backplate.

25. A system for occupancy prediction, comprising:
two or more backplates configured to be mounted within two or more electrical junction boxes distributed throughout a building, wherein each of the two or more backplates comprise:
backplate electrical contacts connected to electrical wiring within an electrical junction box of the two or more electrical junction boxes;
a user-translatable cover configured to electrically shield the backplate electrical contacts when in a closed position and expose the backplate electrical contacts when in an open position; and a lock configured to maintain the cover in the closed position unless disengaged;

two or more device control assemblies configured to be inserted into or removed from any selected backplates of the two or more backplates by a user, wherein locations of the selected backplates define two or more selected detection zones, wherein the two or more device control assemblies are configured to be communicatively coupled to each other, wherein each of the device control assemblies comprise:

- a feature configured to disengage the lock when inserted into the backplate to enable the cover to translate to the open position;
- device control assembly electrical contacts configured to couple to the backplate contacts when the cover is in the open position; and
- an occupancy sensor configured to detect a current occupancy state of a detection zone of the two or more selected detection zones, an occupancy state including at least one of occupied by one or more occupants or vacant of occupants;

wherein the two or more device control assemblies are configured to determine occupancy routines based on current and historical occupancy states of the two or more selected detection zones and are further configured to predict future occupancy states of the two or more selected detection zones based on current occupancy states of the two or more selected detection zones and the occupancy routines, wherein at least one of the device control assemblies is configured to actuate an electrical load through electrical wiring connected to one of the selected backplates based on the predicted future occupancy states.

* * * * *